United States Patent
Ozden et al.

(10) Patent No.: US 12,139,803 B2
(45) Date of Patent: Nov. 12, 2024

(54) CASCADE $CO_2$ ELECTROREDUCTION SYSTEM AND RELATED METHODS FOR ENHANCED PRODUCTION OF ETHYLENE

(71) Applicants: TOTALENERGIES ONETECH, Courbevoie (FR); THE GOVERNING COUNCIL OF THE UNIVERSITY OF TORONTO, Toronto (CA)

(72) Inventors: Adnan Ozden, Toronto (CA); Yuhang Wang, Toronto (CA); Fengwang Li, Toronto (CA); David Sinton, Toronto (CA); Edward Sargent, Toronto (CA)

(73) Assignees: TOTALENERGIES ONETECH, Courbevoie (FR); THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 0 days.

(21) Appl. No.: 18/271,269

(22) PCT Filed: Jan. 7, 2022

(86) PCT No.: PCT/EP2022/050264
§ 371 (c)(1),
(2) Date: Jul. 7, 2023

(87) PCT Pub. No.: WO2022/148837
PCT Pub. Date: Jul. 14, 2022

(65) Prior Publication Data
US 2024/0044021 A1    Feb. 8, 2024

Related U.S. Application Data

(60) Provisional application No. 63/148,829, filed on Feb. 12, 2021, provisional application No. 63/135,277, filed on Jan. 8, 2021.

(30) Foreign Application Priority Data

Mar. 30, 2021    (LU) .......................... 102714

(51) Int. Cl.
*C25B 9/23*    (2021.01)
*C23C 14/35*    (2006.01)
(Continued)

(52) U.S. Cl.
CPC ............... *C25B 9/23* (2021.01); *C23C 14/35* (2013.01); *C25B 3/03* (2021.01); *C25B 3/26* (2021.01);
(Continued)

(58) Field of Classification Search
None
See application file for complete search history.

(56) References Cited

U.S. PATENT DOCUMENTS

2019/0055656 A1    2/2019    Kenis et al.
2020/0056294 A1    2/2020    Kanan et al.
(Continued)

FOREIGN PATENT DOCUMENTS

WO    2019136018 A2    7/2019
WO    2020201485 A1    10/2020
(Continued)

OTHER PUBLICATIONS

Giancola et al. Journal of Membrane Science 570-571 '2019' 69 (Year: 2019).*
(Continued)

*Primary Examiner* — Wojciech Haske
(74) *Attorney, Agent, or Firm* — Ewing & Jones, PLLC

(57) ABSTRACT

The disclosure discloses a membrane electrode assembly (MEA) for electrochemically converting carbon monoxide (CO) into ethylene ($C_2H_4$) under applied current density, the
(Continued)

MEA comprising: a cathode; an anode; an anion-exchange membrane (AEM) to separate the cathode from the anode; an anolyte; a reactant inlet in fluid communication with the cathode to provide a CO-enriched gas component; and a product outlet in fluid communication with the cathode to release a product mixture comprising $C_2H_4$; wherein the cathode comprises: a first layer including adsorption sites to adsorb CO as CO* intermediates; a second layer that facilitates stabilization of the CO* intermediates for adsorption onto the adsorption sites of the first layer; and a third layer that facilitates diffusion of CO to the adsorption sites of the first layer.

20 Claims, 31 Drawing Sheets

(51) Int. Cl.
    *C25B 3/03*     (2021.01)
    *C25B 3/26*     (2021.01)
    *C25B 11/032*     (2021.01)
    *C25B 11/052*     (2021.01)
    *C25B 11/056*     (2021.01)
    *C25B 11/065*     (2021.01)
    *C25B 15/08*     (2006.01)
(52) U.S. Cl.
    CPC .......... *C25B 11/032* (2021.01); *C25B 11/052* (2021.01); *C25B 11/056* (2021.01); *C25B 11/065* (2021.01); *C25B 15/08* (2013.01)

(56) References Cited

U.S. PATENT DOCUMENTS

2020/0240023 A1    7/2020   Cave et al.
2021/0062349 A1*   3/2021   Agapie .................... B01J 23/72

FOREIGN PATENT DOCUMENTS

WO      2020225315 A1   11/2020
WO      2021007508 A1   1/2021

OTHER PUBLICATIONS

Li Fengwang et al, "Molecular tuning of CO-to-ethylene conversion", NATURE, Nature Publishing Group UK, London, vol. 577, No. 7791, (Nov. 20, 2019), 6 pages.
Li Fengwang et al, "Supplementary information Molecular tuning of CO2-to-ethylene conversion", Nature, London, vol. 577, No. 7791, 69 pages.
International Search Report and Written Opinion issued in Application No. PCT/EP2022/050264, dated Aug. 8, 2022, 22 pages.
International Preliminary Report on Patentability issued in Application No. PCT/EP2022/050264, dated Dec. 2, 2022, 23 pages.
Boissou Florent et al., "The potency of [gamma]-valerolactone as bio-sourced polar aprotic organic medium for the electrocarboxlation of furfural by CO2", Journal of Electroanalytical Chemistry, Elsevier, Amsterdam, Nl, vol. 848, (20190708), 10 pages.
Ripatti Donald S et al, "Carbon Monoxide Gas Diffusion Electrolysis that Produces Concentrated C2 Products with High Single-Pass Conversion", Joule, (Jan. 16, 1029), vol. 3, No. 1, 2542-4351, pp. 240-256.
Ovalle Vincent J. et al, "Understanding the Impact of N-Arylpyridinium Ions on the Selectivity of CO 2 Reduction at the Cu/Electrolyte Interface", US, vol. 123, No. 40, (Oct. 10, 2019), pp. 24453 - 24460, The Journal of Physical Chemistry C.
Nam Dae-Hyun et al., "Molecular enhancement of heterogeneous CO2 Reduction", Nature Materials, Nature Publishing Group UK, London, vol. 19, No. 3, (Feb. 25, 2020), pp. 266-276.

Han Zhiji et al., "CO2 Reduction Selective for C >=2 Products on Polycrystalline Copper with N-Substituted Pyridinium Additives", vol. 3, No. 8, (Aug. 23, 2017), pp. 853-859, ACS Central Science.
Nagasawa Kensaku et al., "Toluene permeation through solid polymer electrolyte during toluene direct electro-hydrogenation for energy carrier synthesis", Journal of Power Sources, Elsevier, Amsterdam, NL, vol. 439, (Sep. 5, 2019), 7 pages.
Aeshala, L.M., et al., "Effect of cationic and anionic solid polymer electrolyte on direct electrochemical reduction of gaseous CO2 to fuel", J. CO2 Util. 3, pp. 49-55 (2013).
Akemann, W., Otto, A. "Vibrational modes of CO adsorbed on disordered copper films", J. Raman Spectrosc. 22, pp. 797-803 (1991).
Bard, A.J., Faulkner, L.R. "Electrochemical methods: Fundamentals and Applications", 2nd Edition. J. Wiley and Sons, New York (2001).
Cheng, T., et al., "Full atomistic reaction mechanism with kinetics for CO reduction on Cu(100) from ab initio molecular dynamics free-energy calculations at 298 K.", Proc. Natl. Acad. Sci. vol. 114, pp. 1795-1800 (2017).
Dinh C.T. et al. "CO2 electroreduction to ethylene via hydroxide-mediated copper catalysis at an abrupt interface", Science 360, pp. 783-787 (2018).
Durst, J., et al., "New insights into the electrochemical hydrogen oxidation and evolution reaction mechanism", Energy Environ. Sci. 7, pp. 2255-2260 (2014).
Ge, Q., et al., "Synthesis of conjugated polycyclic quinoliniums by rhodium(III)-catalyzed multiple C-H activation and annulation of arylpyridiniums with alkynes", Org. Lett. 18, pp. 2483-2486 (2016).
Gunathunge, C.M. et al., "Spectroscopic observation of reversible surface reconstruction of copper electrodes under CO2 reduction", J. Phys. Chem. C 121, pp. 12337-12344 (2017).
Gunathunge, C.M. et al,, "Existence of an electrochemically inert CO population on Cu electrodes in alkaline pH", ACS Catal. 8, pp. 7507-7516 (2018).
Han, Z. et al., "CO2 Reduction Selective for C22 Products on Polycrystalline Copper with N-Substituted Pyridinium Additives", ACS Cent. Sci. 3, pp. 853-859 (2017).
Hepburn, C. et al., "The technological and economic prospects for CO2 utilization and removal", Nature 575, pp. 87-97 (2019).
Heyes, J. et al., "CO2 reduction on Cu at low overpotentials with surface-enhanced in situ spectroscopy", J. Phys. Chem. C 120, pp. 17334-17341 (2016).
Jones, D., "Perfluorosulfonic acid membranes for fuel cell and electrolyser applications", Mater. Matters 10, 42, 19 pages (2015).
Jouny, M., Luc, W., Jiao, F. "High-rate electroreduction of carbon monoxide to multi-carbon products", Nat. Catal. 1, pp. 748-755 (2018).
Jouny, M., Hutchings, G.S., Jiao, F. "Carbon monoxide electroreduction as an emerging platform for carbon utilization". Nat. Catal. 2, pp. 1062-1070 (2019).
Keith, et al., "A process for capturing CO2 from the atmosphere" Joule 2, 27 pages (2018).
Liu, X. et al., "pH effects on the electrochemical reduction of CO(2) towards C2 products on stepped copper", Nat. Commun. 10, 32, 10 pages (2019).
Liu, Z., et al., "CO2 electrolysis to CO and O2 at high selectivity, stability and efficiency using sustainion membranes", Electrochem. Soc. 165, J3371-J3377 (2018).
López-Cudero, A. et al., "Potential dependence of the saturation CO coverage of Pt electrodes: The origin of the pre-peak in CO-stripping voltammograms. Part 1: Pt(111)", J. Electroanal. Chem. 579, 1-12 (2005).
López-Cudero, A. et al., "Potential dependence of the saturation CO coverage of Pt electrodes: The origin of the pre-peak in CO-stripping voltammograms. Part 2: Pt(100)", J. Electroanal. Chem. 586, 204-216 (2006).
Luckow, P. et al., "2015 Carbon dioxide price forecast", Synaps Energy Economics (2015) 39 pages.
Luna, P.D. et al., "What would it take for renewably powered electrosynthesis to displace petrochemical process?", Science 364, eaav3506, 11 pages (2019).

(56) References Cited

OTHER PUBLICATIONS

Merino-Garcia, I. et al., "Cu oxide/ZnO-based surfaces for a selective ethylene production from gas-phase CO2 electroconversion", J. CO2 Utili. 31, pp. 135-142 (2019).

Merino-Garcia, I. et al., "Productivity and selectivity of gas-phase CO2 electroreduction to methane at copper hanoparticle-based electrodes", Energy Technol. 5, pp. 922-928 (2017).

Navasa, M. et al., "Localized carbon deposition in solid oxide electrolysis cells studied by multiphysics modeling", J. Power. Sources 394, 102-113 (2018).

Oda, I. et al., "Carbon monoxide adsorption on copper and silver electrodes during carbon dioxide electroreduction studied by infrared reflection absorption spectroscopy and surface-enhanced raman spectroscopy", Langmuir 12, 1094-1097 (1996).

Paturska, A. et al., "Economic assessment of biomethane supply system based on natural gas infrastructure", Energy Proc. 72, pp. 71-78 (2015).

Pérez-Gallent, E. et al., "Structure- and Potential-Dependent Cation Effects on CO Reduction at Copper Single-Crystal Electrodes", J. Am. Chem. Soc. 139, pp. 16412-16419 (2017).

Pérez-Gallent, E. et al., "Spectoscopic observation of a hydrogenated CO dimer intermediate during CO reduction on Cu(100) electrodes", Angew. Chem. Int. Ed. 129, pp. 3675-3678 (2017).

Ren, T. et al., "Steam cracking and methane to olefins: Energy use, CO2 emissions, and production costs", Energy 33, 817-833 (2008).

Wutting, A. et al., "Tracking a common surface-bound intermediate during CO2-to-fuels catalysis", ACS Cent. Sci. 2, pp. 522-528 (2016).

Schalenbach, M. et al., "Gas permeation through Nation. Part 1: Measurements", J. Phys. Chem. C 119, pp. 25145-25155 (2015).

Subbaraman, R. et al., "Three Phase Interfaces at Electrified Metal-Solid Electrolyte Systems 1. Study of the Pt(hkl)-Nation Interface", J. Phys. Chem. C 114, pp. 8414-8422 (2010).

Skafte, T.L. et al., "Carbon deposition and sulfur poisoning during CO2 electrolysis in nickel-based solid oxide cell electrodes", J. Power. Sources 373, 54-60 (2018).

Verma, S., Lu, S., Kenis, P.J.A., "Co-electrolysis of CO2 and glycerol as a pathway to carbon chemicals with improved technoeconomics due to low electricity consumption", Nat. Energy 4, pp. 466-474 (2019).

Vidakovic, T., Christov, M., Sundmacher, K., "The use of CO stripping for in situ fuel cell catalyst characterization", Electrochimi. Acta 52, pp. 5606-5613 (2007).

Wang, Y. et al., "Catalyst synthesis under CO2 electroreduction favours faceting and promotes renewable fuels electrosynthesis", Nat. Catal. 3, 98-106, 9 pages (2020).

Wuttig, A. et al., "Inhibited proton transfer enhances Au-catalyzed CO2-to-fuels selectivity", Proc. Natl. Acad. Sci. 113, 32, E4585-E4593, 9 pages (2016).

Wang, Y. et al., "Copper nanocubes for CO2 reduction in gas diffusion electrodes", Nano Lett. 19, pp. 8461-8468 (2019).

Wakerley, D. et al., "Bio-inspired hydrophobicity promotes CO2 reduction on a Cu surface", Nat. Mater. 18, pp. 1222-1227 (2019).

Wang, L. et al., "Selective reduction of CO to acetaldehyde with CuAg electrocatalysts", Chem. Eng. World 52, pp. 44-46 (2017).

Arquer, F.P.G.d., et al., "CO2 electrolysis to multicarbon products at activities greater than 1 A cm-2", Science 367, pp. 661-666 (2020).

Gabardo C.M. et al., "Continuous Carbon Dioxide Electroreduction to Concentrated Multi-carbon Products Using a Membrane Electrode Assembly", Joule, vol. 3, Issue 11, Nov. 20, 2019, pp. 2777-2791.

Battelle Memorial Institute, "Manufacturing cost analysis of 1, 5, 10 and 25 KW fuel cell systems for primary power and combined heat and power applications", DOE Contract No. DE-EE0005250 (2017) 293 pages.

International Renewable Energy Agency, "Renewable Power: Climate-Safe Energy Competes on Cost Alone", (2018) 8 pages.

City of Toronto, "2019 Water Rates & Fees", (2019) 7 pages.

U.S. Department of Energy, "DOE Technical Targets for Hydrogen Production from Electrolysis", (2015) 8 pages.

* cited by examiner

12

CASCADE CO$_2$ ELECTROREDUCTION SYSTEM AND RELATED METHODS FOR ENHANCED PRODUCTION OF ETHYLENE

CROSS-REFERENCE TO RELATED APPLICATIONS

This application claims the benefit of PCT/EP2022/050264 filed Jan. 7, 2022, which claims priority from U.S. 63/135,277 filed Jan. 8, 2021, U.S. 63/148,829 filed Feb. 12, 2021, and LU 102714 filed Mar. 30, 2021, which are incorporated herein by reference in their entireties for all purposes.

TECHNICAL FIELD

The present techniques generally relate to the electrolytic conversion of carbon dioxide into ethylene, and more specifically to methods and systems related to the use in cascade of a solid-oxide CO$_2$-to-CO electrochemical cell (SOEC) and a CO-to-C$_2$H$_4$ membrane electrode assembly (MEA) electrolyzer.

BACKGROUND

Global annual ethylene (C$_2$H$_4$) production reached 185 Mt in 2018, exceeding that of any other organic chemical. Production of C$_2$H$_4$ involves steam cracking of fossil fuel-derived long-chain hydrocarbons—a process that releases from 2 to 3 tons of CO$_2$ per ton of C$_2$H$_4$ produced before the in-plant CO$_2$ capture. The net process releases ~200 Mt of CO$_2$ annually, accounting for 0.6% of total anthropogenic emissions Processes involving CO$_2$ electroreduction reaction (CO$_2$RR) and using renewable electricity hold promise for low-carbon C$_2$H$_4$ production. Known CO$_2$RR processes have allowed reaching Faradaic efficiencies (FEs) of 70-80% towards C$_2$H$_4$ and energy efficiencies (EEs) over 30% at current densities over 100 mA cm$^{-2}$. However, due to the formation of carbonate during CO$_2$RR (see FIG. 1), concerns regarding the consequent penalty in energy consumption and production cost have risen.

There are various challenges associated with the electrolytic conversion of CO$_2$ into ethylene. The present electrochemical techniques address at least some of these challenges to achieve an enhanced conversion of CO$_2$ into valuable ethylene in comparison to known techniques in the field.

SUMMARY

CO$_2$ electroreduction (CO$_2$RR) to multi-carbon products such as ethylene (C$_2$H$_4$) provides a route to produce valuable products and reduce CO$_2$ emissions. Despite improvements in catalytic performance, the direct transformation of CO$_2$-to-C$_2$H$_4$ suffers from CO$_2$ loss to carbonate. This CO$_2$ reactant loss is a major driver of cost, consuming up to 72% of total energy input.

According to a first aspect the disclosure provide for a layered structured catalyst for conversion of carbon monoxide (CO) into ethylene (C$_2$H$_4$), remarkable in that it comprises a substrate; an inner transition metal layer deposited onto the substrate; an intermediate organic layer deposited onto the inner transition metal layer; and an outer ionomer layer deposited onto the intermediate organic layer; and in that the transition metal is copper or a copper alloy and the outer ionomer layer comprises an ionomer having a hydrophobic backbone and a hydrophilic side chain wherein the ionomer is a short-side-chain (SSC) ionomer.

Therefore the outer ionomer layer is an outer SSC ionomer layer.

Surprisingly, it has been found that the layered structured dendritic catalyst of the present disclosure having an outer ionomer layer comprising a short side chain (SSC) ionomer facilitates the diffusion of the CO to the one or more transition metals of inner layer of the catalyst, enhancing therefore its adsorption. Short side chain (SSC) ionomers differ from the long side chain (LSC) by the ratio of hydrophilic sulfonic acid groups to hydrophobic polytetrafluoroethylene backbone. Short side chain (SSC) ionomers have pendant chains made of only two carbons; whereas long-side-chain ionomers (such as Nafion®) have pendant chains containing four carbon atoms. The shorter side chain of the SSC ionomers enable improved mechanical adhesion to the intermediate organic layer, thus enabling stable electrochemical conversion performance in catholyte-free membrane electrode assembly electrolyzers. The diffusion of the CO to the one or more transition metals is also enhanced by the intermediate organic layer which help stabilizing the activated carbon monoxide (CO*) species on the transition metal, by provides more atop-bound activated carbon monoxide species on the surface made of transition metal. This catalyst, when used as the cathode in the membrane electrode assembly (MEA), favours high Faradaic Efficiency values. Thus, this results in promoting the selectivity of an electroreduction reaction of CO into ethylene up to 65±1% at a 2.5 V full-cell potential, or of at least 60% at an applied current density of at least 130 mA·cm$^{-2}$, or at most 85% at an applied current density of about 160 mA cm$^{-2}$.

It has been further demonstrated in the MEA, the catalyst stability is maintained for a long period of time.

For example, the substrate comprises polytetrafluoroethylene (PTFE) or PTFE-modified hydrophobic carbon paper.

For example, the substrate has an average pore size between 100 µm and 800 µm as determined by transmission electron microscopy; preferably between 300 µm and 600 µm; more preferably between 400 µm and 500 µm.

For example, the inner transition metal layer has a porosity between 60% and 70% and/or in that the inner transition metal layer, the intermediate organic layer and the outer ionomer layer define a multiple-layer structure having a porosity ranging between 60% and 70%. Porosity determination is performed by standard porosimetry measurement.

In an embodiment, the transition metal is a copper alloy and the copper alloy is selected from copper-silica alloy, copper-aluminium alloy, copper-silver alloy.

In an embodiment, the transition metal is copper and the copper comprises Cu(100).

For example, the inner transition metal layer has a thickness between 250 and 700 nm as determined by transmission electron microscopy; preferably from 300 to 600 nm. For example, the thickness between 250 and 700 nm includes both a first sub-layer and a second sub-layer.

For example, the inner transition metal layer comprises a first sub-layer being sputtered onto the substrate; and a second sub-layer being electrodeposited onto the first sub-layer.

With preference, thickness of the first sub-layer is between 100 and 200 nm as determined by transmission electron microscopy; preferably between 120 and 180 nm; more preferably about 150 nm.

For example, thickness of the second sub-layer is between 150 and 500 nm as determined by transmission electron microscopy; preferably, between 200 and 450 nm; more preferably, between 250 and 400 nm.

For example, thickness of the first sub-layer is between 100 and 200 nm as determined by transmission electron microscopy and electrodeposition of the second sub-layer results in a growth of a dendritic structure of the first sub-layer.

For example, the inner transition metal shows a dendritic structure as evidenced by transition electron microscopy; with preference the transition metal layer shows a first sub-layer being sputtered onto the substrate; and a second sub-layer being electrodeposited onto the first sub-layer wherein the second sub-layer shows a dendritic structure as evidenced by transition electron microscopy.

For example, the inner transition metal layer continuously and homogenously covers the substrate.

In an embodiment, the intermediate organic layer is a N-arylpyridinium-derived layer.

For example, the N-arylpyridinium is N-tolylpyridinium, and the N-arylpyridinium-derived layer comprises a pyridine-based compound.

With preference, the N-arylpyridinium is N-tolylpyridinium, and the N-arylpyridinium-derived layer is a N-tolyl-tetradihydro-bipyridine (Py) layer.

For example, the intermediate layer has a thickness between 10 and 20 nm as determined by transmission electron microscopy and/or the intermediate layer forms a continuous film over the inner transition metal layer.

For example, the outer ionomer layer is or comprises a perfluorosulfonic acid ionomer; i.e. a perfluorosulfonic acid (PFSA) ionomer with a short-side-chain (SSC).

For example, the ionomer is $(C_4HF_7O_4S \cdot C_2F_4)_x$, wherein x is an integer; with preference, x=1.

For example, the outer ionomer layer has a thickness between 10 nm and 15 nm as determined by transmission electron microscopy.

For example, the intermediate organic layer and the outer ionomer layer forms a continuous film on a surface of the inner transition metal layer.

According to a second aspect, the disclosure provides a membrane electrode assembly (MEA) for electrochemically converting carbon monoxide (CO) into ethylene ($C_2H_4$) under applied current density, the MEA comprising a cathode; an anode; an anion-exchange membrane (AEM) to separate the cathode from the anode; an anolyte; a reactant inlet in fluid communication with the cathode to provide a CO-enriched gas component; and a product outlet in fluid communication with the cathode to release a product mixture comprising $C_2H_4$; wherein the cathode comprises the layered structured catalyst according the first aspect.

For example, the anolyte comprises an adjusted ion concentration to modify the alkalinity of the anolyte (by changing the concentration of basic salt (such as KOH)) and facilitate $C_2H_4$ production.

In an embodiment, the cathode catalyst is the layered structured catalyst according the first aspect and is in contact with the anion-exchange membrane.

For example, the MEA is a catholythe-free electrolyser; with preference, the MEA is a zero-gap electrolyser. In the zero-gap electrolyser, the cathode catalyst and the anode catalysts are both in contact with the anion-exchange membrane.

For example, the anolyte is a solution comprising $KHCO_3$, $K_2SO_4$, KOH, NaOH or any combinations thereof; with preference, the anolyte is a KOH-containing solution.

For example, the anolyte is a KOH-containing solution and in that the KOH-containing solution has a KOH concentration 0.1M KOH and 10 M KOH; preferably the KOH concentration is between 1M KOH and 5M KOH; more preferably, the KOH concentration is between 2M KOH and 4M KOH, even more preferably, the KOH concentration is 3 M KOH.

In an embodiment, the anode is an Oxygen Evolution Reaction (OER) anode. In an embodiment, the OER anode is a Ti—$IrO_2$ anode; with preference, the Ti—$IrO_2$ anode has an Ir loading from 2 mg·cm$^{-2}$ to 4 mg·cm$^{-2}$.

For example, the anode is a Glucose Electrooxidation Reaction (GOR) anode and the anolyte further comprises glucose; with preference, the anode is a Pt—C anode with preference, the Pt—C anode comprises platinum on graphitized carbon powder. In an embodiment, GOR products that are recovered as an anolyte liquid product stream comprise gluconate, glucuronate, glucarate, and formate.

For example, the CO-enriched gas component has a relative humidity (RH) between 50% and 100%.

For example, at least 25% of the CO supplied to the MEA is used to produce $C_2H_4$ when the flow rate is between 3 sccm and 4 sccm; preferably at least 30% of the CO.

For example, the CO-enriched gas component comprises $N_2$.

In an embodiment, the product mixture comprises gas products comprising $C_2H_4$, $H_2$, $CH_4$, and unreacted CO; and liquid products comprising ethanol, propanol, and acetate. With preference, produced $C_2H_4$ represents between 1% and 36% (molar ratio) of the gas products recovered via the product outlet.

In an embodiment, the MEA is operated at constant current density between 20 and 250 mA·cm$^{-2}$; preferably, the current density is between 100 and 200 mA·cm$^{-2}$; more preferably, the current density is between 150 and 170 mA·cm$^{-2}$.

According to a third aspect, the disclosure provides an integrated cascade system for conversion of carbon dioxide ($CO_2$) into ethylene ($C_2H_4$), the integrated cascade system comprising a Solid Oxide Electrolysis cell (SOEC) for converting $CO_2$ into carbon monoxide (CO); and the MEA as defined in the second aspect, the MEA receiving the CO produced via the SOEC as at least part of the CO-enriched gas component; wherein the SOEC comprises a fuel cathode being a metal-based catalyst; an oxygen-producing anode; a solid oxide electrolyte positioned between the cathode and anode; a gas inlet in fluid communication with the fuel cathode to receive a gaseous $CO_2$ stream; a cathodic gas outlet in fluid communication with the fuel cathode to release a gaseous product component comprising CO; and an anodic gas outlet in fluid communication with the oxygen-producing anode to release produced $O_2$.

For example, the gaseous product component further comprises $CO_2$, and the system further comprises a $CO_2$ removal unit operatively connected to the first gas outlet of the SOEC to remove substantially all $CO_2$ from the gaseous product component before being fed as the at least part of the CO-enriched gas component to the MEA.

For example, the $CO_2$ removal unit is a $CO_2$-stripping unit, wherein the $CO_2$-stripping unit comprises a gas inlet for receiving the gaseous product component, a liquid inlet for receiving a $CO_2$-absorption solution, a gas outlet to release a $CO_2$-depleted product and a liquid outlet to release a $CO_2$-enriched absorption solution, and $CO_2$-depleted product being fed to the MEA as the at least part of the humidified CO-enriched gas component.

For example, the $CO_2$-absorption solution is an amine-based solution; with preference, the amine-based solution is a 10 to 60 wt. % aqueous ethanolamine solution; preferably a 15 to 50 wt. % aqueous ethanolamine solution; more preferably a 20 to 40 wt. % aqueous ethanolamine solution; even more preferably a 30 wt % aqueous ethanolamine solution.

For example, the SOEC is operated at an applied current density between 800 mA·cm-2 and 1500 mA·cm$^{-2}$; with preference, the applied current density at the SOEC is between 540 mA·cm$^{-2}$ and 560 mA·cm$^{-2}$.

For example, the gaseous $CO_2$ stream is fed to the SOEC via the gas inlet at a $CO_2$ flow rate between 10 and 20 sccm.

For example, the $CO_2$ inlet flowrate is adjusted to adjust a ratio of current density over $CO_2$ inlet flowrate to 815:15 (mA·cm$^{-2}$ vs. sccm). The $CO_2$ inlet flow rate is an operating condition.

For example, the applied current density between 500 mA cm$^{-2}$ and 1.5 A cm$^{-2}$ or the applied current density between 540 and 560 mA cm$^{-2}$.

According to a fourth aspect, the disclosure provides the use of the layered structured catalyst according to the first aspect as a gas diffusion electrode (GDE).

The disclosure encompasses, a gas diffusion electrode (GDE) comprising the layered structured catalyst according to the first aspect.

According to a fifth aspect, the disclosure provides the use of the layered structured catalyst according to the first aspect as a cathode in a membrane electrode assembly for conversion of carbon monoxide into ethylene. In other terms, the disclosure provides the use of the layered structured catalyst according to the first aspect as a cathode catalyst in a membrane electrode assembly for conversion of carbon monoxide into ethylene. The use is preferably performed at a high current density of a least or greater than 100 mA cm$^{-2}$. For example the use is performed at a high current density of at least or greater than 100 mA cm-2, a high Faradaic efficiency (65%), and a high energy efficiency (>25%) by simultaneously controlling the diffusion of carbon monoxide and stabilization of the carbon monoxide reduction reaction intermediates on the catalytically active sites.

According to a sixth aspect, the disclosure provides a method to produce the layered structured catalyst according to the first aspect, for use as a gas diffusion electrode (GDE), the method comprising depositing an inner transition metal layer onto a substrate, wherein the transition metal is copper or a copper alloy; depositing an intermediate organic layer onto the inner transition metal layer; and depositing an outer ionomer layer onto the intermediate organic layer, the outer ionomer layer comprising an ionomer having a hydrophobic backbone and a hydrophilic side chain wherein the ionomer is a short-side-chain (SSC) ionomer thereby producing the layered structured catalyst.

For example, depositing the inner transition metal layer onto the substrate comprises magnetically sputtering a transition metal onto the substrate to produce a sputtered metal coating; and electrodepositing the transition metal onto the sputtered metal coating to form the inner transition metal layer comprising the sputtered metal coating.

For example, magnetically sputtering the transition metal onto the substrate comprises magnetically sputtering a copper seed onto the substrate at a sputtering rate of between 0.10 Å·sec$^{-1}$ and 2.0 Å·sec$^{-1}$ under 10$^{-6}$ to 10$^{-7}$ Torr.

For example, electrodeposition of copper is performed at a reductive current density ranging from 100 to 500 mA·cm$^{-2}$ under the continuous flow of $CO_2$; preferably ranging from 300 to 450 mA·cm$^{-2}$ under the continuous flow of $CO_2$; more preferably at a current density of 400 mA·cm$^{-2}$ under the continuous flow of $CO_2$.

For example, electrodepositing the transition metal is performed in a flow electrolyzer comprising an anode flow compartment; a cathode flow compartment; an anion exchange membrane (AEM) separating the anode flow compartment and the cathode flow compartment; a gas inlet in fluid communication with the cathode flow compartment for providing $CO_2$ at a constant flow rate; a first liquid inlet in fluid communication with the cathode flow compartment for providing a catholyte solution comprising the transition metal; and a second liquid inlet in fluid communication with the anode flow compartment for providing an anolyte; and a counter electrode.

For example, the anolyte is a KOH-containing solution; with preference, the KOH-containing solution has a KOH concentration between 0.1M KOH and 10 M KOH; more preferably the KOH concentration between 0.1 M and 5 M KOH.

For example, the catholyte is a KOH-containing solution; with preference, the KOH-containing solution has a KOH concentration between 0.1M KOH and 10 M KOH; more preferably the KOH concentration between 0.1 M and 5 M KOH.

For example, the $CO_2$ flow rate is between 4 and 100 sccm; preferably between 4 and 80 sccm; more preferably between 4 and 50 sccm end even more preferably between 4 and 20 sccm and most preferably between 4 and 8 sccm.

For example, electrodeposition is performed for a time ranging from 20 to 600 seconds.

For example, the counter electrode is selected from nickel foam, nickel mesh, nickel felt, iridium oxide supported on titanium foam iridium oxide supported on titanium mesh, or iridium oxide supported on titanium felt. With preference, the counter electrode is nickel foam or iridium oxide supported on titanium foam.

For example, electrodepositing the transition metal comprises preparing a cathode through electroreduction of copper bromide in presence of potassium hydroxide and $CO_2$; with preference, the catholyte solution comprises 0.1 to 0.5 M of copper bromide, 0.2 to 1.0 M sodium tartrate dibasic dehydrate and 1.0 to 3.0 M of potassium hydroxide.

For example, depositing the intermediate organic layer onto the inner transition metal layer comprises electrodepositing the intermediate organic layer being an N-arylpyridinium-derived film.

For example, the N-arylpyridinium is N-tolylpyridinium, and the N-arylpyridinium-derived film is a N-tolyl substituted tetrahydro-bipyridine film deriving from the N-tolylpyridinium when subjected to reduction conditions; with preference, the N-tolyl-tetradihydro-bipyridine film has a thickness between 10 and 20 nm as determined by transmission electron microscopy.

For example, electrodepositing the intermediate organic layer is performed in a three-electrode system comprising a reference electrode, a working electrode and a counter electrode; with preference, the reference electrode is an Ag/AgCl electrode, the working electrode is electrodeposited Cu, and the counter electrode is platinum foil.

For example, further comprising preparing another electrolyte solution comprising potassium carbonate and a N-tolyl-pyridinium triflate precursor for electrodeposition of the intermediate organic layer; with preference, the electrolyte solution comprises 0.1 to 1 M of $KHCO_3$ and 10 to 50 mM of the N-tolyl-pyridinium triflate precursor.

For example, depositing an outer ionomer layer onto the intermediate organic layer comprises spraying an ionomer-containing solution to form the outer ionomer layer.

For example, further comprising preparing the ionomer-containing solution comprising a cation exchange perfluorosulfonic acid (PFSA) ionomer with short-side-chain (SSC) and methanol; with preference, for 1 to 800 cm$^{-2}$ geometric area of electrode, the ionomer-containing solution comprises 10 to 20,000 µL of the cation exchange perfluorosulfonic acid (PFSA) ionomer with short-side-chain (SSC) and 3 to 3000 mL of methanol; with preference, for 5 cm$^{-2}$ geometric area of electrode, the ionomer-containing solution comprises 10 to 200 µL of the cation exchange perfluorosulfonic acid (PFSA) ionomer with short-side-chain (SSC) and 3 to 30 mL of methanol; for example, the ionomer-containing solution comprises 16.88 µL of the cation exchange perfluorosulfonic acid (PFSA) ionomer with short-side-chain (SSC) and 3 mL of methanol.

For example, further comprising sonicating the ionomer-containing solution to facilitate homogeneous dispersion of the ionomer in the ionomer-containing solution before spray deposition thereof.

For example, the outer ionomer layer has a thickness between 10 and 15 nm as determined by transmission electron microscopy.

According to a seventh aspect, the disclosure provides a process for electrochemically converting carbon dioxide ($CO_2$) into ethylene ($C_2H_4$), the process comprising converting $CO_2$ into carbon monoxide (CO) in a Solid Oxide Electrolysis cell (SOEC) to produce a gaseous product component comprising CO; removing $CO_2$ from the gaseous product component to produce a CO-enriched gas component; and converting CO from the CO-enriched gas component into $C_2H_4$ in the MEA as defined the second aspect, the MEA being supplied with the CO-enriched gas component to produce the product mixture comprising $C_2H_4$.

For example, it comprises humidifying the CO-enriched gas component before being fed to the MEA. and/or in that the CO-enriched gas component has a relative humidity (RH) between 50% and 100%.

In an embodiment, the anode is an Oxygen Evolution Reaction (OER) anode. In an embodiment, the OER anode is a Ti—$IrO_2$ anode; with preference, the Ti—$IrO_2$ anode has an Ir loading from 2 mg·cm$^{-2}$ to 4 mg·cm$^{-2}$.

For example, the anode is a Glucose Electrooxidation Reaction (GOR) anode and the anolyte further comprises glucose; with preference, the anode is a Pt—C anode with preference, the Pt—C anode comprises platinum on graphitized carbon powder. In an embodiment, GOR products that are recovered as an anolyte liquid product stream comprise gluconate, glucuronate, glucarate, and formate.

For example, at least 25% of the CO supplied to the MEA is used to produce $C_2H_4$ when the flow rate is between 3 sccm and 4 sccm; preferably at least 30% of the CO.

For example, the CO-enriched gas component comprises $N_2$.

In an embodiment, the product mixture comprises gas products comprising $C_2H_4$, $H_2$, $CH_4$, and unreacted CO; and liquid products comprising ethanol, propanol, and acetate. With preference, produced $C_2H_4$ represents between 1% and 36% (molar ratio) of the gas products recovered via the product outlet.

For example, converting $CO_2$ into CO in the SOEC comprises feeding a gaseous $CO_2$ stream via a gas inlet of the SOEC at a $CO_2$ flow rate between 10 and 20 sccm, preferably between 4 and 8 sccm.

For example, converting $CO_2$ into CO in the SOEC comprises applying to electrodes of the SOEC a constant current density between 800 mA·cm$^{-2}$ and 1500 mA·cm$^{-2}$.

For example, converting $CO_2$ into CO in the SOEC comprises operating the SOEC at a temperature between 500° C. and about 850° C.; preferably between 650° C. and 840° C.; more preferably between 750° C. and 820° C.

For example, removing $CO_2$ from the gaseous product component comprises contacting the gaseous product component with a $CO_2$-absorption solution to produce the CO-enriched gas component and a $CO_2$-enriched absorption solution.

For example, the $CO_2$-absorption solution is an amine-based solution; with preference, the amine-based solution is a 10 to 60 wt. % aqueous ethanolamine solution; preferably a 15 to 50 wt. % aqueous ethanolamine solution; more preferably a 20 to 40 wt. % aqueous ethanolamine solution; even more preferably a 30 wt % aqueous ethanolamine solution.

For example, further comprising adjusting a relative humidity (RH) of the CO-enriched gas component between 50% and 100% before the step of converting CO.

For example, converting CO from the CO-enriched gas component into $C_2H_4$ in the MEA comprises feeding the CO-enriched gas component to the reactant inlet of the MEA at a CO flow rate between 4 and 80 sccm; with preference, the CO flow rate is between 4 and 5 sccm.

For example, converting CO from the CO-enriched gas component into $C_2H_4$ in the MEA comprises operating the MEA at a constant current density between 20 and 250 mA·cm$^{-2}$; preferably, the current density is between 150 and 170 mA·cm$^{-2}$.

For example, comprising maintaining conversion of $CO_2$ into CO and conversion of CO into $C_2H_4$ during at least 40 hours of operation of the electrolyzer integration without performance degradation.

For example, comprising co-feeding $N_2$ with the CO-enriched gas component in the MEA.

For example, the product mixture comprising $C_2H_4$ further comprises at least one of carbon monoxide, methane, hydrogen, acetate, ethanol and propanol; with preference, the product mixture comprises at least 25% ethylene, together with balance carbon monoxide, hydrogen, methane, ethanol, acetate, and propanol.

For example, further comprising separating $C_2H_4$ from the product mixture; with preference, separating $C_2H_4$ is performed via pressure swing adsorption (PSA) gas separation.

For example, further comprising separating at least one of ethanol, propanol, and acetate from the product mixture; with preference, separation of the at least one of ethanol, propanol, and acetate is performed via distillation.

As will be explained below in relation to various example implementations, the techniques provided herein involve a two-stage cascade approach—coupling a solid-oxide $CO_2$-to-CO electrochemical cell (SOEC) with a CO-to-$C_2H_4$ membrane electrode assembly (MEA) electrolyzer—that can reduce and even eliminate $CO_2$ loss to carbonate. There is for example provided an MEA electrolyzer that converts CO to $C_2H_4$ with energy efficiency well beyond demonstrations to date. The present MEA includes a layered structured catalyst that is used as a cathode and that is providing high selectivity and productivity towards $C_2H_4$. The layered structured catalyst includes an organic film produced from the reduction of N-arylpyridinium to N-aryl-tetradihydro-bipyridine, e.g. N-tolylpyridinium to N-tolyl-tetradihydro-bipyridine, which improves the stabilization of key reaction intermediates; and further includes a short-side-chain (SSC) ionomer that enhances CO transport to a transition metal surface, allowing for the stable production of ethylene ($C_2H_4$) from CO at higher selectivities and current densities than known MEA systems. For example, a $C_2H_4$ Faradaic efficiency (FE) of 65% can be achieved at a current density of 166 mA cm$^{-2}$ over 110 hours of continuous CO-to-$C_2H_4$ electrolysis. Demonstrating a full cascade SOEC-MEA approach, $CO_2$-to-$C_2H_4$ conversion was achieved with no loss of $CO_2$ to carbonate and a total energy requirement of ~138 GJ (ton $C_2H_4$)$^{-1}$, which represents a ~48% reduction in energy intensity compared to the direct route. This improvement originates mainly from the high $C_2H_4$ FE enabled by the layered structured catalyst.

The CORR is coupled with glucose electrooxidation that enables carbonate formation-free ethylene production with a full-process energy requirement of ~89 GJ (ton $C_2H_4$).

In accordance with further aspects that can be combined with any one or the first to the seventh aspects, there is provided a membrane electrode assembly (MEA) for electrochemically converting carbon monoxide (CO) into ethylene (C2H4) under applied current density. The MEA includes a cathode; an anode; an anion-exchange membrane (AEM) to separate the cathode from the anode; an anolyte; a reactant inlet in fluid communication with the cathode to provide a CO-enriched gas component; and a product outlet in fluid communication with the cathode to release a product mixture comprising C2H4; wherein the cathode comprises: a first layer including adsorption sites to adsorb CO as CO* intermediates and catalyze their ensuing electrochemical conversion to C2H4; a second layer that facilitates stabilization of the CO* intermediates for adsorption onto the adsorption sites of the first layer; and a third layer that facilitates diffusion of CO to the adsorption sites of the first layer.

The first layer can be an inner transition metal layer, the second layer can be an intermediate organic layer, and the third layer can be an outer ionomer layer.

There is further provided a layered structured catalyst for conversion of carbon monoxide (CO) into ethylene (C2H4). The catalyst includes a substrate; an inner transition metal layer deposited onto the substrate; an intermediate organic layer deposited onto the inner transition metal layer; and an outer ionomer layer deposited onto the intermediate organic layer.

There is further provided an integrated cascade system for conversion of carbon dioxide (CO2) into ethylene (C2H4). The integrated cascade system includes: a Solid Oxide Electrolysis cell (SOEC) for converting CO2 into carbon monoxide (CO); and the MEA as defined herein, the MEA receiving the CO produced via the SOEC as at least part of the CO-enriched gas component;
  wherein the SOEC comprises: a fuel cathode being a metal-based catalyst; an oxygen-producing anode; a solid oxide electrolyte positioned between the cathode and anode; a gas inlet in fluid communication with the fuel cathode to receive a gaseous CO2 stream; a cathodic gas outlet in fluid communication with the fuel cathode to release a gaseous product component comprising CO; and an anodic gas outlet in fluid communication with the oxygen-producing anode to release produced 02.

In another aspect, there is provided a method to produce a layered structured catalyst for use as a gas diffusion electrode (GDE) in the MEA for electrochemical conversion of CO to C2H4. The method includes depositing an inner transition metal layer onto a substrate; depositing an intermediate organic layer onto the inner transition metal layer; and depositing an outer ionomer layer onto the intermediate organic layer, thereby producing the layered structured catalyst.

In another aspect, there is provided another method for electrochemically converting carbon dioxide (CO2) into ethylene (C2H4). The method includes: converting CO2 into carbon monoxide (CO) in a Solid Oxide Electrolysis cell (SOEC) to produce a gaseous product component comprising CO; removing CO2 from the gaseous product component to produce a CO-enriched gas component; and converting CO from the CO-enriched gas component into C2H4 in the MEA as defined herein, the MEA being supplied with the CO-enriched gas component to produce the product mixture comprising C2H4.

According to a statement 1, the invention provide a membrane electrode assembly (MEA) for electrochemically converting carbon monoxide (CO) into ethylene ($C_2H_4$) under applied current density, the MEA comprising a cathode; an anode; an anion-exchange membrane (AEM) to separate the cathode from the anode; an anolyte; a reactant inlet in fluid communication with the cathode to provide a CO-enriched gas component; and a product outlet in fluid communication with the cathode to release a product mixture comprising $C_2H_4$; wherein the cathode comprises: a first layer including adsorption sites to adsorb CO as CO* intermediates and catalyze their ensuing electrochemical conversion to $C_2H_4$; a second layer that facilitates stabilization of the CO* intermediates for adsorption onto the adsorption sites of the first layer; and a third layer that facilitates diffusion of CO to the adsorption sites of the first layer.

In some implementations, the first layer is an inner transition metal layer, the second layer is an intermediate organic layer, and the third layer is an outer ionomer layer.

In some implementations, the inner transition metal layer has a thickness between 100 nm and 200 nm.

In some implementations, the inner transition metal layer comprises a first sub-layer being sputtered onto a substrate of the cathode; and a second sub-layer being electrodeposited onto the first sub-layer.

In some implementations, the thickness of the first sub-layer is about 150 nm and electrodeposition of the second sub-layer results in a growth of a dendritic structure of the first sub-layer.

In some implementations, the inner transition metal layer comprises copper or a copper alloy.

In some implementations, the intermediate organic layer is a N-arylpyridinium-derived layer that results from the reduction of N-arylpyridinium as a precursor.

In some implementations, the N-arylpyridinium is N-tolylpyridinium and the intermediate organic layer is a N-tolyl substituted tetrahydro-bipyridine (Py) layer.

In some implementations, the outer ionomer layer comprises a ionomer having a hydrophobic backbone and a hydrophilic side chain; with preference with a short hydrophilic side chain.

In some implementations, the ionomer is a short-side-chain (SSC) ionomer.

In some implementations, the outer ionomer layer comprises a perfluorosulfonic acid ionomer.

In some implementations, the ionomer is $(C_4HF_7O_4S \cdot C_2F_4)_x$, wherein x is an integer; with preference, x=1.

In some implementations, the intermediate organic layer and the outer ionomer layer forms a continuous film on a surface of the inner transition metal layer.

In some implementations, the outer ionomer layer has a thickness between 10 nm and 15 nm.

In some implementations, the intermediate organic film has a thickness between 10 nm and 20 nm.

In some implementations, the inner transition metal layer, the intermediate organic layer and the outer ionomer layer define a multiple-layer structure having a porosity ranging between 60% and 70%.

In some implementations, the anolyte comprises an adjusted ion concentration to modify the alkalinity of the anolyte and facilitate $C_2H_4$ production.

In some implementations, the anolyte is a solution comprising $KHCO_3$, $K_2SO_4$, KOH, NaOH or any combinations thereof.

In some implementations, the anolyte is a KOH-containing solution.

In some implementations, the KOH-containing solution has a KOH concentration between 1M KOH and 5 M KOH.

In some implementations, the KOH concentration is 3 M KOH.

In some implementations, the anode is an Oxygen Evolution Reaction (OER) anode.

In some implementations, the OER anode is a Ti—$IrO_2$ anode.

In some implementations, the Ti—$IrO_2$ anode has an Ir loading from 2 mg·cm$^{-2}$ to 4 mg·cm$^{-2}$.

In some implementations, the anode is a Glucose Electrooxidation Reaction (GOR) anode and the anolyte further comprises glucose.

In some implementations, the anode is a Pt—C anode.

In some implementations, the Pt—C anode comprises commercially available platinum on graphitized carbon powder.

In some implementations, GOR products that are recovered as an anolyte liquid product stream comprise gluconate, glucuronate, glucarate, and formate.

In some implementations, the CO-enriched gas component has a relative humidity (RH) between 50% and 100%.

In some implementations, the CO-enriched gas component is fed to the reactant inlet with a flow rate between 4 sccm and 80 sccm.

In some implementations, the flow rate is between 4 sccm and 5 sccm.

In some implementations, at least 25% of the CO supplied to the MEA is used to produce $C_2H_4$ when the flow rate is between 3 sccm and 4 sccm; preferably at least 30% of the CO.

In some implementations, the CO-enriched gas component comprises $N_2$.

In some implementations, the product mixture comprises gas products comprising $C_2H_4$, $H_2$, $CH_4$, and unreacted CO; and liquid products comprising ethanol, propanol, and acetate.

In some implementations, produced $C_2H_4$ represents between 1% and 36% (molar ratio) of the gas products recovered via the product outlet.

In some implementations, the MEA is operated at constant current density between 20 and 250 mA·cm$^{-2}$.

In some implementations, the current density is between 100 and 200 mA·cm$^{-2}$.

In some implementations, the current density is between 150 and 170 mA·cm$^{-2}$.

In some implementations, the cathode achieves a Faradaic efficiency (FE) for CO single pass conversion into $C_2H_4$ of at least 60% at the applied current density of at least 130 mA·cm$^{-2}$.

In some implementations, the FE of the cathode for CO single pass conversion into $C_2H_4$ is of at least 65% at the applied current density of at least 150 mA·cm$^{-2}$.

In some implementations, the FE of the cathode for CO single pass conversion into $C_2H_4$ is of at least 80% at the applied current density of at least 155 mA·cm$^{-2}$.

In some implementations, the FE of the cathode for CO single pass conversion into $C_2H_4$ is about 85% at the applied current density of about 160 mA cm$^{-2}$.

In some implementations, the FE of the cathode for CO single pass conversion into $C_2H_4$ is maintained for at least 80 hours with no performance degradation.

In some implementations, the FE of the cathode for CO single pass conversion into $C_2H_4$ is maintained for at least 100 hours with no performance degradation.

In some implementations, the FE of the cathode for CO single pass conversion into $C_2H_4$ is maintained for about 110 hours with no performance degradation.

In some implementations, a $C_2H_4$ full cell EE is between 15 and 30%, at the applied current density between 20 and 250 mA·cm$^{-2}$.

In some implementations, the $C_2H_4$ full cell EE is between 28% and 30% at the applied current density of about 100 mA·cm$^{-2}$.

In some implementations, produced $C_2H_4$ represents about 35 wt. % of the gas products recovered via the product outlet.

In some implementations, operation of the MEA results in a atop:bridge CO* intermediates ratio that enables high selectivity (>60%) and current density (>100 mA cm$^{-2}$) in CO-to-$C_2H_4$ electrochemical conversion and is higher than in absence of the intermediate organic layer and outer SSC ionomer layer.

In some implementations, the atop:bridge CO* intermediates ratio is about 50%.

In accordance with a further aspect, there is provided an integrated cascade system for conversion of carbon dioxide ($CO_2$) into ethylene ($C_2H_4$), the integrated cascade system comprising: a Solid Oxide Electrolysis cell (SOEC) for converting $CO_2$ into carbon monoxide (CO); and the MEA as defined in accordance with the previous aspect, the MEA receiving the CO produced via the SOEC as at least part of the CO-enriched gas component; wherein the SOEC comprises a fuel cathode being a metal-based catalyst; an oxygen-producing anode; a solid oxide electrolyte positioned between the cathode and anode; a gas inlet in fluid communication with the fuel cathode to receive a gaseous $CO_2$ stream; a cathodic gas outlet in fluid communication with the fuel cathode to release a gaseous product component comprising CO; and an anodic gas outlet in fluid communication with the oxygen-producing anode to release produced $O_2$.

In some implementations, the gaseous product component further comprises $CO_2$, and the system further comprises a $CO_2$ removal unit operatively connected to the first gas outlet of the SOEC to remove substantially all $CO_2$ from the gaseous product component before being fed as the at least part of the CO-enriched gas component to the MEA.

In some implementations, the $CO_2$ removal unit is a $CO_2$-stripping unit, wherein the $CO_2$-stripping unit comprises a gas inlet for receiving the gaseous product component, a liquid inlet for receiving a $CO_2$-absorption solution, a gas outlet to release a $CO_2$-depleted product and a liquid outlet to release a $CO_2$-enriched absorption solution, and $CO_2$-depleted product being fed to the MEA as the at least part of the humidified CO-enriched gas component.

In some implementations, the $CO_2$-absorption solution is an amine-based solution.

In some implementations, the amine-based solution is a 10 to 60 wt. % aqueous ethanolamine solution; preferably a 15 to 50 wt. % aqueous ethanolamine solution; more preferably a 20 to 40 wt. % aqueous ethanolamine solution; even more preferably a 30 wt. % aqueous ethanolamine solution.

In some implementations, the SOEC is operated at a temperature between about 500° C. and about 850° C.

In some implementations, the temperature is about 800° C.

In some implementations, the SOEC is operated at an applied current density between 800 mA·cm$^{-2}$ and 1500 mA·cm$^{-2}$.

In some implementations, the applied current density at the SOEC is between 540 mA·cm$^{-2}$ and 560 mA·cm$^{-2}$.

In some implementations, the gaseous $CO_2$ stream is fed to the SOEC via the gas inlet at a $CO_2$ flow rate between 10 and 20 sccm.

In some implementations, the $CO_2$ flow rate is about 15 sccm.

In some implementations, the $CO_2$ inlet flowrate is adjusted to adjust a ratio of current density over $CO_2$ inlet flowrate to 815:15 (mA·cm$^{-2}$ vs. sccm).

In some implementations, a $CO_2$-to-CO single-pass conversion efficiency in the SOEC is between 35 and 55%.

In some implementations, a Faradaic Efficiency (FE) of the SOEC for the single-pass conversion of $CO_2$ into CO is at least 70% at the applied current density between 500 mA cm-2 and 1.5 A cm$^{-2}$.

In some implementations, the FE of the SOEC for single-pass conversion of $CO_2$ into CO is at least 90% at the applied current density between 540 and 560 mA cm$^{-2}$.

In some implementations, the FE of the SOEC for single-pass conversion of $CO_2$ into CO is about 95% at the applied current density of about 550 mA·cm$^{-2}$, and wherein the $CO_2$-to-CO single-pass conversion efficiency is about 48%.

In some implementations, a $CO_2$-to-$C_2H_4$ EE is between 20% and 22% with a maximum single-pass $CO_2$-to-$C_2H_4$ conversion between 11% and 13% without $CO_2$ loss to carbonate formation.

In some implementations, the $CO_2$-to-$C_2H_4$ EE is of about 20% with the maximum single-pass $CO_2$-to-$C_2H_4$ conversion of about 11%.

In some implementations, the MEA generates $C_2H_4$ at a rate of 1.3 mmol·h$^{-1}$ that is maintained for about 40 hours of operation at the applied current density of 120 mA·cm$^{-2}$.

In accordance with a further aspect, there is provided a layered structured catalyst for conversion of carbon monoxide (CO) into ethylene ($C_2H_4$), comprising a substrate; an inner transition metal layer deposited onto the substrate; an intermediate organic layer deposited onto the inner transition metal layer; and an outer ionomer layer deposited onto the intermediate organic layer.

For example, there is provided a layered structured catalyst for high-rate (>100 mA cm$^{-1}$), selective (>60% Faradaic efficiency), and energy efficient (>25%) conversion of carbon monoxide (CO) into ethylene ($C_2H_4$), comprising a substrate; an inner transition metal layer deposited onto the substrate; an intermediate organic layer deposited onto the inner transition metal layer; and an outer ionomer layer deposited onto the intermediate organic layer.

In some implementations, the substrate comprises polytetrafluoroethylene (PTFE) or PTFE-modified hydrophobic carbon paper.

In some implementations, the inner transition metal layer has a porosity between 60% and 70%.

In some implementations, the inner transition metal layer has a thickness between 100 and 200 nm.

In some implementations, the transition metal is copper or a copper alloy.

In some implementations, the inner transition metal layer comprises a first sub-layer being sputtered onto the substrate; and a second sub-layer being electrodeposited onto the first sub-layer.

In some implementations, the inner transition metal layer continuously and homogenously covers fibers of the substrate.

In some implementations, the intermediate organic layer is a N-arylpyridinium-derived layer that results from the reduction of N-arylpyridinium as a precursor.

In some implementations, the N-arylpyridinium is N-tolylpyridinium, and the N-arylpyridinium-derived layer is a N-tolyl-tetrahydro-bipyridine (Py) layer.

In some implementations, the intermediate N-arylpyridinium-derived layer has a thickness between 10 and 20 nm and forms a continuous film over the inner transition metal layer.

In some implementations, the outer ionomer layer comprises an ionomer having a hydrophobic backbone and a hydrophilic side chain; with preference with a short hydrophilic side chain.

In some implementations, the ionomer is a short-side-chain (SSC) ionomer.

In some implementations, the outer ionomer layer comprises a perfluorosulfonic acid ionomer.

In some implementations, the ionomer is $(C_4HF_7O_4S \cdot C_2F_4)_x$, wherein x is an integer, with preference, x=1.

In some implementations, the outer ionomer layer has a thickness between 10 nm and 15 nm.

In some implementations, the layered structured catalyst is used as a gas diffusion electrode (GDE).

In some implementations, the layered structured catalyst is used as a cathode in the MEA as defined in the penultimate aspect, or in the integrated cascade system as defined in the previous aspect.

In accordance with a further aspect, there is provided a use of the layered structured catalyst as defined in the previous aspect as a cathode in a membrane electrode assembly for conversion of carbon monoxide into ethylene. For example the use is performed at a high current density (>100 mA cm$^{-2}$), a high Faradaic efficiency (65%), and a high energy efficiency (>25%) by simultaneously controlling the diffusion of carbon monoxide and stabilization of the carbon monoxide reduction reaction intermediates on the catalytically active sites.

In accordance with a further aspect, there is provided a method to produce a layered structured catalyst for use as a gas diffusion electrode (GDE), the method comprising: depositing an inner transition metal layer onto a substrate; depositing an intermediate organic layer onto the inner transition metal layer; and depositing an outer ionomer layer onto the intermediate organic layer, thereby producing the layered structured catalyst.

In some implementations, the substrate comprises polytetrafluoroethylene (PTFE) or PTFE-modified hydrophobic carbon paper.

In some implementations, the substrate has an average pore size between 100 μm and 800 μm, or of about 450 μm.

In some implementations, depositing the inner transition metal layer onto the substrate comprises: magnetically sputtering a transition metal onto the substrate to produce a sputtered metal coating; and electrodepositing the transition metal onto the sputtered metal coating to form the inner transition metal layer comprising the sputtered metal coating.

In some implementations, the transition metal is copper or a copper alloy.

In some implementations, magnetically sputtering the transition metal onto the substrate comprises magnetically sputtering a copper seed onto the substrate at a sputtering rate of between 0.10 Å·sec$^{-1}$ and 2.0 Å·sec$^{-1}$ under $10^{-6}$ to $10^{-7}$ Torr.

In some implementations, electrodeposition of copper is performed at a reductive current density of 400 mA·cm$^{-2}$ under the continuous flow of $CO_2$.

In some implementations, electrodepositing the transition metal is performed in a flow electrolyzer comprising an anode flow compartment; a cathode flow compartment; an anion exchange membrane (AEM) separating the anode flow compartment and the cathode flow compartment; a gas inlet in fluid communication with the cathode flow compartment for providing $CO_2$ at a constant flow rate; a first liquid inlet in fluid communication with the cathode flow compartment for providing a catholyte solution comprising the transition metal; and a second liquid inlet in fluid communication with the anode flow compartment for providing an anolyte; and a counter electrode.

In some implementations, the anolyte is a KOH-containing solution.

In some implementations, the KOH-containing solution has a KOH concentration between 0.1 M and 5 M KOH.

In some implementations, a $CO_2$ flow rate is between 4 and 8 sccm.

In some implementations, the counter electrode is a catalyst showing activity towards oxygen reduction.

In some implementations, the counter electrode is nickel foam or iridium oxide supported on titanium foam.

In some implementations, electrodepositing the transition metal comprises preparing a cathode through electroreduction of copper bromide in presence of potassium hydroxide and $CO_2$.

A method of wherein the catholyte solution comprises 0.1 to 0.5 M of copper bromide (98%, Sigma-Aldrich®), 0.2 to 1.0 M sodium tartrate dibasic dehydrate and 1.0 to 3.0 M of potassium hydroxide.

In some implementations, depositing the intermediate organic layer onto the inner transition metal layer comprises electrodepositing the intermediate organic layer.

In some implementations, electrodepositing the intermediate organic layer comprises electrodepositing a N-arylpyridinium-derived film.

In some implementations, the N-arylpyridinium is N-tolylpyridinium, and the N-arylpyridinium-derived film is a N-tolyl substituted tetrahydro-bipyridine (Py) film deriving from the N-tolylpyridinium when subjected to reduction conditions.

In some implementations, the N-tolyl-tetradihydro-bipyridine film has a thickness between 10 and 20 nm.

In some implementations, electrodepositing the intermediate organic layer is performed in a three-electrode system comprising a reference electrode, a working electrode and a counter electrode.

In some implementations, the reference electrode is an Ag/AgCl (3 M KCl) electrode, the working electrode is electrodeposited Cu, and the counter electrode is platinum (Pt) foil.

In some implementations, it further comprises preparing another electrolyte solution comprising potassium carbonate and a N-tolyl-pyridinium triflate precursor for electrodeposition of the intermediate organic layer.

In some implementations, the electrolyte solution comprises 0.1 to 1 M of $KHCO_3$ and 10 to 50 mM of the N-tolyl-pyridinium triflate precursor.

In some implementations, depositing an outer SSC ionomer layer onto the intermediate organic layer comprises spraying an ionomer-containing solution to form the outer SSC ionomer layer.

In some implementations, it further comprises preparing the ionomer-containing solution comprising a cation exchange perfluorosulfonic acid (PFSA) ionomer with short-side-chain (SSC) and methanol.

In some implementations, the ionomer-containing solution comprises 16.88 µL of the cation exchange perfluorosulfonic acid (PFSA) ionomer with short-side-chain (SSC) (Aquivion® D79-25BS) and 3 mL of methanol (99.8%, anhydrous, Sigma Aldrich®).

In some implementations, it further comprises sonicating the ionomer-containing solution to facilitate homogeneous dispersion of the ionomer in the ionomer-containing solution before spray deposition thereof.

In some implementations, the outer SSC ionomer layer has a thickness between 10 and 15 nm.

In accordance with a further aspect, there is provided a method for electrochemically converting carbon dioxide ($CO_2$) into ethylene ($C_2H_4$), the method comprising: converting $CO_2$ into carbon monoxide (CO) in a Solid Oxide Electrolysis cell (SOEC) to produce a gaseous product component comprising CO; removing $CO_2$ from the gaseous product component to produce a CO-enriched gas component; and converting CO from the CO-enriched gas component into $C_2H_4$ in the MEA as defined above, the MEA being supplied with the CO-enriched gas component to produce the product mixture comprising $C_2H_4$.

In some implementations, it comprises humidifying the CO-enriched gas component before being fed to the MEA.

In some implementations, the CO-enriched gas component has a relative humidity (RH) between 50% and 100%.

In some implementations, converting $CO_2$ into CO in the SOEC comprises feeding a gaseous $CO_2$ stream via a gas inlet of the SOEC at a $CO_2$ flow rate between 10 and 20 sccm, or 4 and 8 sccm.

In some implementations, converting $CO_2$ into CO in the SOEC comprises applying to electrodes of the SOEC a constant current density between 800 mA·cm$^{-2}$ and 1500 mA·cm$^{-2}$.

In some implementations, converting $CO_2$ into CO in the SOEC comprises operating the SOEC at a temperature between 500° C. and about 850° C.

In some implementations, the temperature of the SOEC is 800° C.

In some implementations, removing $CO_2$ from the gaseous product component comprises contacting the gaseous product component with a $CO_2$-absorption solution to produce the CO-enriched gas component and a $CO_2$-enriched absorption solution.

In some implementations, the $CO_2$-absorption solution is an amine-based solution.

In some implementations, the amine-based solution is a 10 to 60 wt. % aqueous ethanolamine solution; preferably a 15 to 50 wt. % aqueous ethanolamine solution; more preferably a 20 to 40 wt. % aqueous ethanolamine solution; even more preferably a 30 wt. % aqueous ethanolamine solution.

In some implementations, it further comprises adjusting a relative humidity (RH) of the CO-enriched gas component between 50% and 100% before the step of converting CO.

In some implementations, converting CO from the CO-enriched gas component into $C_2H_4$ in the MEA comprises feeding the CO-enriched gas component to the reactant inlet of the MEA at a CO flow rate between 4 and 5 sccm.

In some implementations, the CO flow rate is between 4 and 5 sccm.

In some implementations, converting CO from the CO-enriched gas component into $C_2H_4$ in the MEA comprises operating the MEA at a constant current density between 20 and 250 mA·cm$^{-2}$.

In some implementations, the current density is between 150 and 170 mA·cm$^{-2}$.

In some implementations, it comprises maintaining conversion of $CO_2$ into CO and conversion of CO into $C_2H_4$ during at least 40 hours of operation of the electrolyzer integration without performance degradation.

In some implementations, it comprises co-feeding $N_2$ with the CO-enriched gas component in the MEA.

In some implementations, the product mixture comprising $C_2H_4$ further comprises at least one of carbon monoxide, methane, hydrogen, acetate, ethanol and propanol.

In some implementations, the product mixture comprises at least 25% ethylene, together with balance carbon monoxide, hydrogen, methane, ethanol, acetate, and propanol.

In some implementations, it further comprises separating $C_2H_4$ from the product mixture.

In some implementations, separating $C_2H_4$ is performed via pressure swing adsorption (PSA) gas separation.

In some implementations, it further comprises separating at least one of ethanol, propanol, and acetate from the product mixture.

In some implementations, separation of the at least one of ethanol, propanol, and acetate is performed via distillation.

Various implementations, features and aspects of the present techniques are described herein, including in the claims, figures and following description.

BRIEF DESCRIPTION OF DRAWINGS

The Figures describe various aspects and information regarding the techniques described and claimed herein.

DETAILED DESCRIPTION

The present disclosure relates to a layered structured catalyst for conversion of carbon monoxide (CO) into ethylene ($C_2H_4$), remarkable that it comprises a substrate; an inner transition metal layer deposited onto the substrate; an intermediate organic layer deposited onto the inner transition metal layer; and an outer ionomer layer deposited onto the intermediate organic layer; and in that the transition metal is copper or a copper alloy and the outer ionomer layer comprises an ionomer having a hydrophobic backbone and a hydrophilic side chain wherein the ionomer is a short-side-chain (SSC) ionomer.

Figure 53:
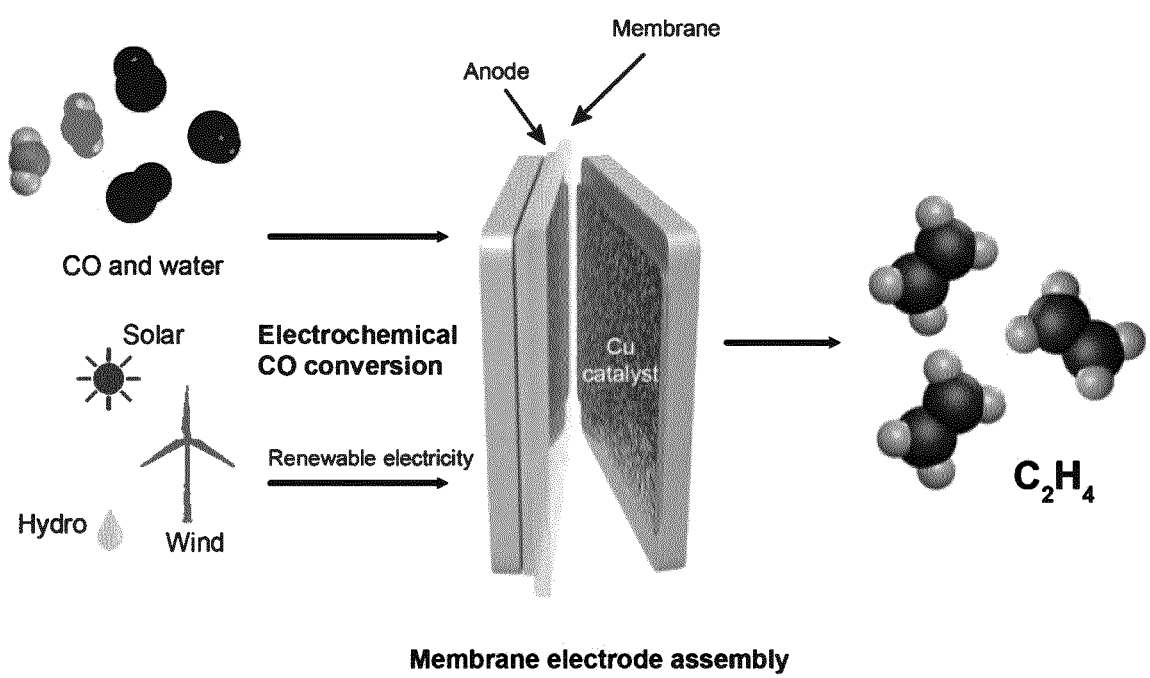
FIG. 53 is a schematic illustration of CO electroreduction to $C_2H_4$ in an MEA powered by renewables. The anode is $IrO_2$ on Ti meshes. In the cascade $CO_2RR$, the CO-to-$C_2H_4$ MEA is connected to a $CO_2$ trap at the outlet of the SOEC.

Carbon dioxide ($CO_2$) can be electrochemically reduced to carbon monoxide (CO) in a Solid Oxide Electrolysis Cell (SOEC). Carbon monoxide can be further electrochemically reduced to ethylene ($C_2H_4$) in a membrane electrode assembly (MEA) that converts gaseous reactants at a surface of a cathode of the MEA see FIG. 53. The SOEC can be operated in combination with the MEA to form a cascade system to convert $CO_2$ into a product mixture including $C_2H_4$. The present techniques relate to a new MEA comprising the layered structured catalyst, that can be used in an integrated cascade system, so as to produce $C_2H_4$ at an enhanced selectivity and current density for a single-pass conversion of of CO to $C_2H_4$.

Figure 1:
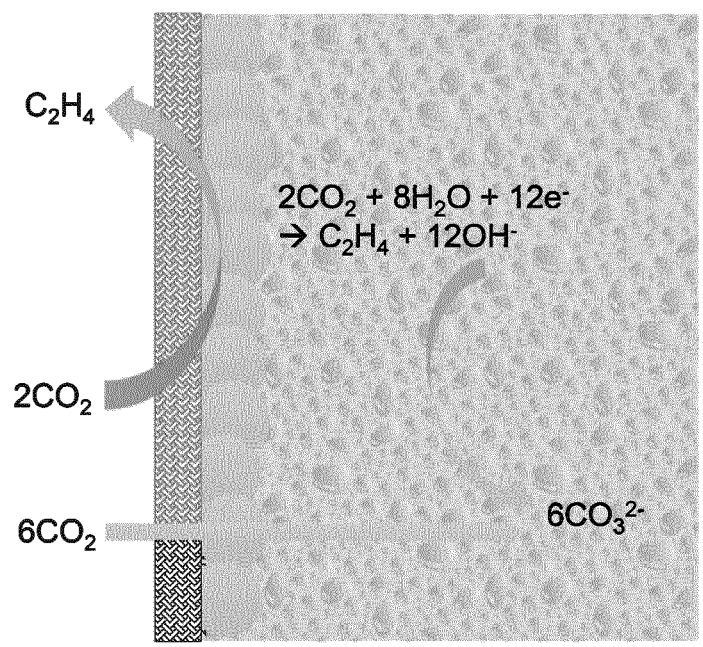
FIG. 1 is a schematic representation of a mechanism of carbonate formation during $CO_2$ electroreduction. Producing 1 mole of $C_2H_4$ by $CO_2RR$ generates 12 moles of $OH^-$ which reacts with another 6 moles of $CO_2$. If the $C_2H_4$ is 100%, the $CO_2$-to-$C_2H_4$ single-pass conversion is limited to 25%. Today's highest $C_2H_4$ FE remains below 80%. The maximum single-pass conversion would therefore less than 20%.
Figure 2:
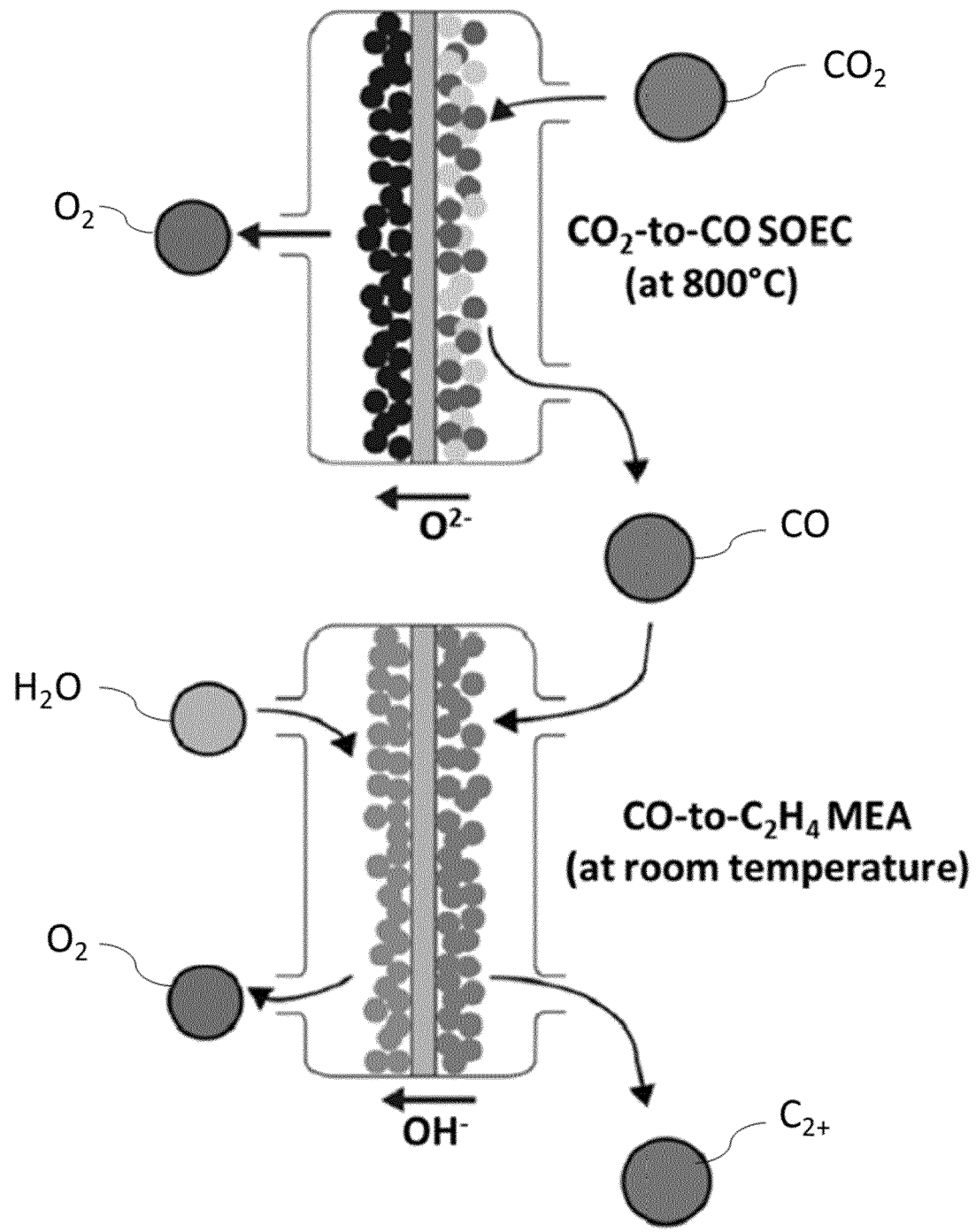
FIG. 2 is a schematic illustration of renewable $CO_2$-synthesized $C_2H_4$ in a combined system consisting of a $CO_2$-to-CO SOEC and a CO-to-$C_2H_4$ MEA in carbonate-formation-free $CO_2$-to-$C_2H_4$ production through cascade $CO_2RR$.
Figure 3:
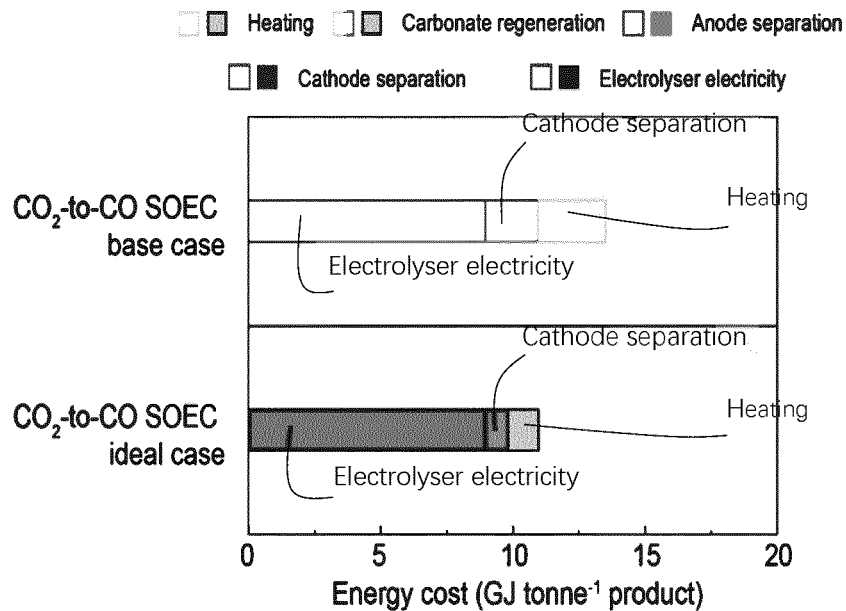
FIG. 3 is a graph showing techno-economic assessment (TEA) that details SOEC energy cost breakdown for base-case and ideal-case scenarios.

In some implementations, carbonate-free conversion of $CO_2$ to $C_2H_4$ can be realized through two cascading steps (FIG. 2): (1) $CO_2$ reduction to CO in a high-temperature $CO_2$-to-CO electrochemical cell (SOEC) which avoids carbonate formation and (2) CO reduction to $C_2H_4$(CORR-to-$C_2H_4$) in an MEA electrolyzer (FIG. 3).

$CO_2$-to-CO Conversion in an SOEC

The SOEC as encompassed herein includes a fuel cathode being a metal-based catalyst; an oxygen-producing anode; a solid oxide electrolyte positioned between the cathode and anode; a gas inlet in fluid communication with the fuel cathode to receive a gaseous $CO_2$ stream; a cathodic gas outlet in fluid communication with the fuel cathode to release a gaseous product component comprising CO; and an anodic gas outlet in fluid communication with the oxygen-producing anode to release produced $O_2$. The product stream from the cathode can be referred to as the cathodic stream, and the products from the anode can be referred to as the anodic stream. As one skilled in the art will readily understand, the cathodic stream can further include unreacted $CO_2$.

Figure 4:
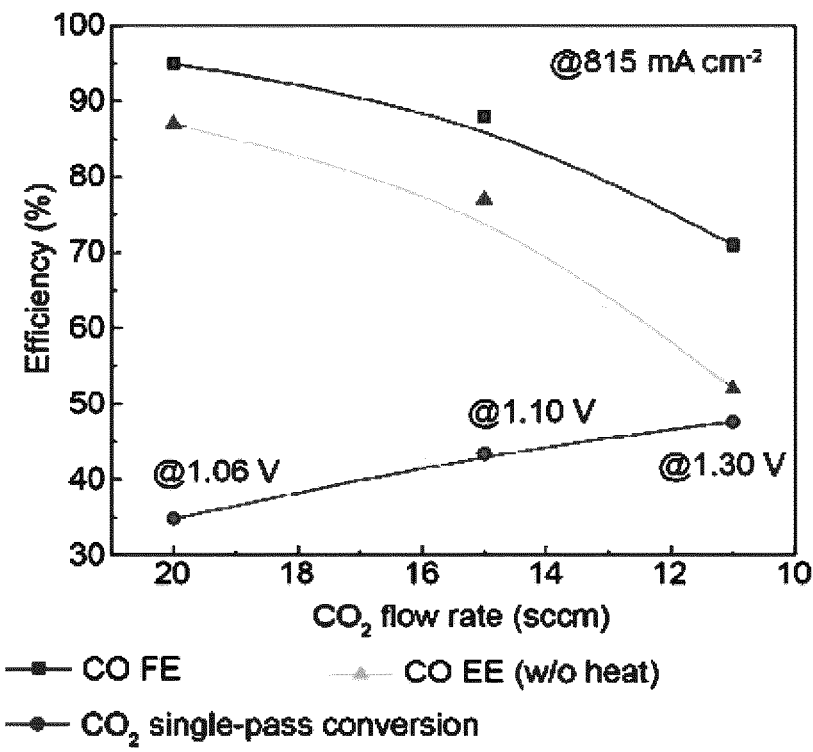
FIG. 4 shows $CO_2$-to-CO conversion in a SOEC: ($CO_2$-to-CO Faradaic efficiency, single-pass conversion, and energy efficiency in a commercial 2.5-cm NiO—YSZ/YSZ/GDC/LSC at various $CO_2$ flow rates. The decreases in the $CO_2$ single-pass conversion by lowering $CO_2$ flow rates or increasing current density were caused by the CO disproportionation reaction, which is also known as the Boudouard reaction.

The performance of $CO_2$-to-CO conversion was tested in a SOEC. The SOEC was operated at 800° C. and FIG. 4 shows that 95% CO Faradaic Efficiency (FE) and 89% CO Energy Efficiency (EE) were achieved at 815 mA cm$^{-2}$ and a $CO_2$ flow rate of 20 sccm. This performance can translate into a $CO_2$-to-CO single-pass efficiency of about 36%.

Figure 5:
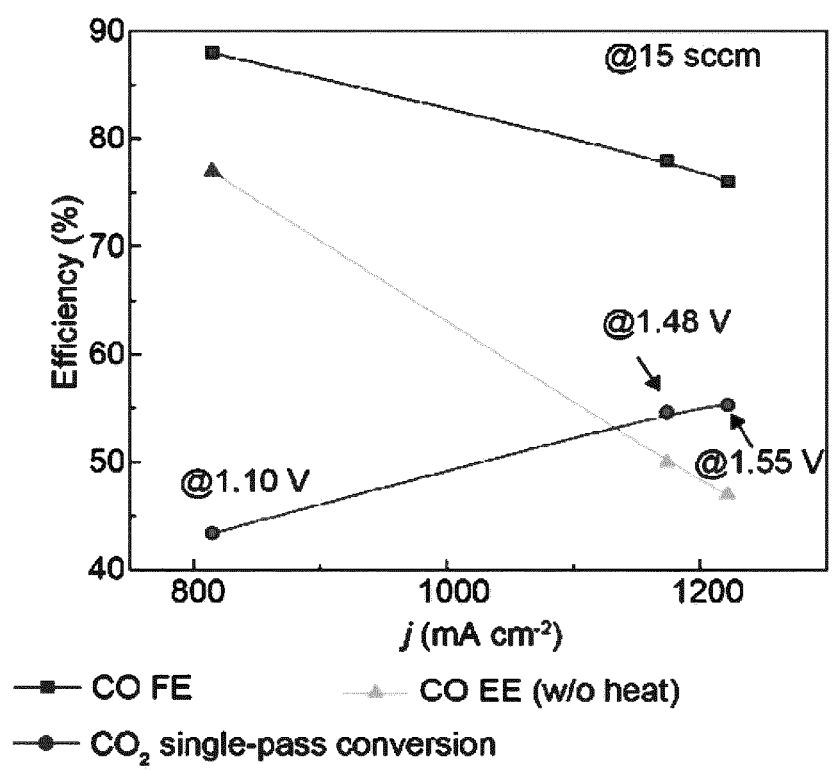
FIG. 5 shows $CO_2$-to-CO conversion in a SOEC: $CO_2$-to-CO Faradaic efficiency, single-pass conversion, and energy efficiency in a commercial 2.5-cm NiO—YSZ/YSZ/GDC/LSC at various $CO_2$ current densities. The decreases in the $CO_2$ single-pass conversion by lowering $CO_2$ flow rates or increasing current density were caused by the CO disproportionation reaction, which is also known as the Boudouard reaction.
Figure 6:
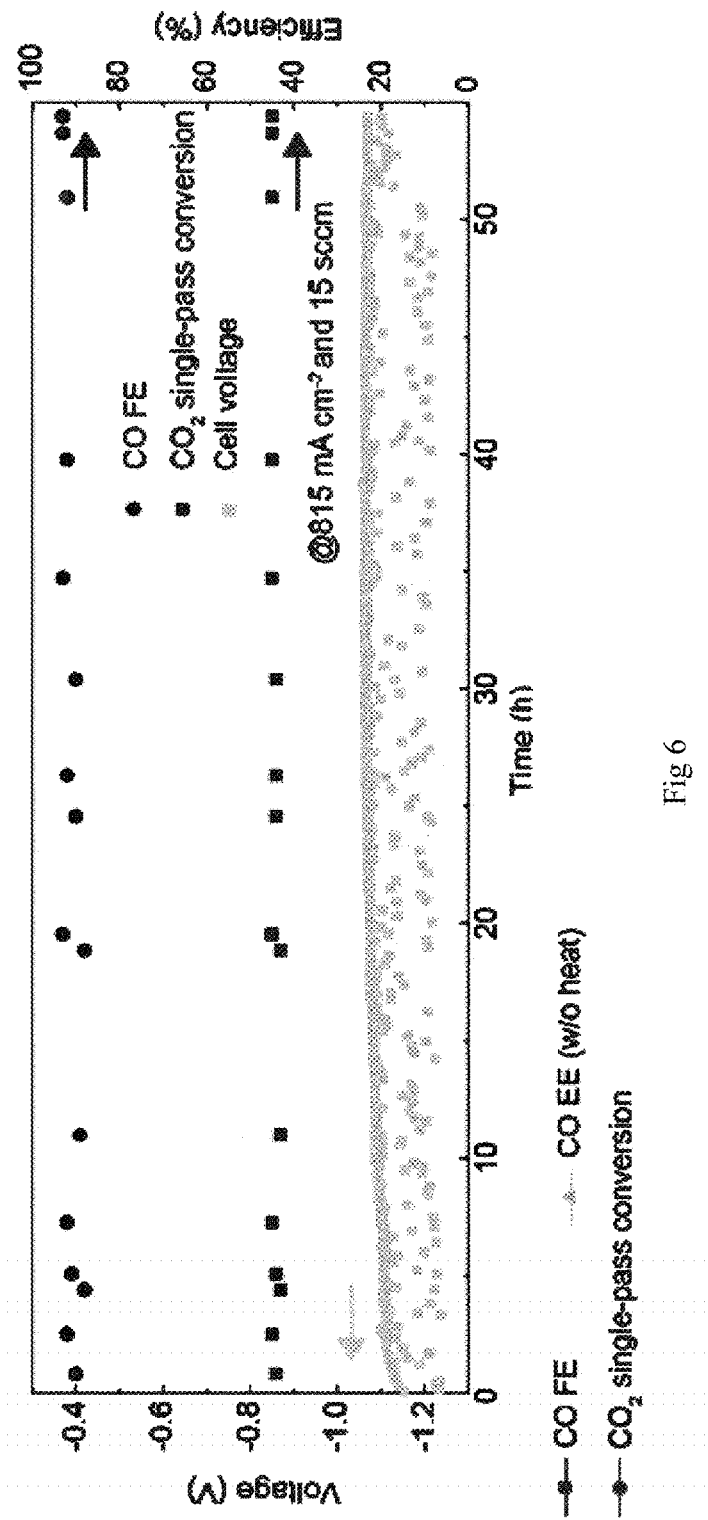
FIG. 6 shows $CO_2$-to-CO conversion in a SOEC: The $CO_2$-to-CO Faradaic efficiency, single-pass conversion, and cell voltage profiles during 55-hour test at 815 mA cm$^{-2}$ and a $CO_2$ flow rate of 15 sccm. The operating temperature is 800° C.

The performance of the SOEC can be further improved by lowering flow rates or increasing applied current, to the limit imposed by the CO disproportionation reaction, also referred to as the Boudouard reaction. A maximum $CO_2$-to-CO single-pass conversion of ~55% was obtained (FIG. 5) at a CO FE of ~77%, current density of 1.25 A cm$^{-2}$. At lower flow rates, considering both CO selectivity and $CO_2$ single-pass conversion, the current density vs. $CO_2$ flow rate ratio of 815:15 (mA cm$^{-2}$:sccm) was confirmed to be the best experimental conditions under which a constant CO FE of ~91% and $CO_2$-to-CO single-pass conversion of ~45% (FIG. 6) were observed. The energy input requirement for this SOEC step was 13.49 GJ/ton CO.

CORR MEA for $C_2H_4$ Electroproduction

Figure 7:
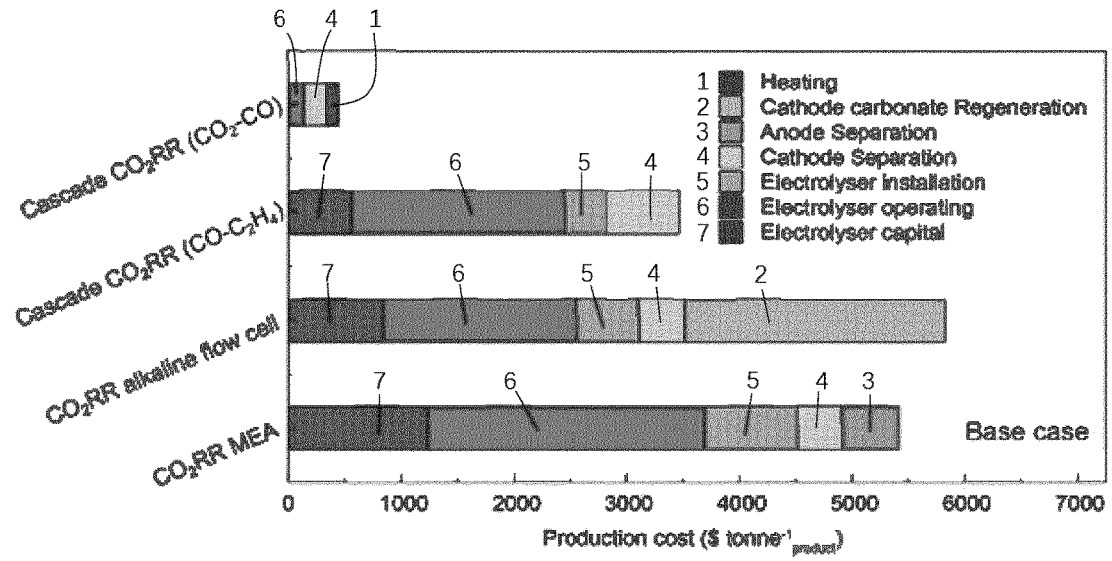
FIG. 7 shows base-case scenarios in a techno-economic assessment (TEA) comparison of the production costs in the cascade SOEC-MEA system and the state-of-the-art $CO_2$-to-$C_2H_4$ electrolyzers.
Figure 8:
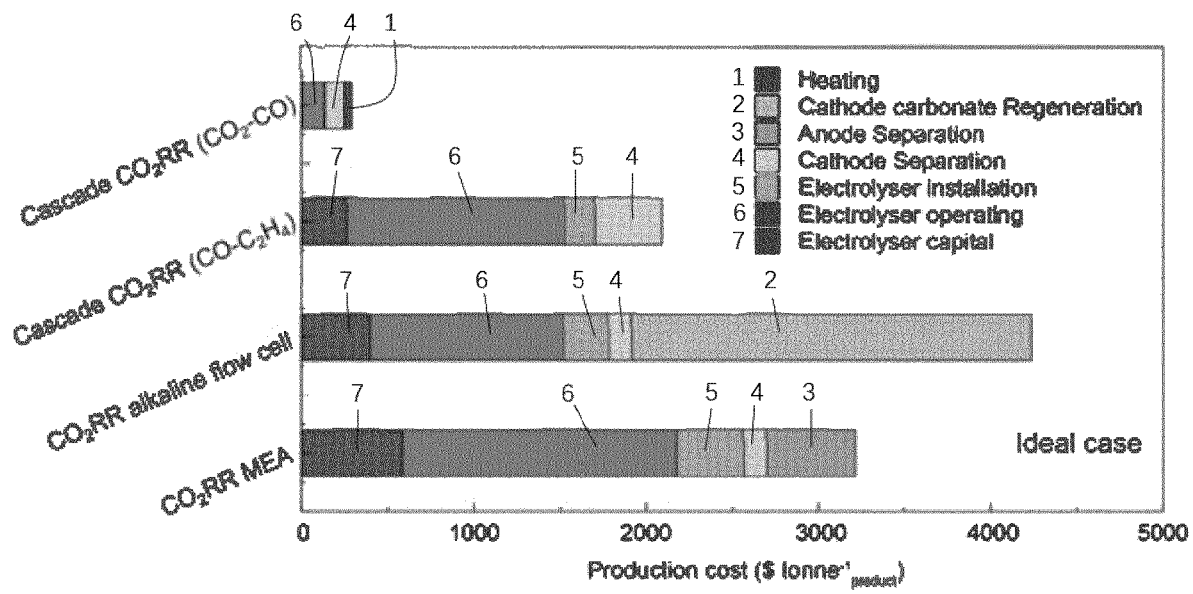
FIG. 8 shows ideal-case scenarios in a techno-economic assessment (TEA) comparison of the production costs in the cascade SOEC-MEA system and the state-of-the-art $CO_2$-to-$C_2H_4$ electrolyzers.

For $C_2H_4$ production, the proposed MEA electrolyzer allows for an enhanced conversion of CO-to-$C_2H_4$ with efficiency well beyond demonstrations to date (FIGS. 7 and 8). The proposed MEA electrolyzer includes a cathode comprising an inner transition metal layer, an intermediate organic layer and an outer ionomer layer. A CO-enriched gas component is fed into the MEA electrolyzer and the CO-enriched gas component can include CO and water vapor as reactants for the formation of $C_2H_4$. Relative humidity (RH) of the CO-enriched gas component can range between 50% and 100%.

To date, the highest FE for CO-to-$C_2H_4$ in known MEA electrolyzers remained below 40%, and the corresponding $C_2H_4$ partial current density ($j_{C2H4}$) was less than 60 mA cm$^{-2}$. It is shown herein that high $C_2H_4$ FE (>60%) can be achieved in concert with high current density (>150 mA cm$^{-2}$) and low operating full-cell potential (<2.7 V).

Figure 9:
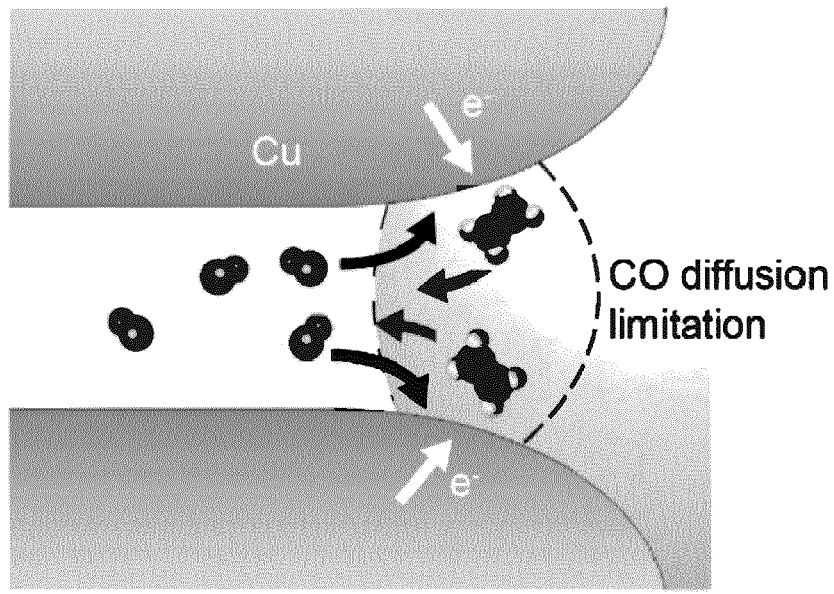
FIG. 9 relates to CORR-to-$C_2H_4$ at the bare Cu surface and shows a schematic illustration of a three-phase catalytic interface using a bare Cu catalyst.
Figure 10:
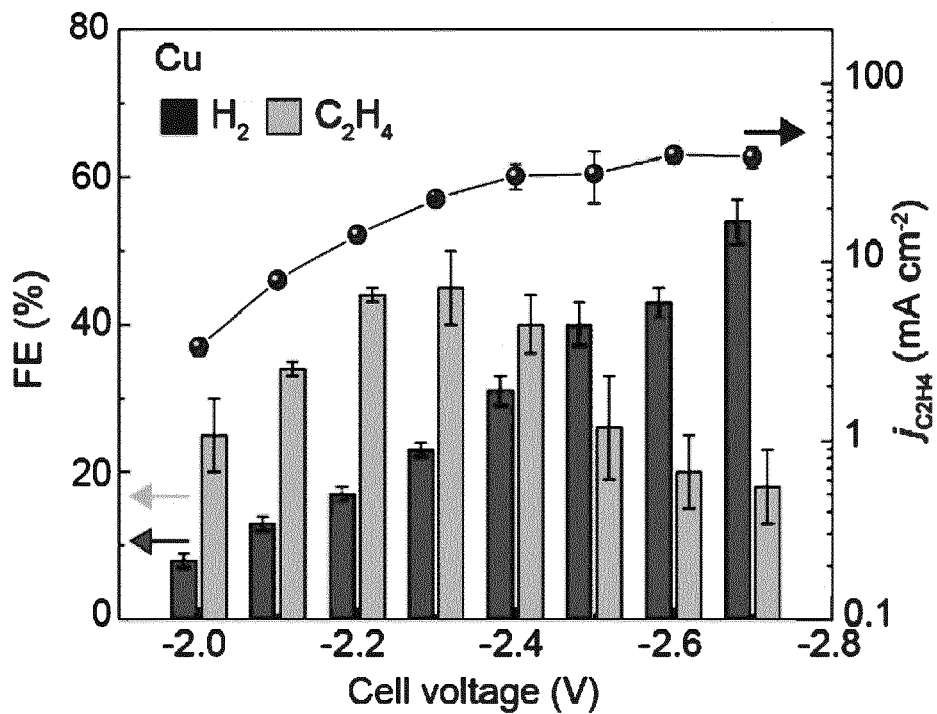
FIG. 10 relates to CORR-to-$C_2H_4$ at the bare Cu surface and shows a graph of the obtained CO-to-$C_2H_4$ performance in 3 M KOH anolyte according to the cell voltage.

For manufacturing a cathode from the MEA electrolyzer at the experimental stage, copper (Cu) catalysts were electrodeposited under $CO_2$-rich conditions to form the MEA cathodes. A $CO_2$-rich environment increases Cu (100) exposure, which enhances the selectivity towards $C_2H_4$. However, a simple Cu surface has large regions that do not have ready access to CO on the hydrophilic surface (FIG. 9). This catalyst consequently favours unwanted $H_2$ production, allowing $C_2H_4$ production with a maximum FE of only 50% at a low partial current density ($j_{C2H4}$) of 60 mA cm$^{-2}$ (FIG. 10).

Figure 11:
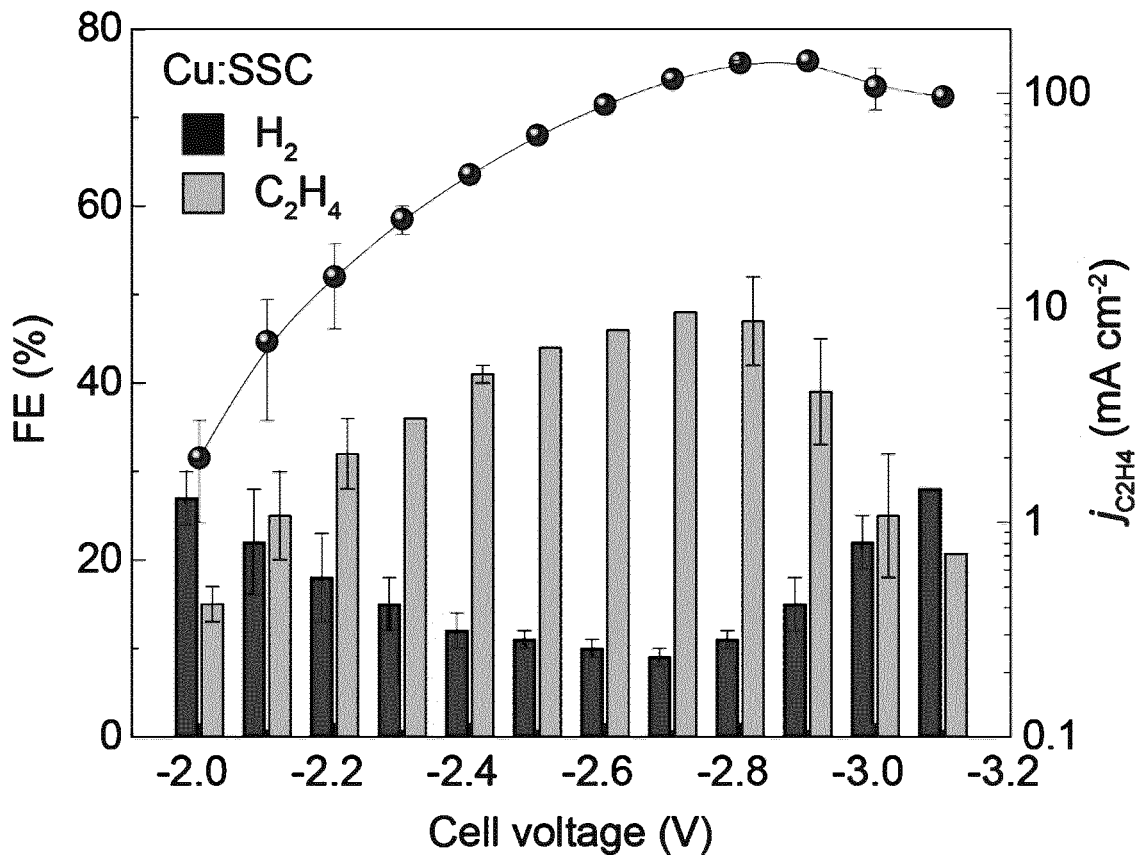
FIG. 11 is a graph of the $C_2H_4$ FE and partial current density of an MEA using the Cu:SSC cathode according to the cell voltage. Error bars correspond to the standard deviation of 3 independent measurements.

Modifying the Cu surface with hydrophobic aliphatic molecules or ionomers, to create gas-reactant-rich local regions can increase reactant availability at the catalytic interface and improve the selectivity and activity towards $C_2H_4$ electroproduction. For example, a $(C_4HF_7O_4S \cdot C_2F_4)_x$ short-side-chain (SSC) ionomer coating was added on the Cu surface of the cathode. $H_2$ selectivity was found to be suppressed by 10-30% across the screened cell potential window, and the highest $j_{C2H4}$ increased to ~155 mA cm$^{-2}$ (FIG. 11). The suppression of $H_2$ and promotion of $C_2H_4$ productivity indicate that SSC ionomer significantly improves the CO transport to the active sites of the metallic layer. However, the maximum $C_2H_4$ FE remained ~50%.

Figure 12:
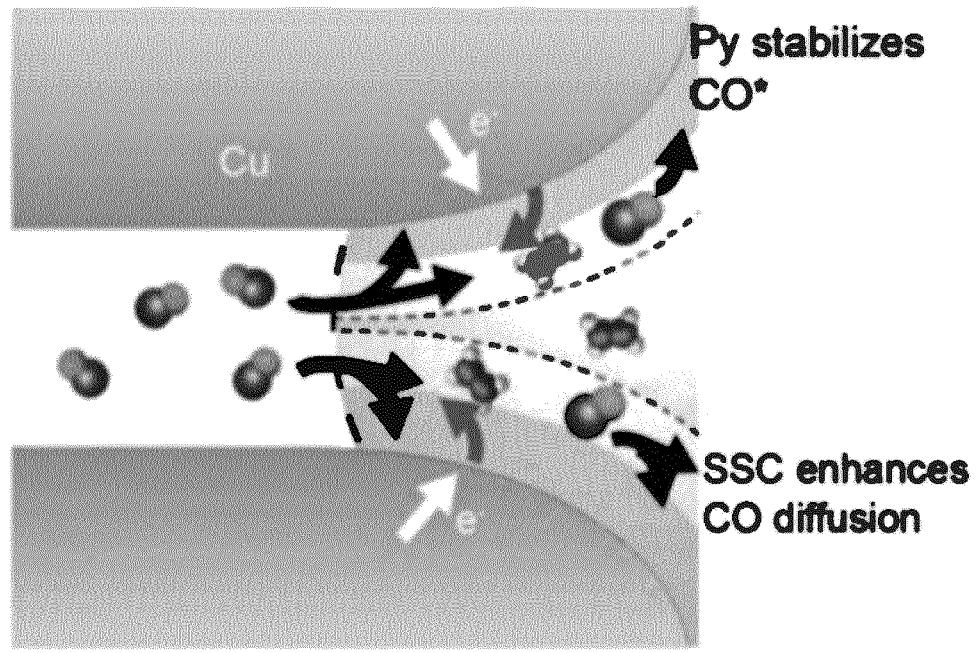
FIG. 12 shows CO-to-$C_2H_4$ electroreduction in an MEA wherein introducing additives to improve CO diffusion and stabilize CO* intermediates leads to enhanced $C_2H_4$ selectivity.
Figure 13:
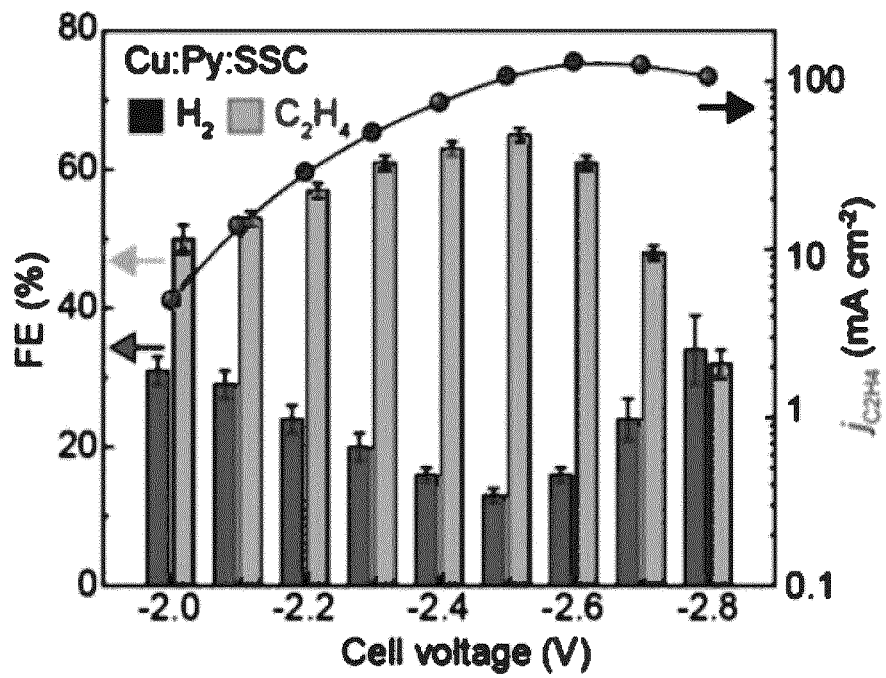
FIG. 13 shows CO-to-$C_2H_4$ electroreduction in an MEA wherein introducing additives to improve CO diffusion and stabilize CO* intermediates leads to enhanced $C_2H_4$ activity.

A molecular tuning strategy is proposed to promote $C_2H_4$ production from CO at lower potential by altering adsorption of key CO* intermediate. For example, a N-tolyl substituted tetrahydro-bipyridine (labelled Py) interlayer between Cu and SSC ionomer was introduced by an electrodimerization method. This metal—molecular film—ionomer combination (referred to as Cu:Py:SSC), in which SSC ionomer improves the CO diffusion at the outer layer and Py provides more atop-bound CO* on Cu surface (FIG. 12), enabled the highest $C_2H_4$ FE of 65±1% at a 2.5 V full-cell potential and provided a $j_{C2H4}$ of 130 mA cm$^{-2}$ at 2.6 V (FIG. 13). Detailed CORR-to-$C_2H_4$ performance of respectively the bare Cu catalyst, Cu:SSC and Cu:Py:SSC are summarized in Tables 1, 2 and 3.

TABLE 1

The CORR-to-$C_2H_4$ performance of bare Cu catalyst. Error bars correspond to the standard deviation of 3 independent measurements.

| Full cell potential (V) | j (mA cm$^{-2}$) | Faradaic efficiency (%) | | | $j_{C2H4}$ (mA cm$^{-2}$) | Energy efficiency (%) |
|---|---|---|---|---|---|---|
| | | $H_2$ | $CH_4$ | $C_2H_4$ | | |
| −2.0 | 9 ± 3 | 8 | 1 | 23 ± 5 | 2 ± 1 | 13 ± 3 |
| −2.1 | 19 ± 5 | 13 ± 2 | 0.3 ± 0.1 | 35 ± 1 | 7 ± 2 | 18 ± 1 |
| −2.2 | 31 ± 6 | 17 ± 1 | 0.2 | 44 | 14 ± 3 | 22 |
| −2.3 | 45 ± 7 | 23 ± 1 | 0.1 | 47 ± 3 | 22 ± 2 | 21 ± 2 |
| −2.4 | 65 ± 9 | 30 ± 3 | 0.2 ± 0.1 | 41 ± 3 | 26 ± 2 | 18 ± 1 |
| −2.5 | 96 ± 22 | 38 ± 5 | 0.5 ± 0.3 | 29 ± 9 | 26 ± 2 | 13 ± 4 |
| −2.6 | 98 | 43 | 0.3 | 27 | 26 | 11 |
| −2.7 | 122 | 54 | 0.5 | 18 | 22 | 7 |

Operating conditions:
anolyte: 3M KOH;
anolyte flow rate: 20 mL/min;
CO flow rate: 80 sccm; and
cell temperature: 25° C.

TABLE 2

The CORR-to-$C_2H_4$ performance of the Cu:SSC catalyst.
Error bars correspond to the standard deviation
of 3 independent measurements.

| Full cell potential (V) | j (mA cm$^{-2}$) | Faradaic efficiency (%) H$_2$ | CH$_4$ | C$_2$H$_4$ | j$_{C2H4}$ (mA cm$^{-2}$) | Energy efficiency (%) |
|---|---|---|---|---|---|---|
| −2.0 | 12 ± 5 | 27 ± 3 | 0.4 ± 0.1 | 15 ± 2 | 2 ± 1 | 8 ± 1 |
| −2.1 | 25 ± 9 | 22 ± 6 | 0.2 ± 0.1 | 25 ± 5 | 7 ± 4 | 13 ± 2 |
| −2.2 | 44 ± 13 | 18 ± 5 | 0.2 ± 0.1 | 32 ± 4 | 14 ± 6 | 16 ± 2 |
| −2.3 | 71 ± 9 | 15 ± 3 | 0.1 | 36 | 26 ± 4 | 17 ± 1 |
| −2.4 | 105 ± 11 | 12 ± 2 | 0.1 | 41 ± 1 | 42 ± 4 | 18 ± 1 |
| −2.5 | 146 ± 11 | 11 ± 1 | 0.1 | 44 | 64 ± 5 | 19 ± 1 |
| −2.6 | 193 ± 15 | 10 ± 1 | 0.1 | 46 | 89 ± 7 | 19 ± 1 |
| −2.7 | 246 ± 20 | 9 ± 1 | 0.2 | 48 | 117 ± 9 | 19 ± 1 |
| −2.8 | 300 ± 22 | 11 ± 1 | 0.3 | 47 ± 5 | 139 ± 4 | 18 ± 2 |
| −2.9 | 367 ± 20 | 15 ± 3 | 0.4 ± 0.1 | 39 ± 6 | 142 ± 13 | 14 ± 2 |
| −3.0 | 438 ± 28 | 22 ± 3 | 1 | 25 ± 7 | 108 ± 24 | 9 ± 2 |
| −3.1 | 468 | 28 | 1.8 | 20.7 | 97 | 7 |

Operating conditions:
anolyte: 3M KOH;
anolyte flow rate: 20 mL/min;
CO flow rate: 80 sccm; and
cell temperature: 25° C.

TABLE 3

The CORR-to-$C_2H_4$ performance of the Cu:Py:SSC catalyst. Error bars correspond to the standard deviation of 3 independent measurements.

| Full cell potential (V) | j (mA cm$^{-2}$) | Faradaic efficiency (%) H$_2$ | CH$_4$ | C$_2$H$_4$ | j$_{C2H4}$ (mA cm$^{-2}$) | Energy efficiency (%) |
|---|---|---|---|---|---|---|
| −2.0 | 10 ± 1 | 33 ± 3 | 1 | 48 ± 3 | 5 ± 1 | 26 ± 2 |
| −2.1 | 25 ± 1 | 31 ± 4 | 0.3 | 52 ± 3 | 13 ± 1 | 26 ± 1 |
| −2.2 | 49 ± 2 | 26 ± 3 | 0.2 | 57 ± 1 | 29 ± 1 | 28 ± 1 |
| −2.3 | 80 ± 3 | 21 ± 2 | 0.1 | 61 ± 1 | 48 ± 2 | 29 ± 1 |
| −2.4 | 117 ± 2 | 17 ± 2 | 0.2 | 63 ± 1 | 74 ± 2 | 28 ± 1 |
| −2.5 | 164 ± 3 | 14 ± 2 | 0.3 | 65 ± 1 | 106 ± 3 | 28 ± 1 |
| −2.6 | 212 ± 5 | 17 ± 2 | 1 | 61 ± 1 | 129 ± 1 | 25 ± 1 |
| −2.7 | 258 ± 4 | 27 ± 5 | 2 ± 1 | 48 | 124 ± 3 | 19 |
| −2.8 | 312 ± 6 | 39 ± 10 | 3 ± 1 | 32 ± 4 | 99 ± 14 | 12 ± 1 |

Operating conditions:
anolyte: 3M KOH;
anolyte flow rate: 20 mL/min;
CO flow rate: 80 sccm; and
cell temperature: 25° C.

Figure 14:
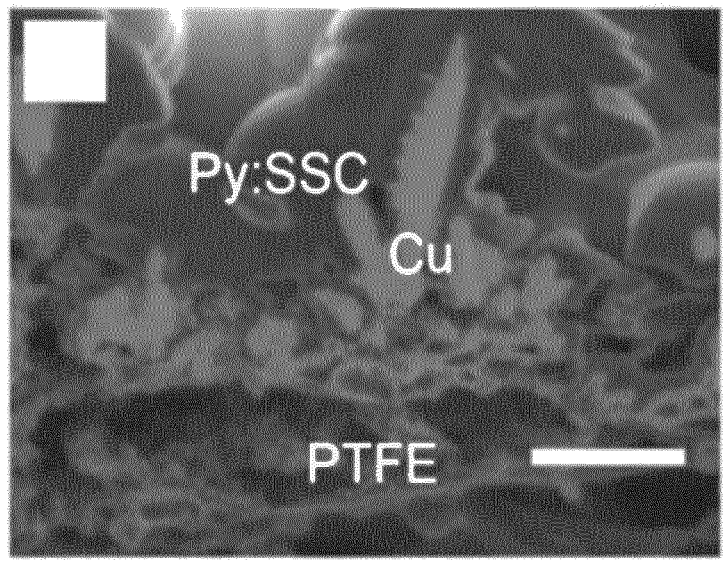
FIG. 14 is a (cross-sectional SEM image of the Cu:Py:SSC catalyst. The scale bar is 1 μm.
Figure 15:
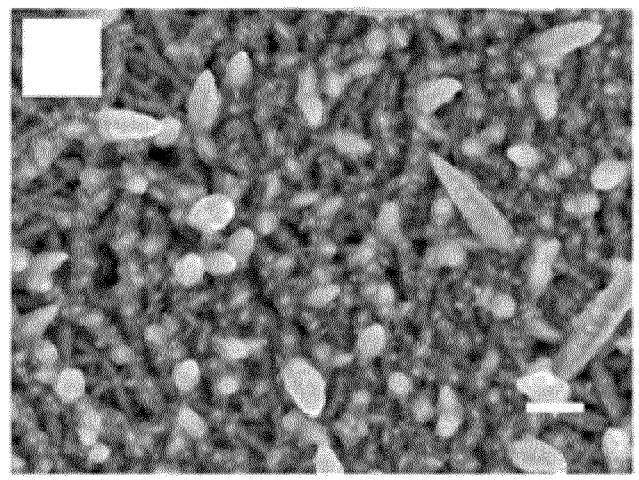
FIG. 15 is a SEM image of the Cu:Py:SSC catalysts. Scale bar is 1 μm.
Figure 16:
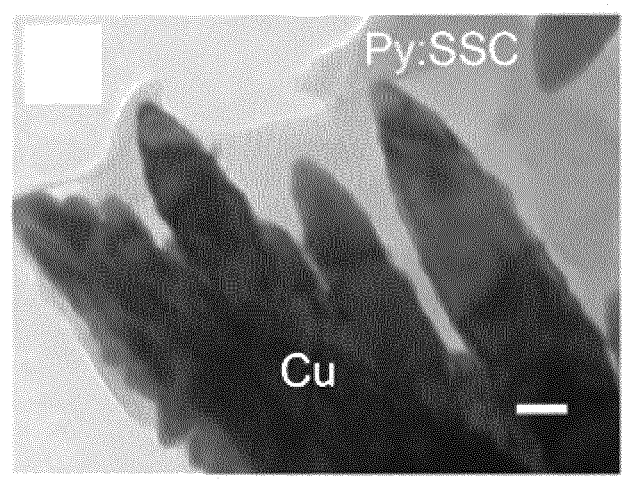
FIG. 16 is a TEM image of the Cu:Py:SSC catalysts. Scale bar is 50 nm.
Figure 17:
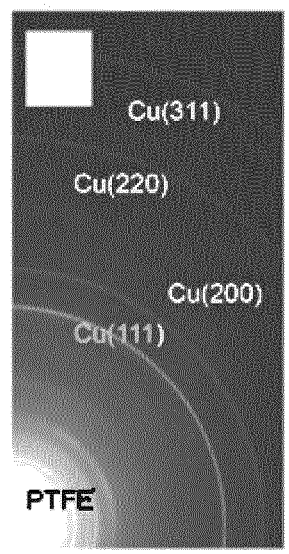
FIG. 17 relates to the crystallinity of the Cu:Py:SSC catalyst and shows a GIWAXS pattern of the Cu:Py:SSC combination.
Figure 18:
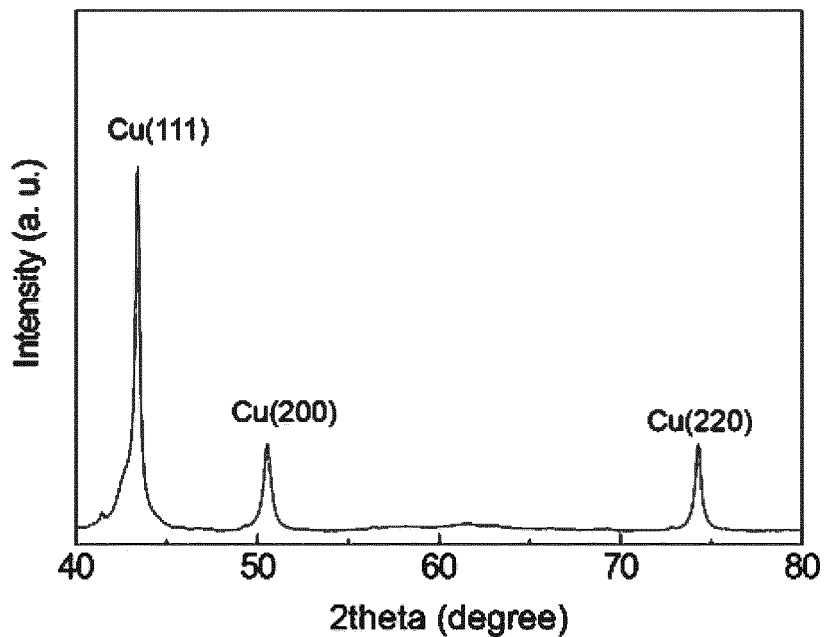
FIG. 18 relates to the crystallinity of the Cu:Py:SSC catalyst and shows a GIWAXS-derived 1D XRD profile of the Cu:Py:SSC combination.

To gain insight into the enhanced CO-to-$C_2H_4$ selectivity and productivity, the prepared catalysts were further studied using scanning and transmission electron microscopy (SEM and TEM, respectively). FIGS. 14, 15 and 16 show a dendritic Cu fully covered by the Py molecule and SSC ionomer. The Cu catalyst has high crystallinity, confirmed by the grazing-incidence wide-angle X-ray scattering (GI-WAXS) (FIGS. 17 and 18). The present techniques thus allow for full and homogeneous coverage of Py and SSC ionomer on the Cu surface.

Figure 19:
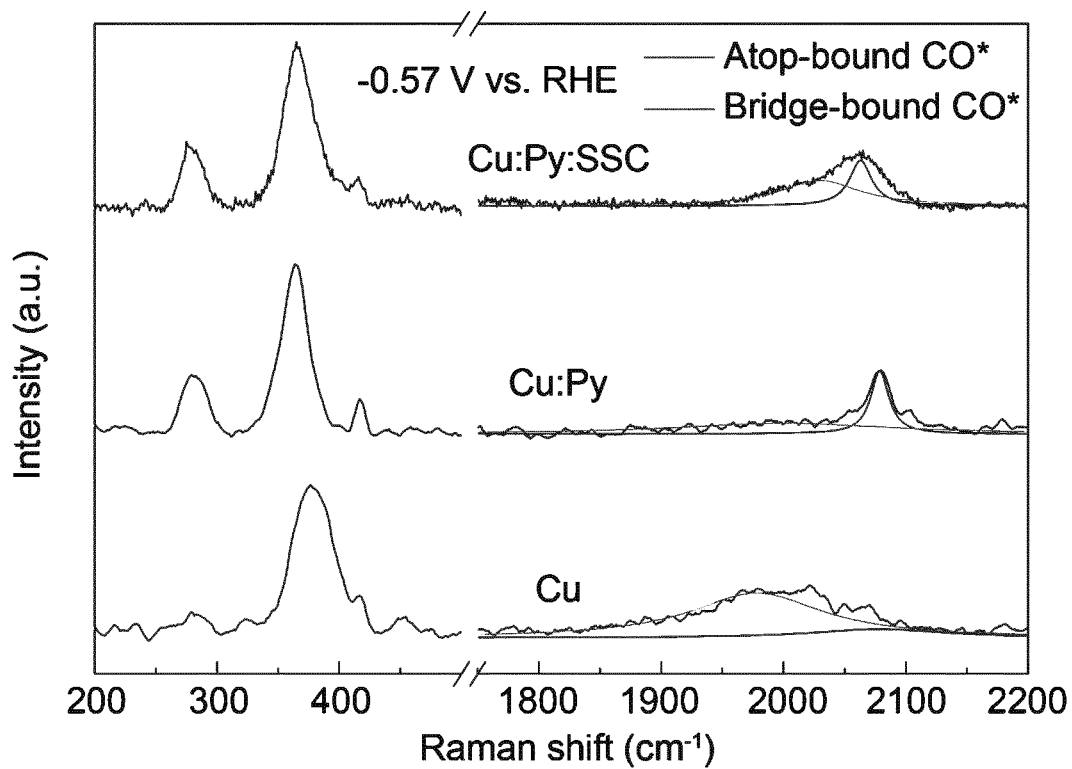
FIG. 19 is a graph of an Operando Raman spectrum obtained on Cu:Py:SSC, Cu:Py, and bare Cu at ~0.57 V vs. RHE. The bare Cu surface is predominated by the bridge-bound CO*. The modification of the Py molecule greatly increased the fraction of the atop-bound CO*. After SSC ionomer coating, large portion of atop-bound CO* was still seen, although the intensity of the bridge-bound CO* increased slightly.

Operando Raman spectroscopic studies were then conducted on the catalytic interface. A stabilized atop-bound CO* was observed, known to favour the key CO—CO dimerization step, evidenced by the transformation of CO* adsorption configurations (FIG. 19): the fraction of the area of atop-bound CO* at the wave number of ~2080 cm$^{-1}$ increased to 33% when Py molecule was electrodeposited onto the Cu surface. By contrast, bridge-bound CO* at 1980-2020 cm$^{-1}$ dominated the adsorption configurations on the bare Cu.

The MEA electrolyzer as encompassed herein thus includes a cathode comprising a layered structured catalyst improving diffusion of CO to an inner transition metal layer and stabilization of CO* intermediates to facilitate conversion into $C_2H_4$. The layered structured catalyst includes an inner transition metal layer, an intermediate organic layer and an outer ionomer layer.

The transition metal layer that is exemplified herein is a copper-based layer encompassing copper and alloys of copper such as copper-silica alloy, copper-aluminium alloy, or copper-silver alloy. However, the transition metal layer should not be limited to the copper-based layer, and the transition metal layer can include any transition metal or any alloy of a transition metal depending on the product of interest from CO reduction.

The organic layer that is exemplified herein is a N-arylpyridium-derived layer, e.g. a N-tolyl-tetrahydro-bi-pyridine (Py) layer. The organic layer is said to derive from N-arylpyridium because the N-arylpryridium is used a precursor that forms the N-tolyl-tetrahydro-bipyridine (Py) layer when subjected to reduction conditions. However, the organic layer that is encompassed herein is not limited to the N-arylpyridium-derived layer, and can be any polymeric film that is capable of lowering an activation barrier for carbon-carbon coupling.

The ionomer layer includes a cation-exchange ionomer having a hydrophobic backbone. The ionomer can further include hydrophilic side chains, that can be short side chains (SSC), to further facilitate the transport of CO. For example, the cation-exchange ionomer can be a perfluorosulfonic acid ionomer. For example, the SSC ionomer can be $(C_4HF_7O_4S \cdot C_2F_4)_x$; wherein x is an integer that is preferably 1.

The catalyst can be referred to as a layered structured catalyst which is defined by a multiple-layer structure formed by the inner transition metal layer, the intermediate organic layer and the outer ionomer layer. The layered structured catalyst has a porosity defined by the crystallinity of the inner transition metal layer, as the overall porosity remains substantially unchanged by the addition of the organic and ionomer layers. For example, the layered structured catalyst is prepared to obtain a porosity between 60% and 70%, which is a typical range of porosity for gas diffusion electrodes being used for CO reduction reaction, e.g. copper-based gas diffusion electrodes.

In some implementations, the inner transition metal layer can be made of a first sub-layer being sputtered onto a substrate of the cathode; and a second sub-layer being electrodeposited onto the first sub-layer. The thickness of the first sub-layer can be about 150 nm as determined by transmission electron microscopy and electrodeposition of the second sub-layer should result in a growth of a dendritic structure of the first sub-layer. With preference, thickness of the first sub-layer is between 100 and 200 nm as determined by transmission electron microscopy; preferably between 120 and 180 nm; more preferably about 150 nm. For example, thickness of the second sub-layer is between 150 and 500 nm as determined by transmission electron microscopy; preferably, between 200 and 450 nm; more preferably, between 250 and 400 nm. For example, the inner transition metal layer has a thickness that includes both the first sub-layer and the second sub-layer and that is between 250 and 700 nm as determined by transmission electron microscopy; preferably from 300 to 600 nm.

The intermediate organic layer and the outer ionomer layer can form a continuous film on a surface of the inner transition metal layer throughout the gas diffusion electrode (confirmed by the scanning electron microscopy (SEM) and transmission electron microscopy (TEM) imaging). In some implementations, the outer ionomer layer has a thickness that can be between 10 nm and 15 nm as determined by transmission electron microscopy, and the intermediate organic film has a thickness that can be between 10 nm and 20 nm as determined by transmission electron microscopy.

Each layer of the cathode is selected carefully such that the combination of the layers in the multiple-layer structure of the MEA cathode contributes to enhancing selectivity and production rates towards $C_2H_4$. The outer ionomer layer facilitates diffusion of CO to active sites of the inner transition metal layer, and the intermediate organic layer facilitates stabilization of formed atop-bound CO* intermediates for conversion into ethylene ($C_2H_4$). It should be noted that operation of the MEA can result in a atop:bridge CO* intermediates ratio of about 50%.

As one skilled in the art will readily understand, the MEA further includes an anode; an anion-exchange membrane (AEM) to separate the cathode from the anode; an anolyte; a reactant inlet in fluid communication with the cathode to provide a CO-enriched gas component; and a product outlet in fluid communication with the cathode to release the product mixture comprising $C_2H_4$. For example, for experimentation purpose, the AEM that was used is a 4×4 $cm^{-2}$, Fumasep FAA-3-50, from FuMA-Tech GmbH. Further examples of the anode and the anolyte are provided herein, in particular in the Supplemental Information section.

With preference, the MEA is a catholyte-free electrolyser; with preference, the MEA is a zero-gap electrolyser. In the zero-gap electrolyser, the cathode catalyst and the anode catalysts are both in contact with the anion-exchange membrane Following operation of the MEA, the product mixture that is recovered at the cathode can include gas products comprising $C_2H_4$, $H_2$, $CH_4$, and unreacted CO; and liquid products comprising ethanol, propanol, and acetate.

Performance of the MEA can be further enhanced by adjusting at least one of the inlet flow rate of the CO-enriched component, the applied current density and the alkalinity of anolyte. The anolyte can be a solution containing at least one of KOH, $KHCO_3$, $K_2SO_4$, and NaOH.

Figure 20:
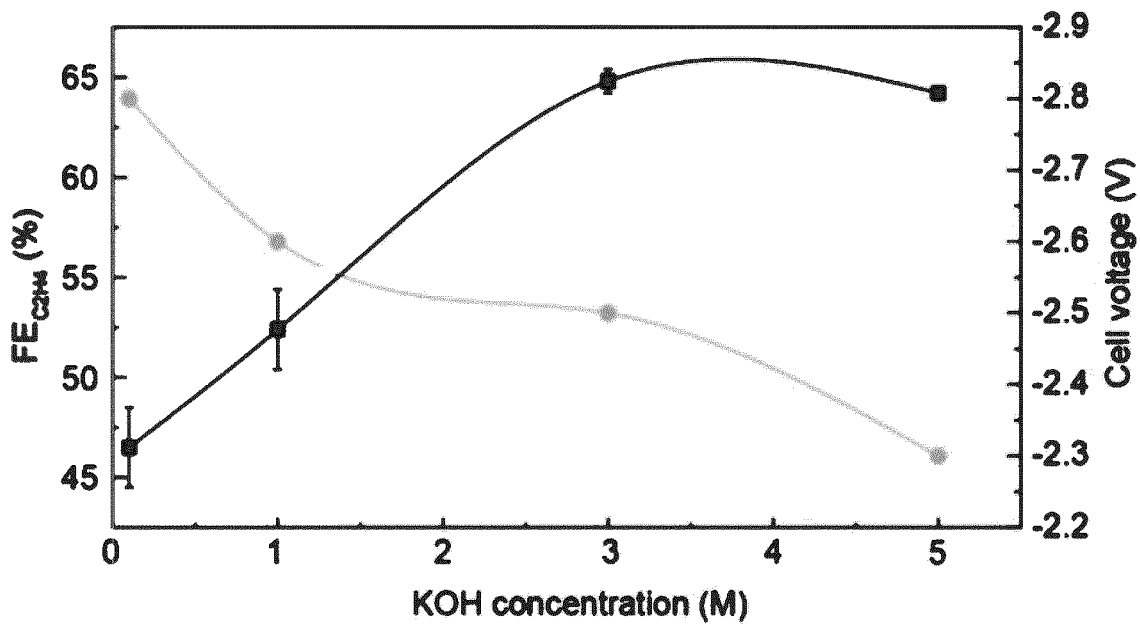
FIG. 20 shows CO-to-$C_2H_4$ electroreduction in an MEA with the evolution of the $C_2H_4$ FE (primary y-axis, black curve) and full-cell voltages (secondary y-axis, grey curve) in different anolytes.
Figure 21:
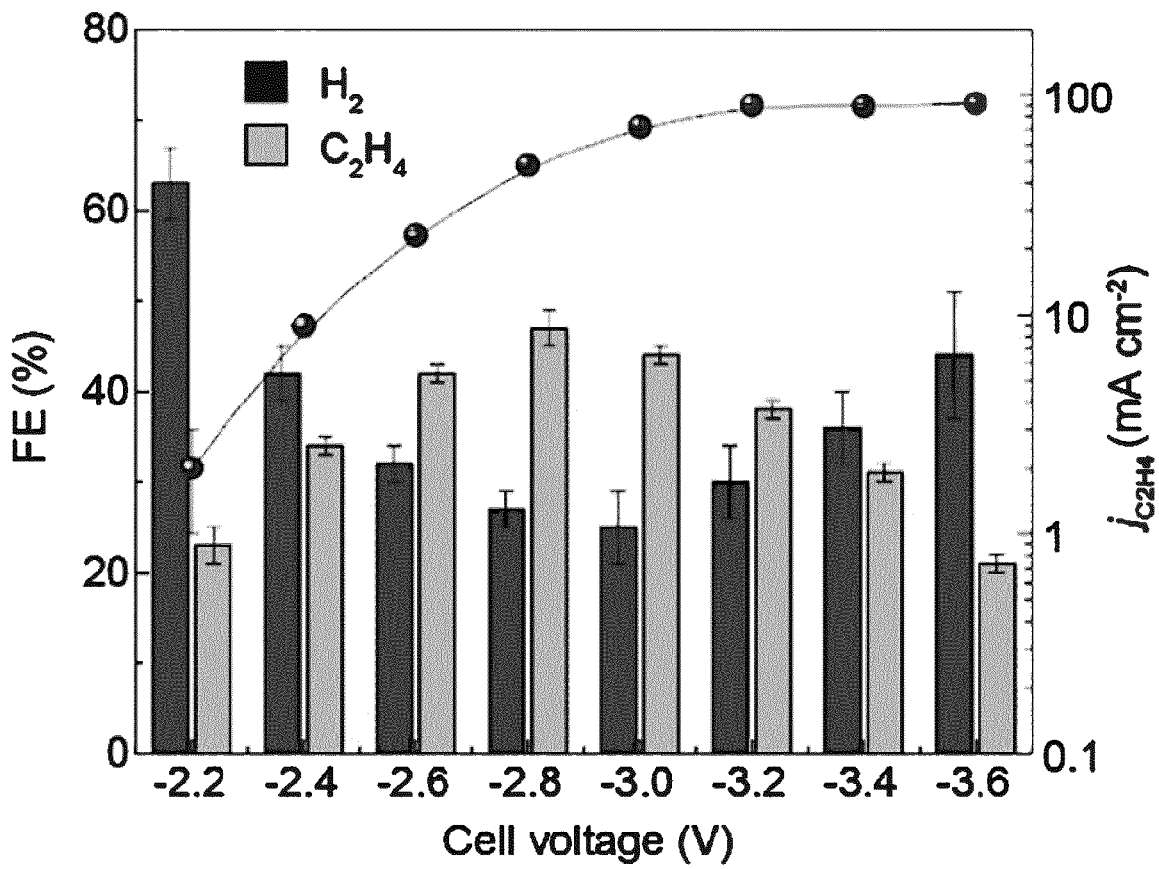
FIG. 21 shows the $C_2H_4$ FE and partial current density of MEAs using the Cu:Py:SSC cathode according to cell voltage. The anolyte is 0.1 M KOH. Error bars correspond to the standard deviation of 3 independent measurements.
Figure 22:
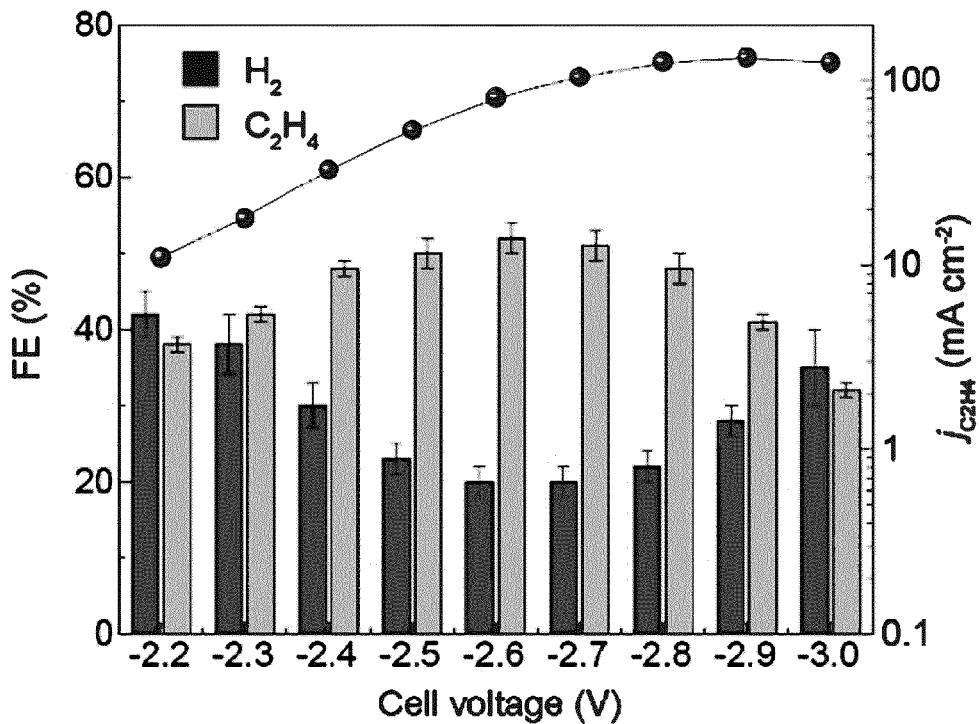
FIG. 22 shows the $C_2H_4$ FE and partial current density of MEAs using the Cu:Py:SSC cathode according to cell voltage. The anolyte is 1 M KOH. Error bars correspond to the standard deviation of 3 independent measurements.
Figure 23:
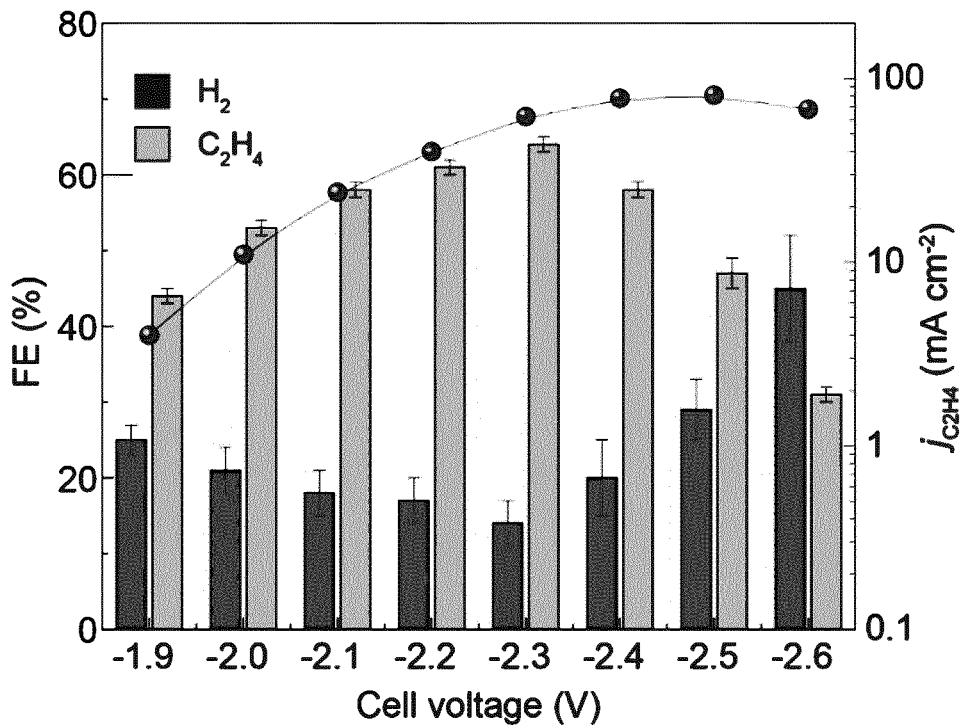
FIG. 23 is a graph of the $C_2H_4$ FE and partial current density of an MEA using the Cu:Py:SSC cathode and 5 M KOH anolyte according to cell voltage. Error bars correspond to the standard deviation of 3 independent measurements.
Figure 24:
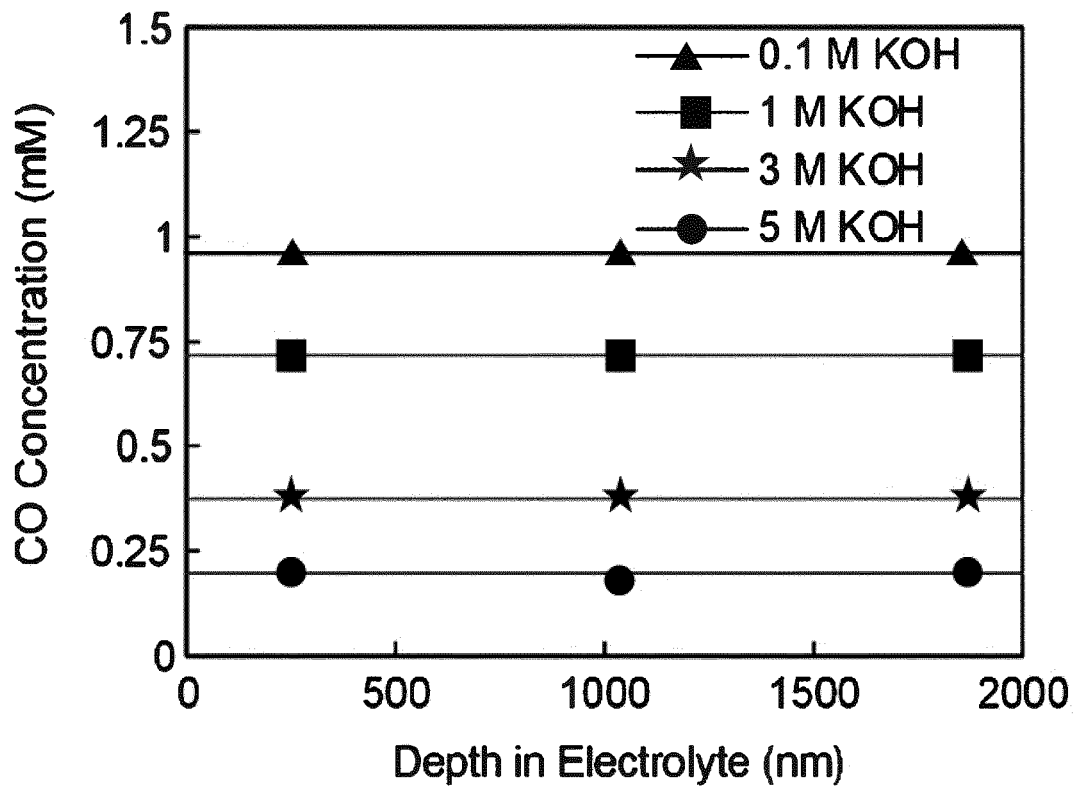
FIG. 24 relates to CO diffusion modelling with CO concentrations at various depths in different KOH concentrations. The current density is 0 mA cm$^{-2}$.
Figure 25:
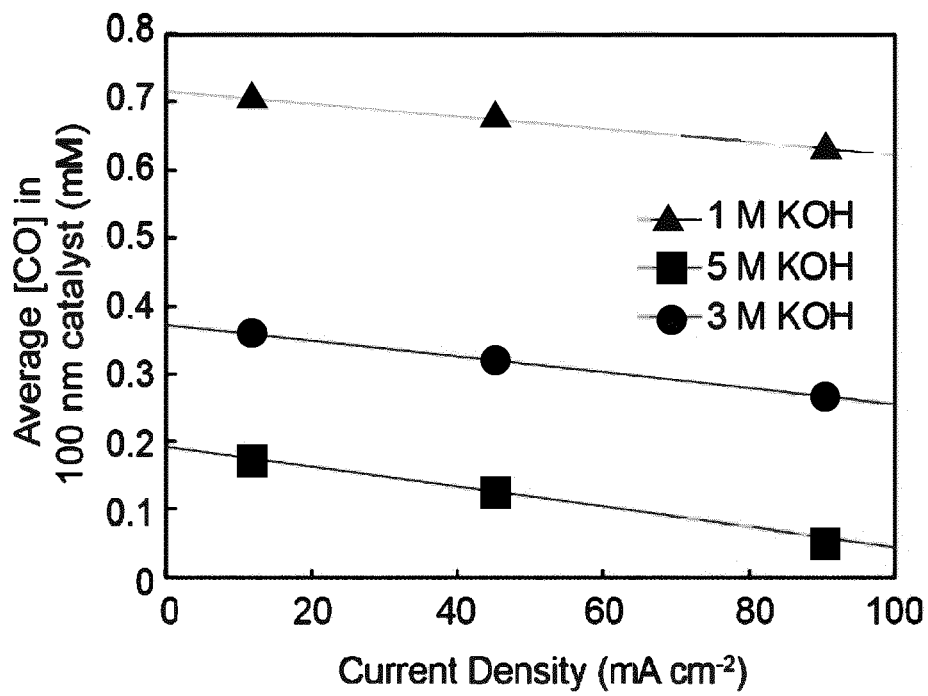
FIG. 25 relates to CO diffusion modelling with CO concentrations in different KOH concentrations at various applied current densities.

For example, the full-cell EE of the MEA can be optimized by increasing the alkalinity of the anolyte (FIG. 20 and tables 4, 5 and 6). With increasing KOH concentration, the $C_2H_4$ FE peak was observed to increase to ~65% (FIG. 20), an example of alkalinity favouring $C_{2+}$ production. The ionic conductivity was also improved by high alkalinity, and the $j_{C2H4}$ at each $C_2H_4$ FE peak increased from ~47 to ~100 mA $cm^{-2}$, and the full-cell potential reduced from 2.8 to 2.5 V in the range of 0.1 to 3 M KOH (figures 20, 21 and 21 and tables 3, 4 and 5). However, 5 M KOH lowered the $j_{C2H4}$ to 81 mA $cm^{-2}$ at all applied potentials (FIG. 23 and table 6), which can be attributed to a low CO concentration at the catalyst layer under this condition (FIGS. 24 and 25). Considering $C_2H_4$ FE, $j_{C2H4}$, and full-cell potential, the 3 M KOH appeared to be an optimized anolyte for CO-to-$C_2H_4$ conversion in the experimental system.

TABLE 4

The CORR-to-$C_2H_4$ performance of the Cu:Py:SSC catalyst using 0.1M KOH anolyte. Error bars correspond to the standard deviation of 3 independent measurements.

| Full cell potential (V) | j (mA $cm^{-2}$) | Faradaic efficiency (%) | | | $j_{C2H4}$ (mA $cm^{-2}$) | Energy efficiency (%) |
|---|---|---|---|---|---|---|
| | | $H_2$ | $CH_4$ | $C_2H_4$ | | |
| -2.2 | 9 ± 1 | 63 ± 4 | 1 | 23 ± 2 | 2 ± 1 | 11 ± 1 |
| -2.4 | 26 ± 1 | 42 ± 3 | 0.3 ± 0.1 | 34 ± 1 | 9 ± 1 | 15 ± 1 |

TABLE 4-continued

The CORR-to-$C_2H_4$ performance of the Cu:Py:SSC catalyst using 0.1M KOH anolyte. Error bars correspond to the standard deviation of 3 independent measurements.

| Full cell potential (V) | j (mA $cm^{-2}$) | Faradaic efficiency (%) | | | $j_{C2H4}$ (mA $cm^{-2}$) | Energy efficiency (%) |
|---|---|---|---|---|---|---|
| | | $H_2$ | $CH_4$ | $C_2H_4$ | | |
| -2.6 | 56 ± 2 | 32 ± 2 | 0.6 ± 0.1 | 42 ± 1 | 23 ± 1 | 17 ± 1 |
| -2.8 | 104 ± 2 | 27 ± 2 | 1 | 47 ± 2 | 48 ± 1 | 18 ± 1 |
| -3.0 | 163 ± 3 | 25 ± 4 | 2 ± 1 | 44 ± 1 | 72 ± 1 | 16 ± 1 |
| -3.2 | 235 ± 5 | 30 ± 4 | 3 ± 1 | 38 ± 1 | 90 ± 1 | 13 ± 1 |
| -3.4 | 287 ± 5 | 36 ± 4 | 4 ± 1 | 31 ± 1 | 89 ± 2 | 10 |
| -3.6 | 416 ± 16 | 44 ± 7 | 4 ± 1 | 21 ± 1 | 92 ± 6 | 6 |

Operating conditions:
anolyte flow rate: 20 mL/min;
CO flow rate: 80 sccm; and
cell temperature: 25° C.

TABLE 5

The CORR-to-$C_2H_4$ performance of the Cu:Py:SSC catalyst using 1M KOH anolyte. Error bars correspond to the standard deviation of 3 independent measurements.

| Full cell potential (V) | j (mA $cm^{-2}$) | Faradaic efficiency (%) | | | $j_{C2H4}$ (mA $cm^{-2}$) | Energy efficiency (%) |
|---|---|---|---|---|---|---|
| | | $H_2$ | $CH_4$ | $C_2H_4$ | | |
| -2.2 | 29 ± 1 | 42 ± 3 | 0.3 | 38 ± 1 | 11 ± 1 | 18 |
| -2.3 | 43 ± 1 | 38 ± 4 | 0.2 | 42 ± 1 | 18 ± 1 | 19 ± 1 |
| -2.4 | 69 ± 2 | 30 ± 3 | 0.2 | 48 ± 1 | 33 ± 2 | 21 ± 1 |
| -2.5 | 108 ± 2 | 23 ± 2 | 0.4 | 50 ± 2 | 54 ± 3 | 21 ± 1 |
| -2.6 | 155 ± 3 | 20 ± 2 | 1 | 52 ± 2 | 81 ± 4 | 21 ± 1 |
| -2.7 | 206 ± 4 | 20 ± 2 | 1 | 51 ± 2 | 105 ± 5 | 20 ± 1 |
| -2.8 | 262 ± 6 | 22 ± 2 | 1 | 48 ± 2 | 127 ± 7 | 18 ± 1 |
| -2.9 | 329 ± 7 | 28 ± 2 | 2 ± 1 | 41 ± 1 | 134 ± 6 | 15 |
| -3.0 | 398 ± 6 | 35 ± 5 | 3 ± 1 | 32 ± 1 | 126 ± 7 | 11 ± 1 |

Operating conditions:
anolyte flow rate: 20 mL/min;
CO flow rate: 80 sccm; and
cell temperature: 25° C.

TABLE 6

The CORR-to-$C_2H_4$ performance of the Cu:Py:SSC catalyst using 5M KOH anolyte. Error bars correspond to the standard deviation of 3 independent measurements.

| Full cell potential (V) | j (mA $cm^{-2}$) | Faradaic efficiency (%) | | | $j_{C2H4}$ (mA $cm^{-2}$) | Energy efficiency (%) |
|---|---|---|---|---|---|---|
| | | $H_2$ | $CH_4$ | $C_2H_4$ | | |
| -1.9 | 9 ± 1 | 25 ± 2 | 0.7 | 44 ± 1 | 4 | 25 ± 1 |
| -2.0 | 21 ± 1 | 21 ± 3 | 0.3 | 53 ± 1 | 11 ± 1 | 28 ± 1 |
| -2.1 | 42 ± 3 | 18 ± 3 | 0.2 | 58 ± 1 | 24 ± 2 | 29 ± 1 |
| -2.2 | 66 ± 4 | 17 ± 3 | 0.2 | 61 ± 1 | 40 ± 2 | 29 ± 1 |
| -2.3 | 96 ± 2 | 14 ± 3 | 0.1 | 64 ± 1 | 62 ± 1 | 30 ± 1 |
| -2.4 | 135 ± 3 | 20 ± 5 | 0.2 | 58 ± 1 | 78 ± 1 | 26 ± 1 |
| -2.5 | 174 ± 4 | 29 ± 4 | 0.4 | 47 ± 2 | 81 ± 1 | 20 ± 1 |
| -2.6 | 218 ± 4 | 45 ± 7 | 2 | 31 ± 1 | 68 ± 1 | 14 ± 1 |

Operating conditions:
anolyte flow rate: 20 mL/min;
CO flow rate: 80 sccm; and
cell temperature: 25° C.

Figure 26:
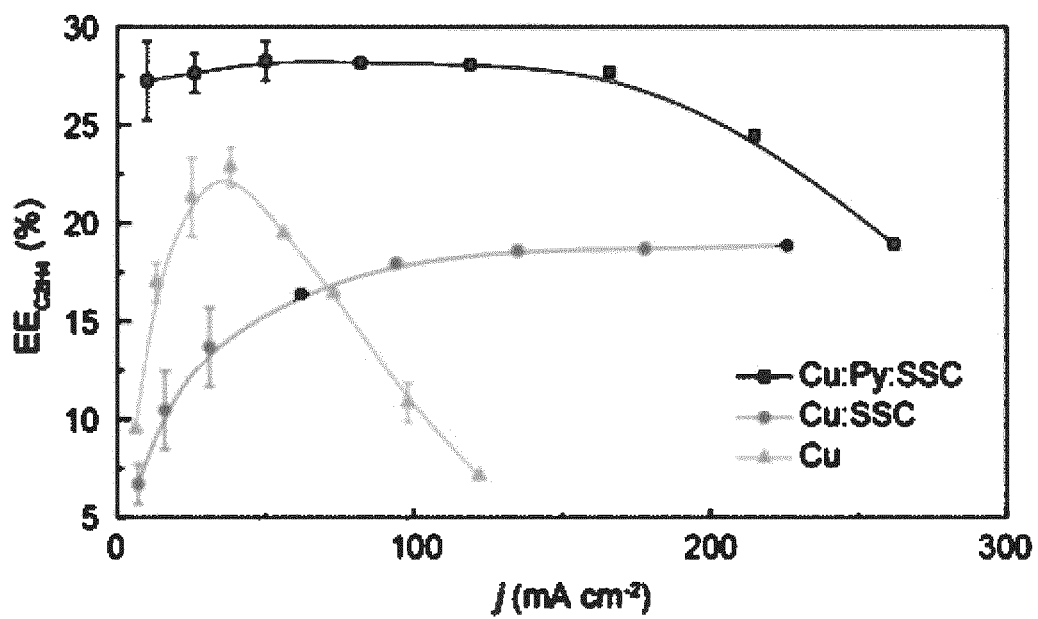
FIG. 26 shows the comparison of the CO-to-$C_2H_4$ EE obtained using the Cu:Py:SSC catalyst and controls in MEAs with 3 M KOH.
Figure 27:
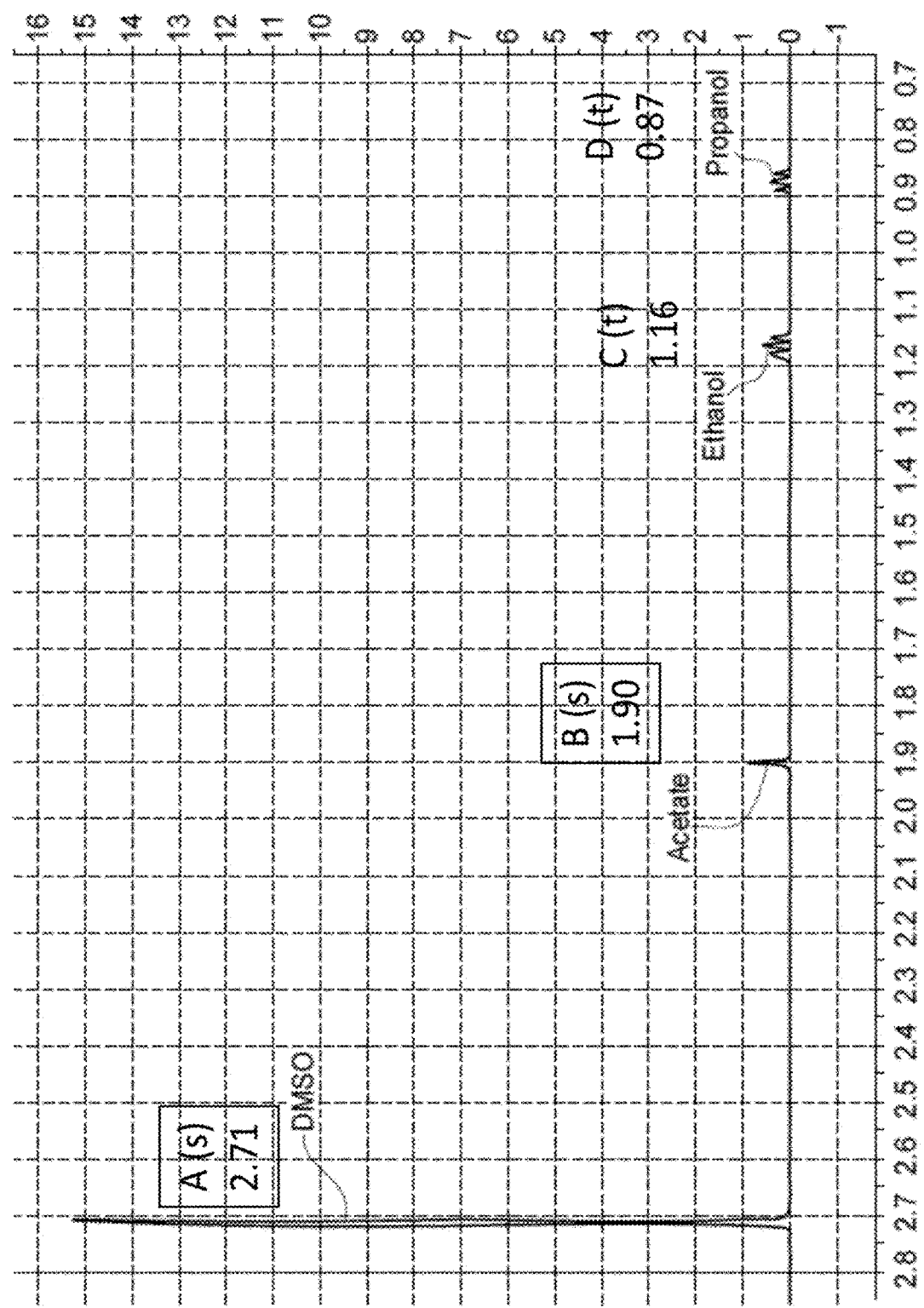
FIG. 27 is representative of $^1$H NMR spectra of the CORR liquid products at 160 mA cm$^{-2}$ with a representative of the CORR liquid products (acetate, ethanol and propanol) collected from the anodic liquid stream (the CORR products crossed over to the anodic stream through the AEM).
Figure 28:
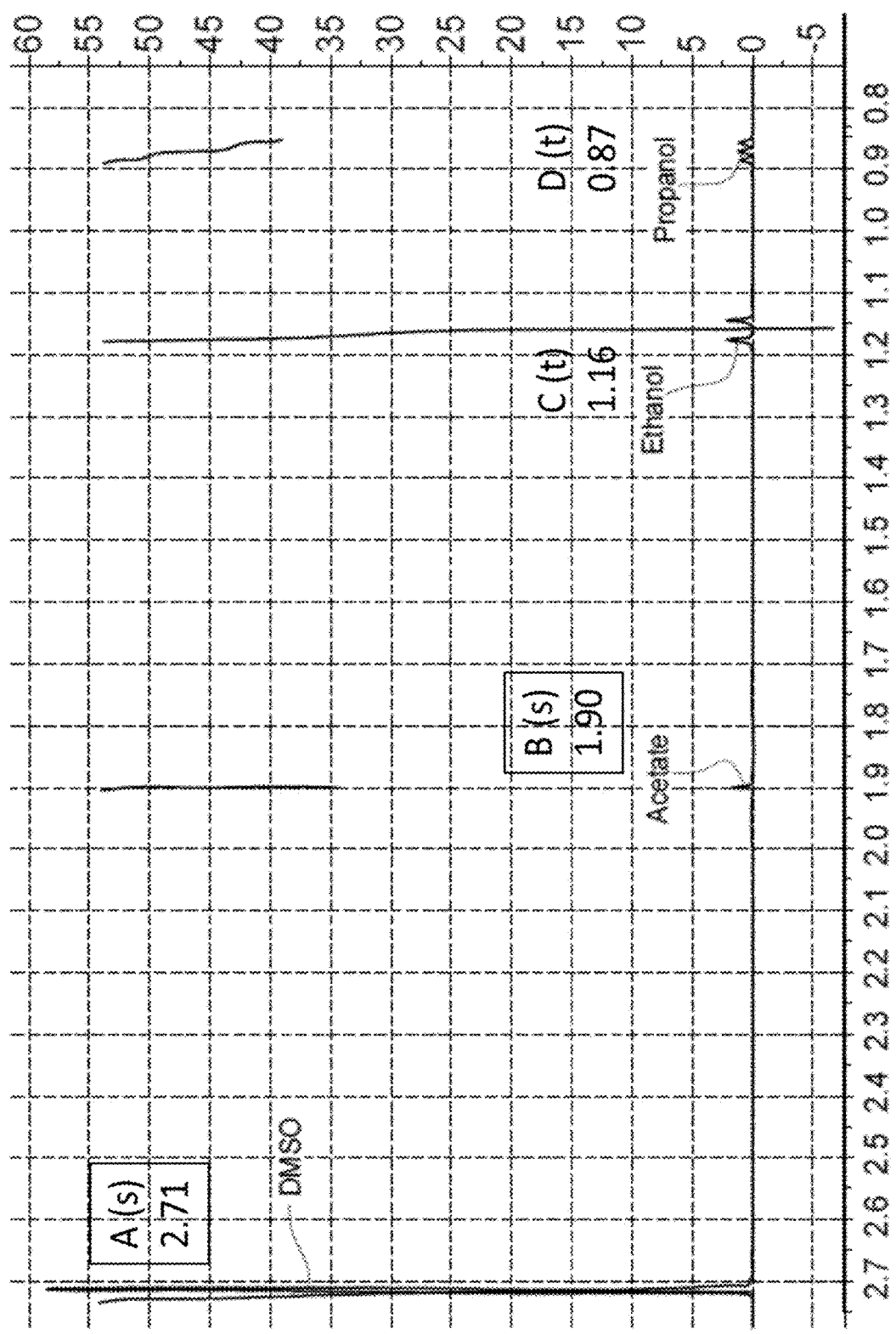
FIG. 28 is representative of $^1$H NMR spectra of the CORR liquid products at 160 mA cm$^{-2}$ with a representative of the CORR liquid products collected from the cathodic liquid stream (acetate, ethanol and propanol).

Further comparisons in 3 M KOH revealed that the Cu:Py:SSC combination outperformed the Cu:SSC and bare Cu in terms of both $j_{C2H4}$ and $C_2H_4$ full-cell EE (FIG. 26). Importantly, when compared to bare Cu, a more than four times (>4x) increase in $j_{C2H4}$ and 5% higher full-cell EE can be achieved by using the presently described layered structured catalyst, e.g. a Cu:Py:SSC combination. Typical CORR gas and liquid products were observed in the current density range of 25 to 250 mA cm$^{-2}$, with the peak C$_2$+FE of ~85% at 160 mA cm$^{-2}$ (table 7 and FIGS. 27-28). A stable 28% C$_2$H$_4$ full-cell EE of the Cu:Py:SSC combination was achieved in the current density range of 80 to 170 mA cm$^{-2}$, whereas the Cu:SSC and bare Cu systems were limited to lower energy efficiencies (EE) and current densities (FIG. 26).

TABLE 7

The CORR product distribution of the Cu:Py:SSC catalyst.

| Full cell potential (V) | j (mA cm$^{-2}$) | Faradaic efficiency (%) | | | | | |
|---|---|---|---|---|---|---|---|
| | | H$_2$ | CH$_4$ | C$_2$H$_4$ | EtOH | Acetate | Propanol | Total |
| −2.1 | 25  | 32.2 | 0.4 | 53.9 | 4.4 | 6.3  | 4.5 | 101.7 |
| −2.3 | 80  | 21.4 | 0.1 | 62.9 | 6.3 | 8.4  | 2.1 | 101.2 |
| −2.5 | 160 | 13.6 | 0.3 | 66.2 | 5.7 | 10.9 | 1.8 | 98.5  |
| −2.7 | 250 | 28.9 | 1.9 | 49.3 | 4.9 | 11.9 | 1.7 | 98.6  |

Operating conditions:

anolyte: 3M KOH;

anolyte flow rate: 20 mL/min;

flow rate: 80 sccm; and cell temperature: 25° C.

It should be noted that further optimization of the CO coverage on the Cu:Py:SSC catalyst can be achieved—e.g. through co-feeding CO with N$_2$—and improved the C$_2$H$_4$ full cell EE to 30±1% at a constant current density of 100 mA cm$^{-2}$ (table 8).

TABLE 8

The CORR-to-C$_2$H$_4$ performance of the Cu:Py:SSC catalyst at 100 mA cm$^{-2}$ under various CO partial pressures. Error bars correspond to the standard deviation of 3 independent measurements.

| P$_{CO}$/(P$_{N2}$ + P$_{CO}$) (%) | Full cell potential (V) | Faradaic efficiency (%) | | | j$_{C2H4}$ (mA cm$^{-2}$) | Energy efficiency (%) |
|---|---|---|---|---|---|---|
| | | H$_2$ | CH$_4$ | C$_2$H$_4$ | | |
| 100 | −2.32 | 14 ± 1 | 0.1 | 60 ± 2 | 60 ± 2 | 27.5 ± 1 |
| 80  | −2.33 | 15 ± 2 | 0.1 | 61 ± 2 | 61 ± 2 | 27.5 ± 0.5 |
| 60  | −2.34 | 16 ± 2 | 0.1 | 62 ± 2 | 62 ± 2 | 27.5 ± 0.5 |
| 40  | −2.35 | 16 ± 2 | 0.2 | 63 ± 2 | 64 ± 2 | 28.5 ± 1 |
| 30  | −2.36 | 16 ± 2 | 0.2 | 65 ± 2 | 66 ± 2 | 30 ± 1 |
| 20  | −2.37 | 19 ± 2 | 0.3 | 61 ± 3 | 62 ± 3 | 28 ± 1 |
| 10  | −2.38 | 23 ± 3 | 0.3 | 57 ± 3 | 57 ± 3 | 25.5 ± 1 |

Operating conditions:

anolyte: 3M KOH;

anolyte flow rate: 20 mL/min;

flow rate (CO + N$_2$): 80 sccm; and cell temperature: 25° C.

Figure 29:
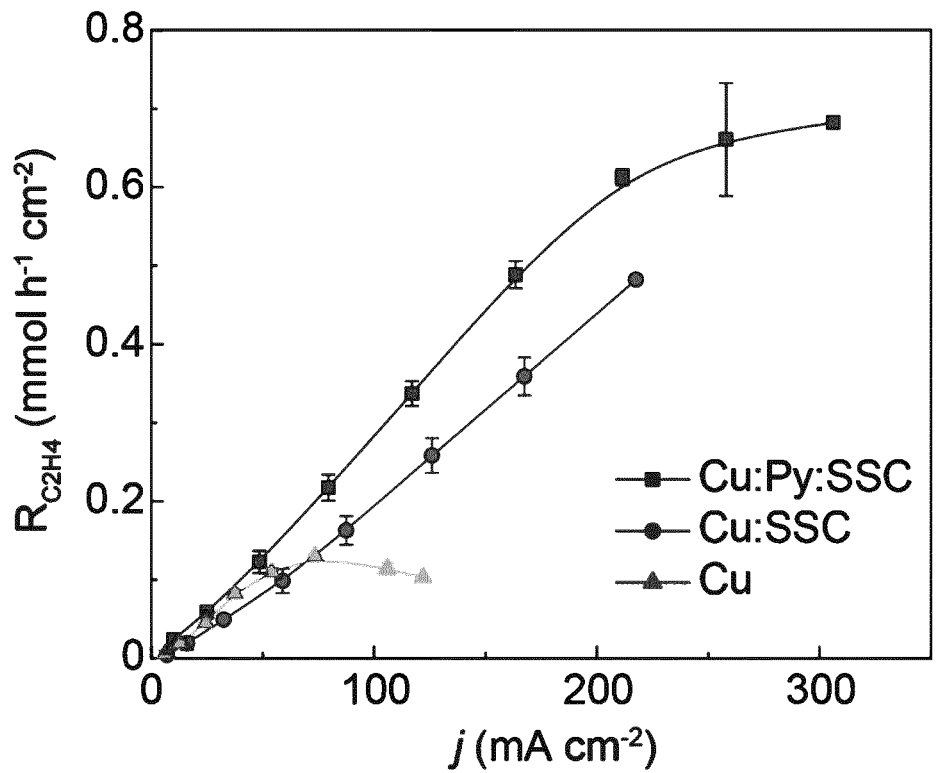
FIG. 29 is a graph comparing $C_2H_4$ production rates obtained using different cathodes in MEAs with 3 M KOH according to partial current density. Error bars correspond to the standard deviation of 3 independent measurements.
Figure 30:
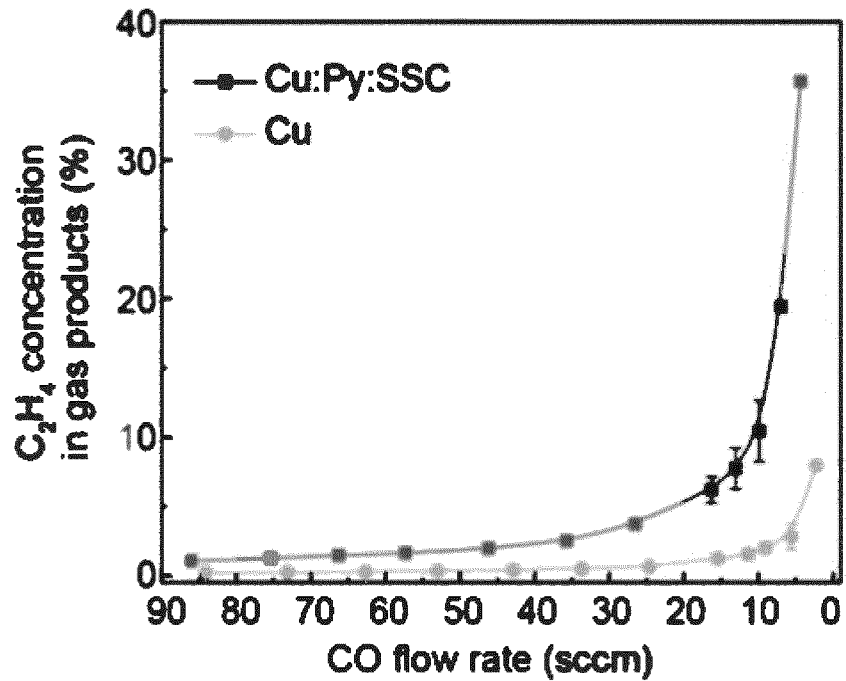
FIG. 30 shows the comparison of the $C_2H_4$ concentration obtained using the Cu:Py:SSC catalyst and controls in MEAs with 3 M KOH.

C$_2$H$_4$ production rate (R$_{C2H4}$) and its concentration in the product stream was further experimentally investigated. FIG. 29 shows that the Cu:Py:SSC combination produced C$_2$H$_4$ at almost 0.68 mmol cm$^{-2}$ h$^{-1}$ and 1.5 and 6 times faster than the Cu:SSC and bare Cu, respectively. Using an inlet CO flow rate of 4 sccm, a ~36% C$_2$H$_4$ concentration in gas products was obtained (FIG. 30 and table 9). This translated to a ~26% CO-to-C$_2$H$_4$ single-pass conversion and is ~3 times higher than that of bare Cu. In other words, the present MEA can allow at least 25% of the CO supplied to the MEA to produce ethylene (C$_2$H$_4$) when the CO inlet flowrate is between 3 sccm and 4 sccm.

TABLE 9

A summary of C$_2$H$_4$ production at various CO flow rates. The Cu:Py:SSC was tested at 160 mA cm$^{-2}$ and bare Cu was tested at 40 mA cm$^{-2}$, respectively, to ensure the highest C$_2$H$_4$ FE was achieved for each sample during the test.

| Cu:Py:SSC (at 160 mA cm$^{-2}$) | | | Bare Cu (at 40 mA cm$^{-2}$) | | |
|---|---|---|---|---|---|
| CO flow rate (s.c.c.m.) | C$_2$H$_4$ FE (%) | C$_2$H$_4$ concentration (%) | CO flow rate (s.c.c.m.) | C$_2$H$_4$ FE (%) | C$_2$H$_4$ concentration (%) |
| 86 | 62 ± 1 | 1.1    | 84 | 46 ± 5 | 0.2 |
| 75 | 62 ± 1 | 1.3    | 73 | 48 ± 6 | 0.3 |
| 66 | 61 ± 1 | 1.5    | 63 | 47 ± 4 | 0.3 |
| 57 | 61 ± 2 | 1.7    | 53 | 47 ± 4 | 0.4 |
| 46 | 60 ± 3 | 2.1    | 43 | 44 ± 3 | 0.4 |
| 36 | 59 ± 5 | 2.7    | 34 | 42 ± 2 | 0.5 |
| 27 | 58 ± 5 | 3.8    | 25 | 40 ± 3 | 0.8 |
| 16 | 54 ± 6 | 7.2 ± 1 | 16 | 33 ± 1 | 1.6 |
| 13 | 48 ± 4 | 9.2 ± 2 | 11 | 30 ± 1 | 1.9 |
| 10 | 43 ± 8 | 12.6 ± 3 | 9 | 32 ± 1 | 2.4 |
| 7  | 43 ± 1 | 19.4   | 6  | 28 ± 7 | 3.7 ± 1 |
| 4  | 41 ± 1 | 35.7   | 2  | 26 ± 1 | 8.0 |

Operating conditions:

anolyte flow rate: 20 mL/min;

temperature: 25° C.

Figure 31:
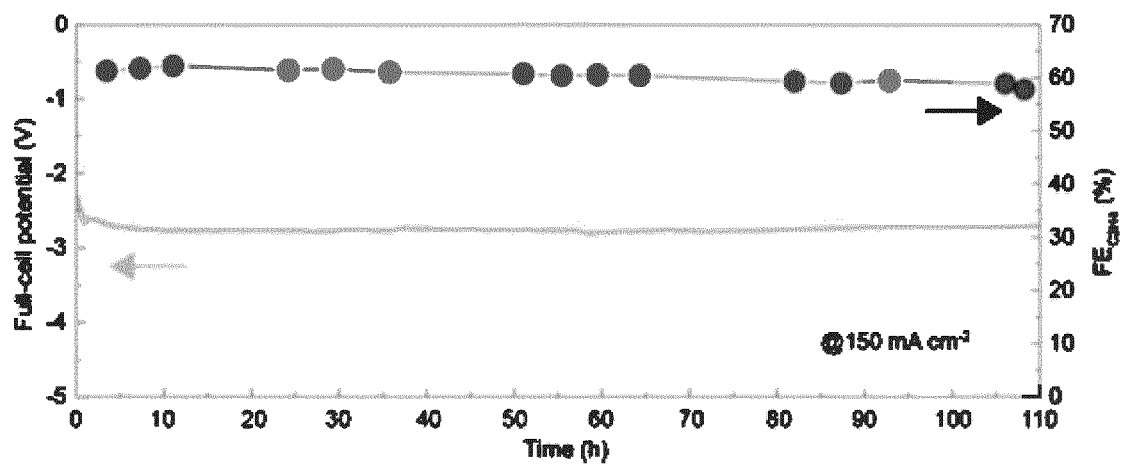
FIG. 31 shows $C_2H_4$ FE and full-cell voltage of the MEA equipped with a Cu:Py:SSC cathode for 110 hours at 150 mA cm$^{-2}$.
Figure 32:
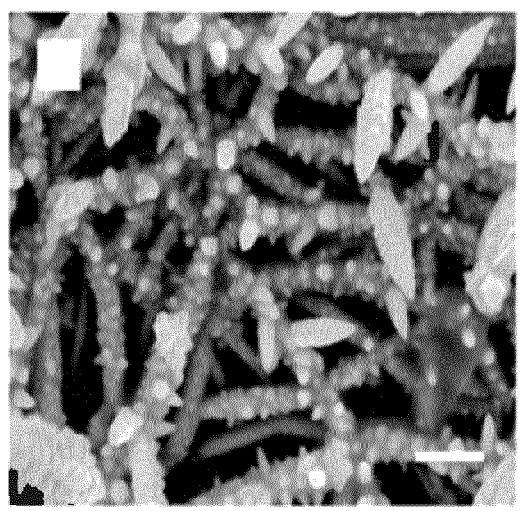
FIG. 32 is a SEM image of the Cu:Py:SSC cathode after 110-hour CORR operation. The scale bar is 1 μm.
Figure 33:
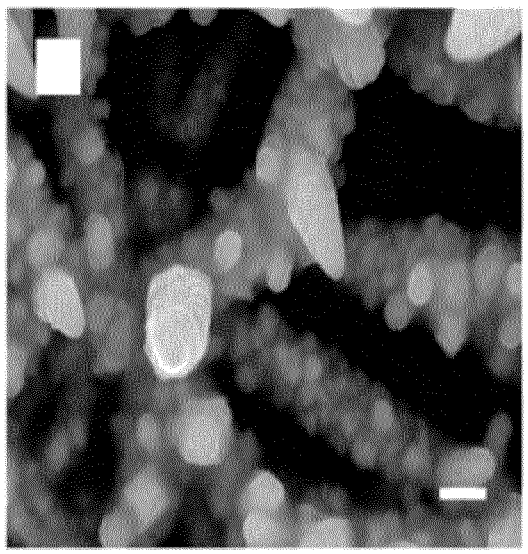
FIG. 33 is a SEM image of the Cu:Py:SSC cathode after 110-hour CORR operation. The scale bar is 200 nm.
Figure 34:
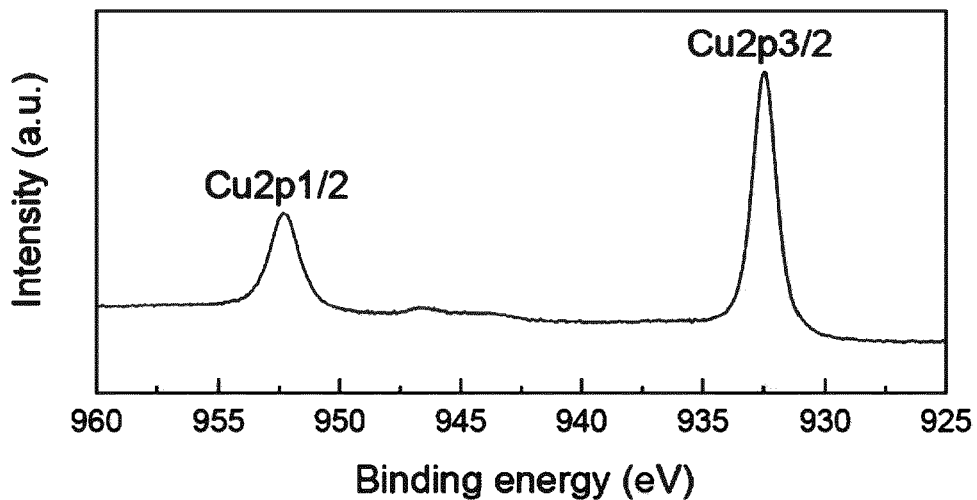
FIG. 34 relates to XPS analyses, showing the Cu2p XPS of the as-made Cu:Py:SSC cathode.
Figure 35:
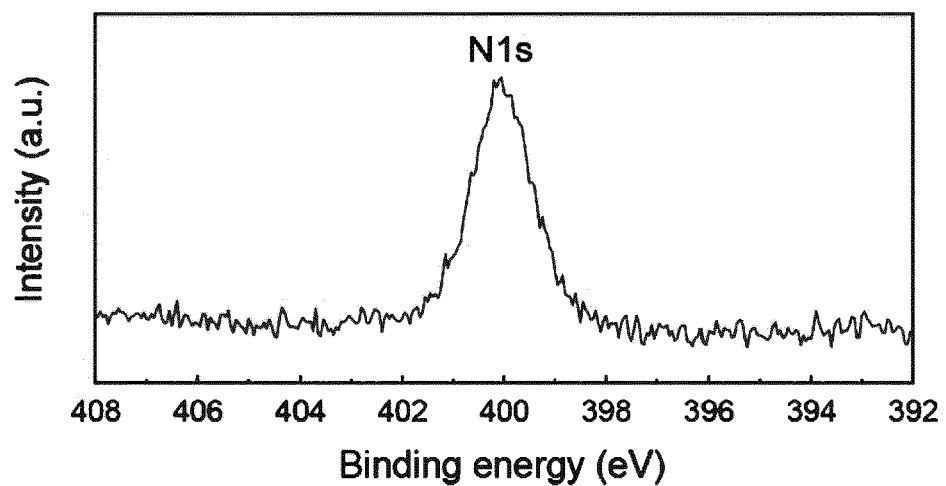
FIG. 35 relates to XPS analyses, showing the N1s XPS of the as-made Cu:Py:SSC cathode. The N1s peak indicates the existence of Py molecule on the Cu surface FIG. 36 relates to XPS analyses, showing the N1s XPS of the same electrode after 110-hour CORR operation. After 110-hour CORR operation, the Py molecule was still clearly seen as identified by the N1s peak.
Figure 36:
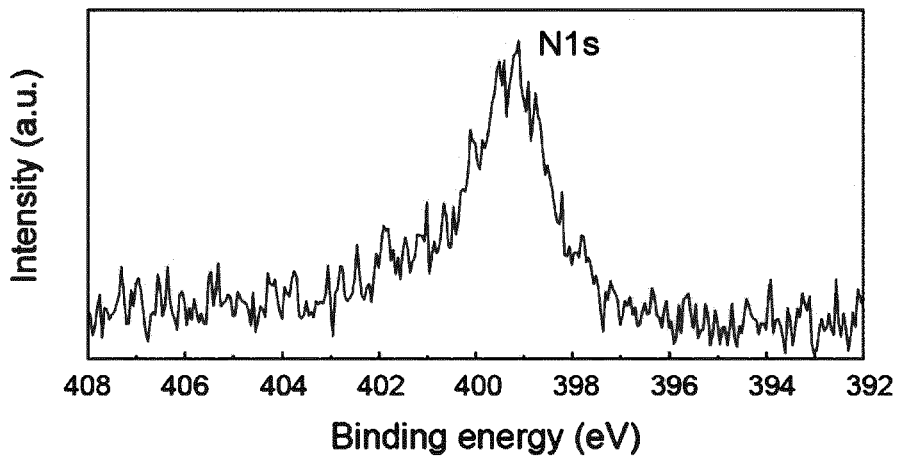
Figure 37:
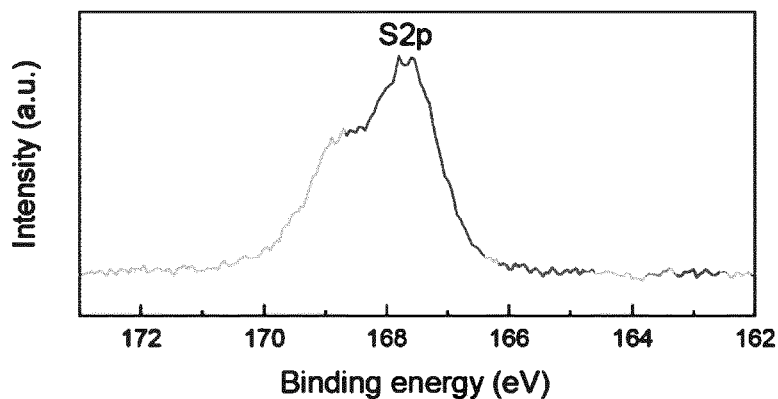
FIG. 37 relates to XPS analyses, showing the S2p XPS of the as-made Cu:Py:SSC cathode. The S2p peak indicates the existence of SSC ionomer on the Cu surface.
Figure 38:
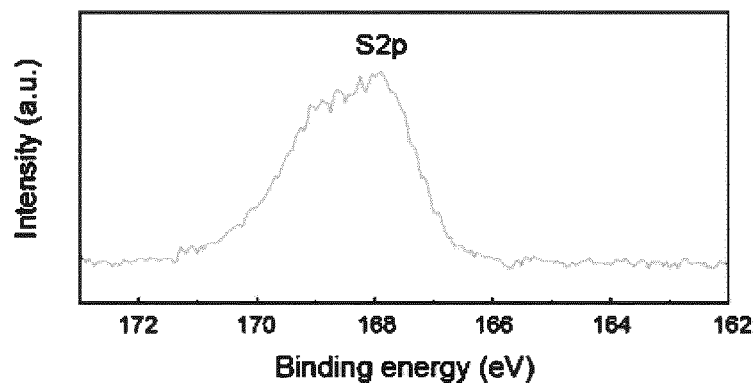
FIG. 38 relates to XPS analysis, showing the S2p XPS of the same electrode after 110-hour CORR operation. After 110-hour CORR operation, the SSC ionomer was still clearly seen as identified by the S2p peaks.

The proposed MEA is considered as stable because the MEA can maintain its performance for at least 80 hours, at least 100 hours or about 110 hours without any degradation thereof. Stability of the MEA with the Cu:Py:SSC catalyst was tested using 3 M KOH as anolyte at an applied current density of 150 mA cm$^{-2}$. FIG. 31 shows that the MEA system maintained a constant C$_2$H$_4$ FE of 61±2% and a full-cell potential of 2.73±0.02 V for 110 hours with no performance degradation. The cathode was analyzed after 110 hours of continuous electrolysis, using electron microscopy and X-ray photon spectroscopy. The Cu morphology and Py:SSC coating were retained (FIGS. 32-38). The MEA equipped with the Cu:Py:SSC catalyst—when taking the carbonate formation penalty into account—outperformed literature benchmarks including both CO$_2$RR and CORR, in C$_2$H$_4$ FE, jc2H$_4$, C$_2$H$_4$ full-cell EE and operation duration (table 10).

TABLE 10

A summary of $CO_2$-to-$C_2H_4$ production using different systems and catalysts. The performance of $C_2H_4$ production in both the cascade SOEC-MEA system and single CORR MEA electrolyzer.

| System | $CO_2$-to-$C_2H_4$ Faradaic efficiency (%) | $CO_2$-to-$C_2H_4$ energy efficiency (%) | $CO_2$-to-$C_2H_4$ single-pass efficiency (%) | $C_2H_4$ concentration in gas-product stream (%) | Operating duration and corresponding $C_2H_4$ partial current density | Reference |
|---|---|---|---|---|---|---|
| Cascade SOEC-MEA system | N.A. | 20 | 11 | 25 | N.A. | This work |
| CORR MEA using metal:molecule:ionomer catalysts | 65 (in a single MEA electrolyzer) | 28 (in a single MEA electrolyzer) | 26 | 36 | 110 h/92 mA cm$^{-2}$ | This work |
|  | 54 (in the cascade SOEC-MEA system) | 24 (in the cascade SOEC-MEA system) |  |  |  |  |
| $CO_2$RR MEA using 300 nm Cu/PTFE | 48 | 14 | 8 | 30 | 100 h/55 mA cm$^{-2}$ | Ref. 11 |
|  |  |  |  |  | 24 h/100 mA cm$^{-2}$ |  |
| Pressurized CORR MEA | 35 | 16 | 12 | 13 | 24 h/57 mA cm$^{-2}$ | Ref. 8 |
| $CO_2$RR flow cell having an abrupt interface | 70 | 34 | 0.15 | 0.15 | 150 h/70 mA cm$^{-2}$ | Ref. 5 |
| $CO_2$RR MEA using Cu:pyridinium | 64 | 20 | 1 | 1 | 190 h/72 mA cm$^{-2}$ | Ref. 6 |
| $CO_2$RR MEA | 15 | 9 | N. R. | N. R. | N. R./0.6 mA cm$^{-2}$ | Ref. 39 |
| $CO_2$RR micro flow cell | 91 | 20 | ~0.4 | ~0.4 | 0.7 h/7 mA cm$^{-2}$ | Ref. 40 |

N.R. indicates that the data was not reported in the corresponding reference.
Ref. 11: Continuous Carbon Dioxide Electroreduction to Concentrated Multi-carbon Products Using a Membrane Electrode Assembly Volume 3, Issue 11, Nov. 20, 2019, Pages 2777-2791
Ref. 8: Carbon Monoxide Gas Diffusion Electrolysis that Produces Concentrated C2 Products with High Single-Pass Conversion Volume 3, Issue 1, Jan. 16, 2019, Pages 240-256
Ref 5: $CO_2$ electroreduction to ethylene via hydroxide-mediated copper catalysis at an abrupt interface Vol 360, Issue 6390 pp. 783-787
Ref 6: Li, F., Thevenon, A., Rosas-Hernandez, A. et al. Molecular tuning of $CO_2$-to-ethylene conversion. Nature 577, 509-513 (2020)
Ref 39: Aeshala, L.M., Uppaluri, R.G., Verma, A. (2013). Effect of cationic and anionic solid polymer electrolyte on direct electrochemical reduction of gaseous $CO_2$ to fuel. J. $CO_2$ Util. 3, 49-55
Ref 40: Merino-Garcia, I., Albo, J., Solla-Gullon, J., Montiel, V., Irabien, A. (2019). Cu oxide/ZnO-based surfaces for a selective ethylene production from gas-phase $CO_2$ electroconversion. J. $CO_2$ Utili. 31, 135-142

In some implementations, the layered structured catalyst can achieve a Faradaic efficiency (FE) for CO single pass conversion into $C_2H_4$ of at least 60% at the applied current density of at least 130 mA·cm$^{-2}$, or of at least 65% at the applied current density of at least 150 mA·cm$^{-2}$, or of at least 80% at the applied current density of at least 155 mA·cm$^{-2}$, or of about 85% at the applied current density of about 160 mA cm$^{-2}$.

Cascade $CO_2$-to-$C_2H_4$ Electroreduction in an Integrated Cascade System

The presently described CO-to-$C_2H_4$ MEA electrolyzer can be used in a cascade $CO_2$-to-$C_2H_4$ conversion for enhanced performance. More particularly, there is further provided a cascade system including a $CO_2$-to-CO SOEC and a CO-to-$C_2H_4$ MEA as above-detailed that can be used as an integrated system for carbonate-free $CO_2$-to-$C_2H_4$ electroproduction. FIG. 2 shows an example combination of the high-performance CO-to-$C_2H_4$ MEA with the $CO_2$-to-CO SOEC.

In some implementations, the integrated cascade system can include a $CO_2$ removal unit operatively connected to the cathodic gas outlet of the SOEC to remove substantially all $CO_2$ from the cathodic stream before being fed as the at least part of the CO-enriched gas component to the MEA. For example, the $CO_2$ removal unit can be a $CO_2$-stripping unit, wherein the $CO_2$-stripping unit comprises a gas inlet for receiving the gaseous product component, a liquid inlet for receiving a $CO_2$-absorption solution, a gas outlet to release a $CO_2$-depleted product and a liquid outlet to release a $CO_2$-enriched absorption solution, and $CO_2$-depleted product being fed to the MEA as the at least part of the humidified CO-enriched gas component. Optionally, the $CO_2$-absorption solution can be an amine-based solution, such as a 10 to 60 wt. % aqueous ethanolamine solution; preferably a 15 to 50 wt. % aqueous ethanolamine solution; more preferably a 20 to 40 wt. % aqueous ethanolamine solution; even more preferably a 30 wt. % aqueous ethanolamine solution.

Figure 39:
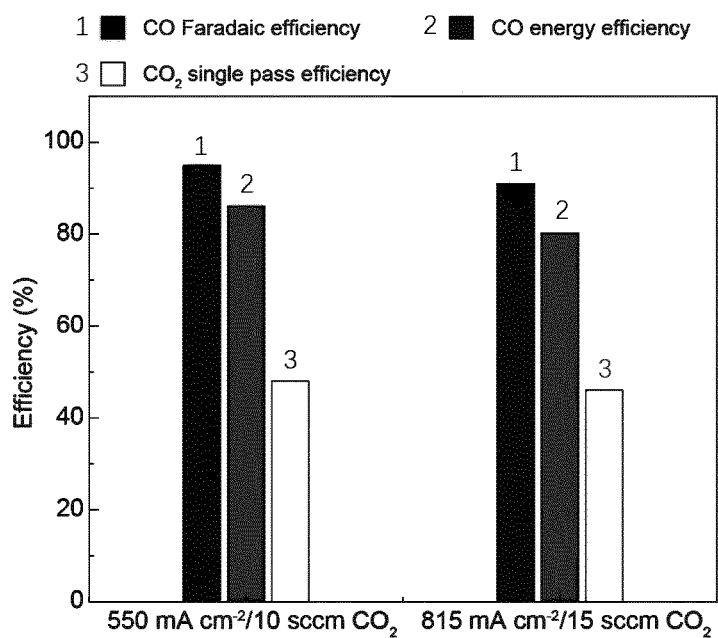
FIG. 39 is a graph comparing $CO_2$-to-CO conversion at two different current densities and $CO_2$ flow rates. To match an inlet CO flow rate of 4-5 sccm for high $C_2H_4$ concentration at the outlet of the MEA, the inlet $CO_2$ flow rate was set at 10 sccm. The current density for operating the SOEC was accordingly reduced to 550 mA cm$^{-2}$ according to the optimal current density:$CO_2$ flow rate ratio of 815:15 (mA cm$^{-2}$ vs. sccm) for high $CO_2$-to-CO single-pass conversion. The operating temperature is 800° C.
Figure 40:
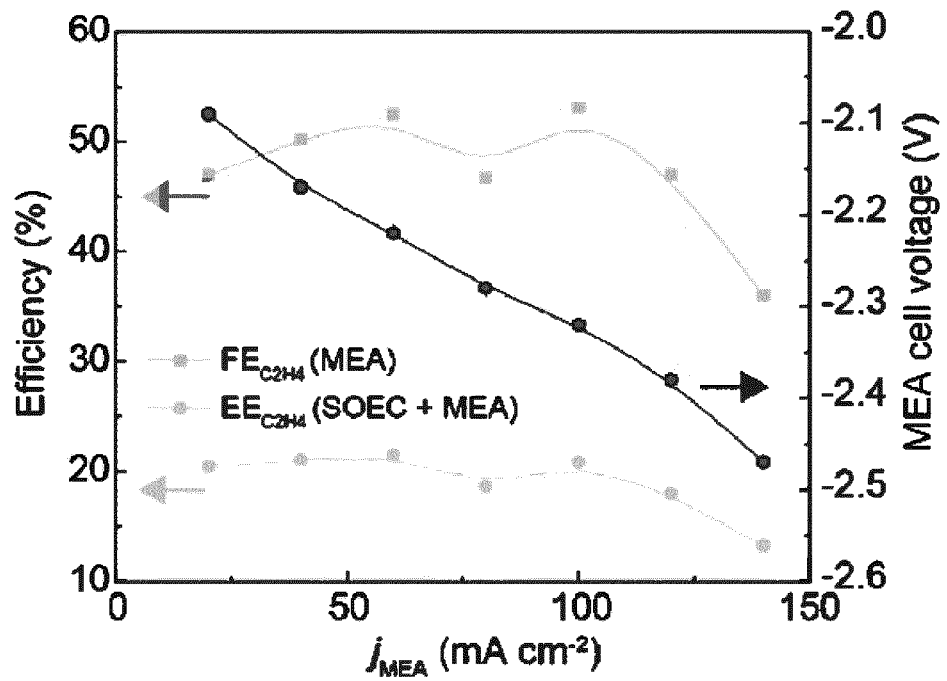
FIG. 40 shows $C_2H_4$ production performance in the cascade $CO_2RR$ with the $C_2H_4$ FE and cell voltage of the CO-to-$C_2H_4$ MEA in the cascade $CO_2RR$, and the $C_2H_4$ EE of the cascade $CO_2RR$.
Figure 41:
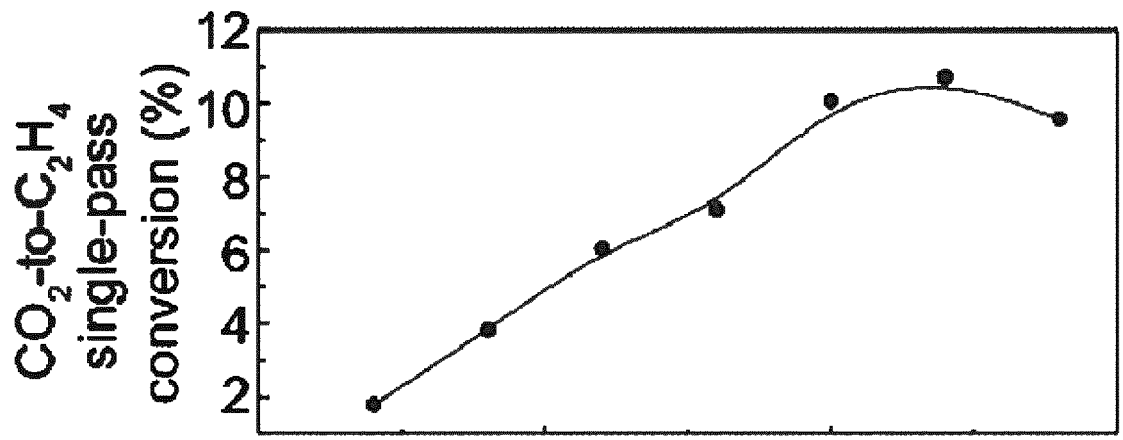
FIG. 41 shows $C_2H_4$ production performance in the cascade $CO_2RR$ with the $CO_2$-to-$C_2H_4$ single-pass conversion of the cascade $CO_2RR$ at different operating current densities for the CO-to-$C_2H_4$ MEA.
Figure 42:
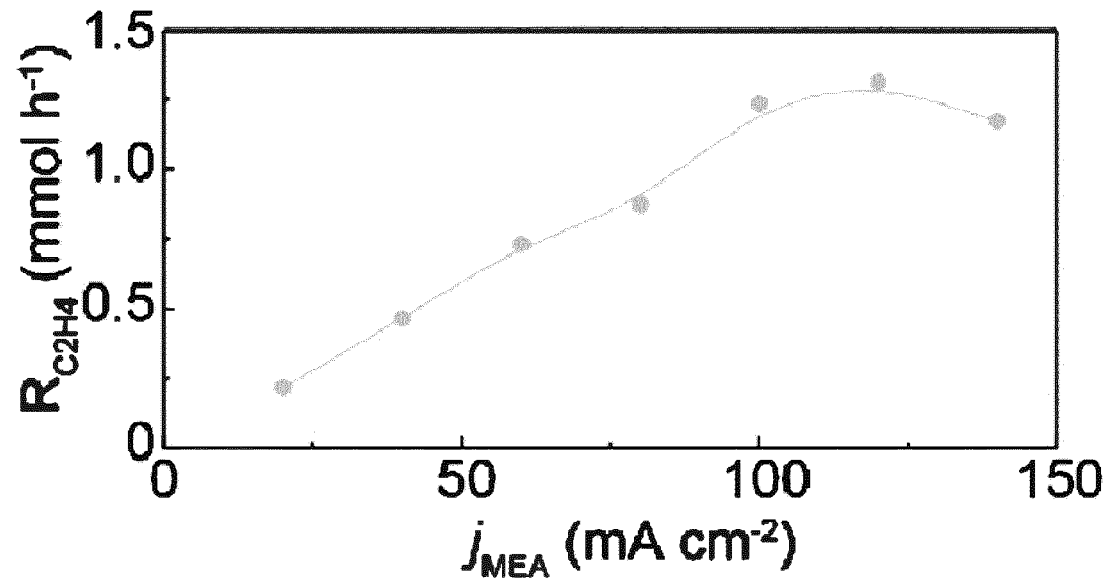
FIG. 42 shows $C_2H_4$ production performance in the cascade $CO_2RR$ with the $C_2H_4$ production rates of the cascade $CO_2RR$ at different operating current densities for the CO-to-$C_2H_4$ MEA
Figure 43:
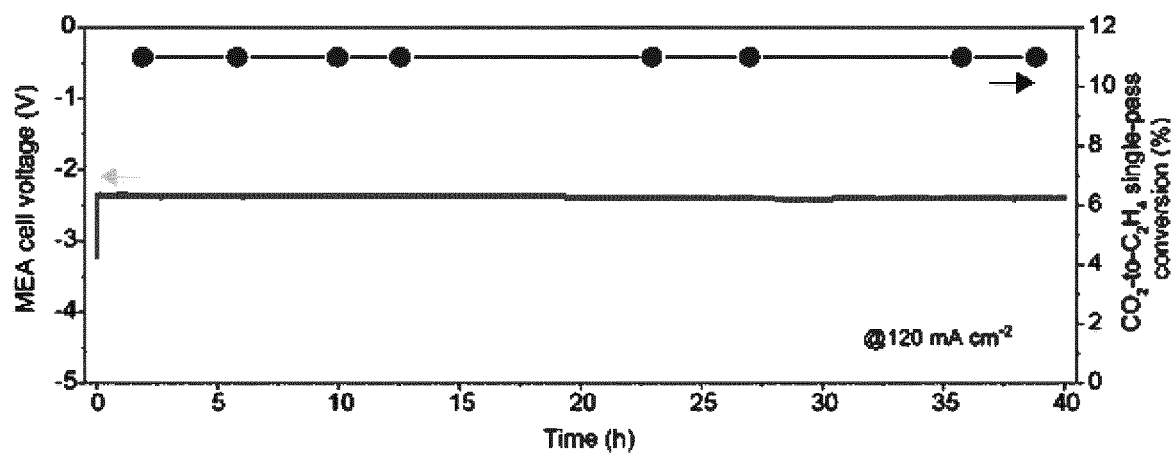
FIG. 43 shows $C_2H_4$ production performance in the cascade $CO_2RR$ with the extended $CO_2$-to-$C_2H_4$ single-pass conversion performance of the MEA in the cascade $CO_2RR$.
Figure 44:
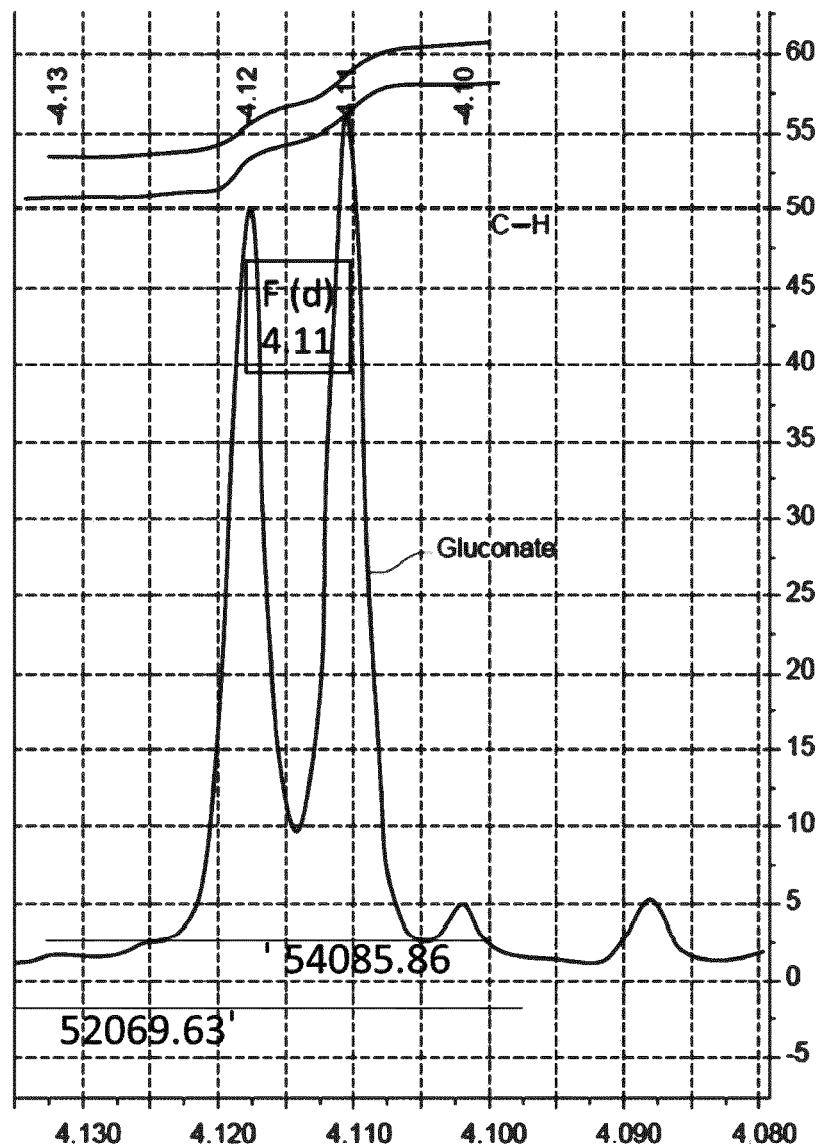
FIG. 44 is a representative of $^1$H NMR spectra of gluconate, one of the glucose electrooxidation reduction (GOR) products at 120 mA cm$^{-2}$
Figure 45:
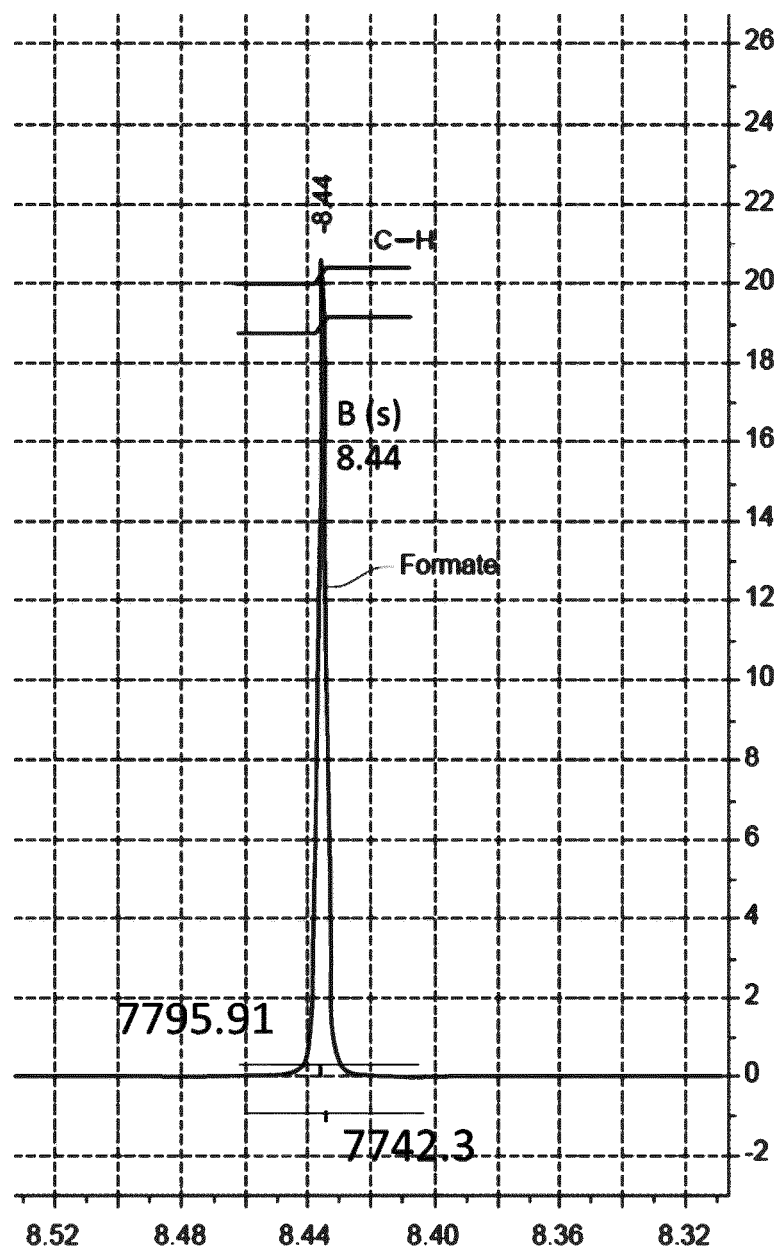
FIG. 45 is a representative of $^1$H NMR spectra of formate, one of the glucose electrooxidation reduction (GOR) products at 120 mA cm$^{-2}$
Figure 46:
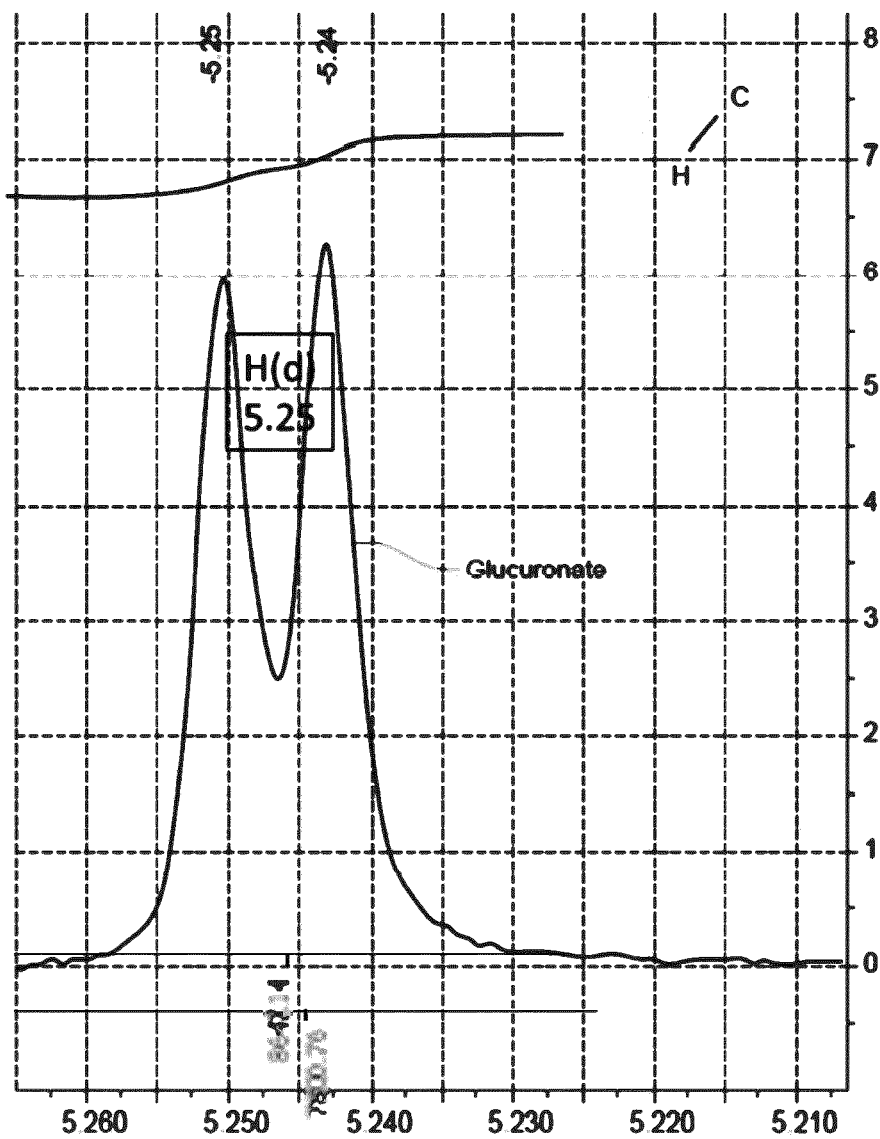
FIG. 46 is a representative of $^1$H NMR spectra of glucuronate, one of the glucose electrooxidation reduction (GOR) products at 120 mA cm$^{-2}$
Figure 47:
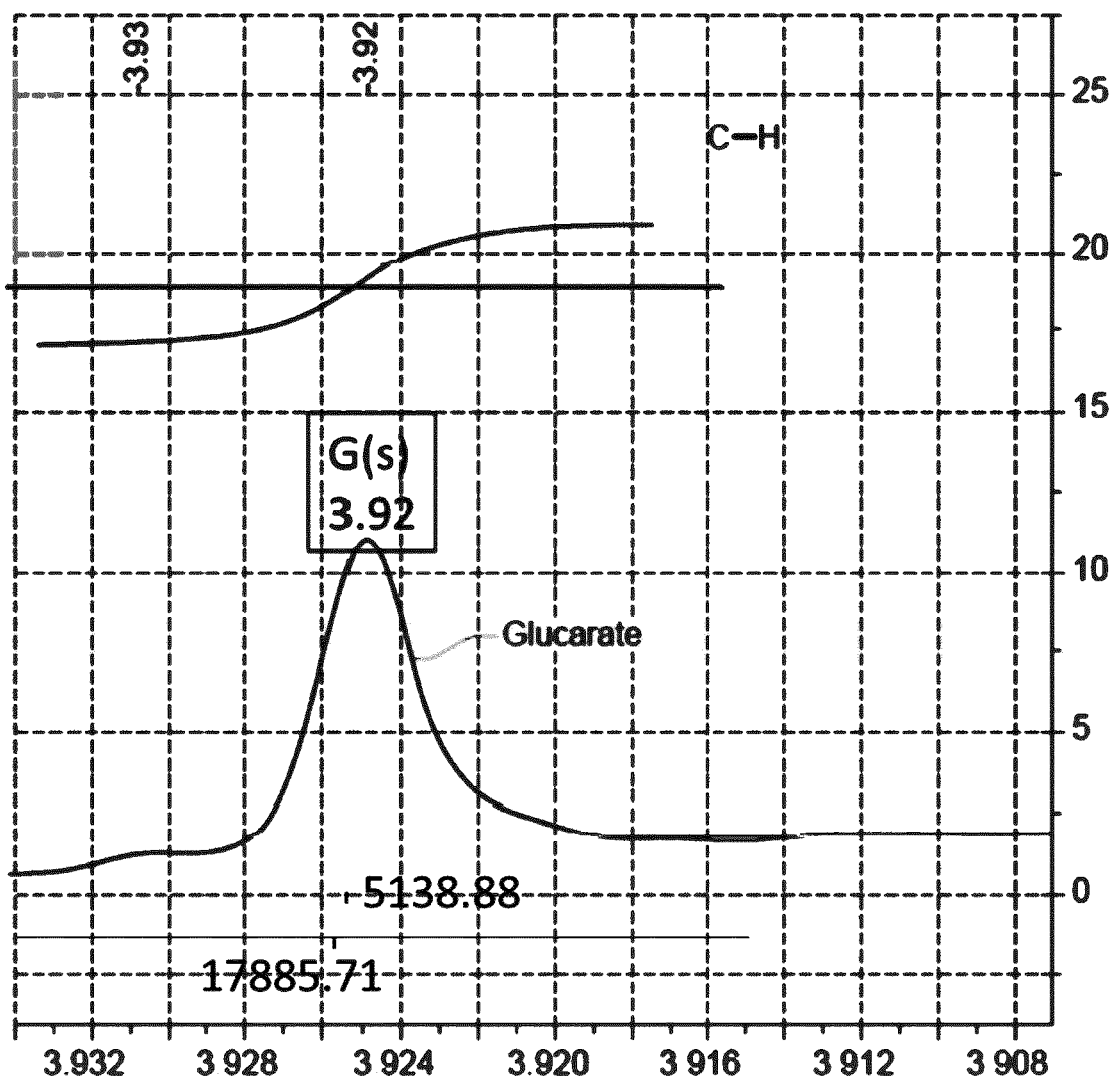
FIG. 47 is a representative of $^1$H NMR spectra of glucarate, one of the glucose electrooxidation reduction (GOR) products at 120 mA cm$^{-2}$
Figure 48:
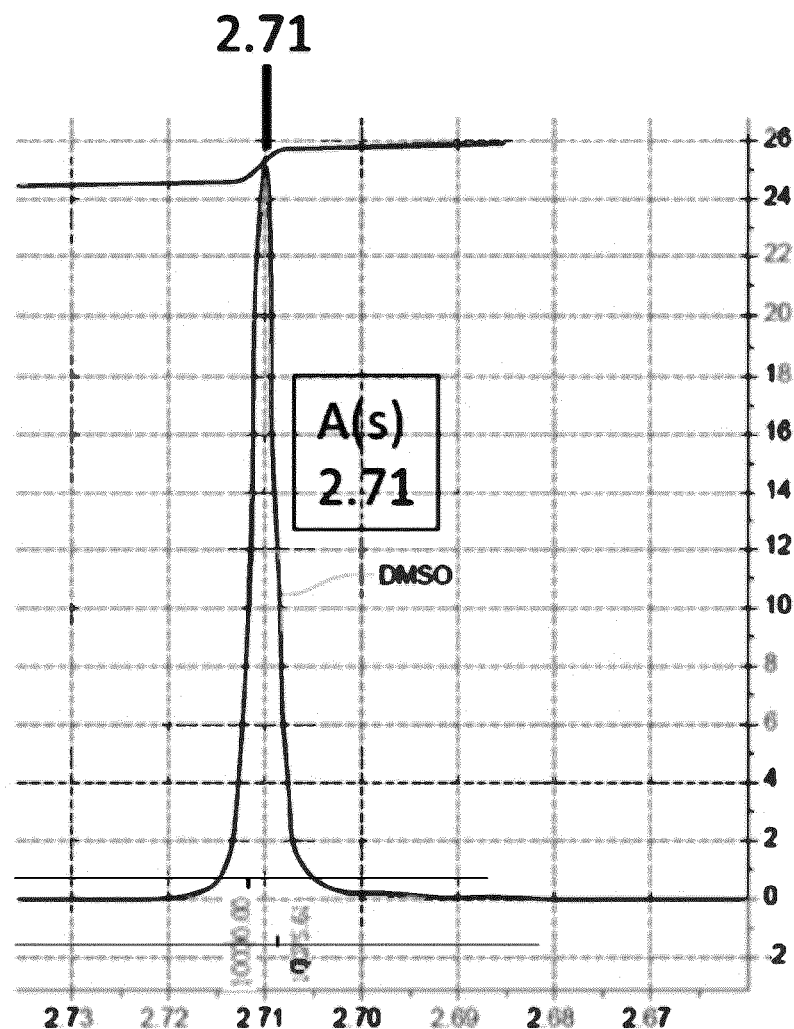
FIG. 48 is a representative of $^1$H NMR spectra of DMSO.

The SOEC that is implemented within the integrated cascade system can be operated at a temperature between about 500° C. and about 850° C., and at an applied current density between 800 mA·cm$^{-2}$ and 1250 mA·cm$^{-2}$, or between 540 mA·cm$^{-2}$ and 560 mA·cm$^{-2}$. FIG. 39 shows that the SOEC of an experimental cascade system was operated at 800° C. and a current density of 550 mA cm$^{-2}$, yielding a ~95% CO FE, ~86% CO full-cell EE (for electricity only), and ~48% single-pass conversion. For that experiment, the inlet CO$_2$ flow rate was set at 10 sccm to test a 815:15 (mA cm$^{-2}$ vs. sccm) ratio of current density: CO$_2$ flow rate and an outlet CO production of ~4.5 sccm for a high CO-to-C$_2$H$_4$ single-pass conversion. The products of the SOEC were purified using CO$_2$ capture solution containing 30% ethanolamine before feeding into the CO-to-C$_2$H$_4$ MEA. The experimental cascade system had a peak CO$_2$-to-C$_2$H$_4$ EE (for electricity only) of 20% (FIG. 40) and a maximum single-pass conversion of ~11% for CO$_2$-to-C$_2$H$_4$ with no loss of CO$_2$ to carbonate formation in electrolytes (FIG. 41). The experimental cascade system produced C$_2$H$_4$ at a peak rate of 1.3 mmol h$^{-1}$ at 120 mA cm$^{-2}$ (FIG. 42), along with C$_{2+}$ FE of ~76% (table 11). The experimental cascade system maintained the peak single-pass conversion and productivity in CO$_2$-to-C$_2$H$_4$ at 120 mA cm$^{-2}$ for 40 hours of uninterrupted operation (FIG. 43). Also, the experimental cascade system achieved carbonate-free electroproduction of ethylene (C$_2$H$_4$) from with an energy intensity of 138 GJ (ton C$_2$H$_4$)$^{-1}$, a major savings relative to the direct route (~267 GJ (ton C$_2$H$_4$)$^{-1}$) (table 12).

TABLE 11

The CORR product distribution of the Cu:Py:SSC catalyst in the MEA of the cascade SOEC-MEA system.

| Full cell potential (V) | j (mA cm$^{-2}$) | Faradaic efficiency (%) | | | | | |
|---|---|---|---|---|---|---|---|
| | | H$_2$ | CH$_4$ | C$_2$H$_4$ | EtOH | Acetate | Propanol | Total |
| −2.13 | 25 | 36.6 | 1.1 | 48.6 | 3.9 | 5.6 | 3.7 | 99.3 |
| −2.33 | 80 | 27.9 | 0.9 | 53.4 | 5.3 | 7.8 | 1.9 | 97.1 |
| −2.41 | 120 | 21.3 | 0.8 | 58.7 | 5.6 | 10.1 | 1.7 | 98.2 |
| −2.51 | 160 | 29.7 | 2.4 | 46.6 | 4.1 | 10.3 | 1.5 | 94.6 |
| −2.62 | 200 | 37.1 | 2.9 | 41.4 | 3.6 | 9.1 | 1.3 | 95.4 |

Operating conditions:
anolyte: 3M KOH;
anolyte flow rate: 20 mL/min;
flow rate of CO (SOEC downstream): ~6 sccm; and
cell temperature: 25° C.

TABLE 12

Summary of inputs for the TEA of the CORR:OER and CORR:GOR couples in the MEA of the cascade SOEC-MEA system.

| Parameters | SOEC base case | CORR: OERMEA | CORR: GORMEA | CO$_2$RR MEA |
|---|---|---|---|---|
| Cathode input cost ($/ton) | 30 | 404.77 | 404.77 | 30 |
| Anode input cost ($/ton) | 5 | 5 | 5 | 5 |
| Electricity cost (c kWh$^{-1}$) | 3 | 3 | 3 | 3 |
| Electrolyzer cost ($ kW$^{-1}$) | 250 | 300 | 300 | 300 |
| Balance of plant (%) | 50 | 50 | 50 | 50 |
| Lang factor | 1 | 1 | 1 | 1 |
| Capacity factor | 0.9 | 0.9 | 0.9 | 0.9 |
| Cell voltage (V) | 1.3 | 2.41 | 1.27 | 3.7 |
| Faradaic efficiency (%) | 100 | 58.7 | 55 | 60 |
| Current density (mA cm$^{-2}$) | 800 | 120 | 120 | 120 |
| Single pass conversion (%) | 40 | 17.61 | 16.5 | 15 |
| CO$_2$ crossover factor | 0 | 0 | 0 | 3 |

TABLE 12-continued

Summary of inputs for the TEA of the CORR:OER and CORR:GOR couples in the MEA of the cascade SOEC-MEA system.

| Parameters | SOEC base case | CORR: OERMEA | CORR: GORMEA | CO$_2$RR MEA |
|---|---|---|---|---|
| Electrolyte Molarity (mol/L) | N/A | 3 | 3 | 0.1 |
| Electrolyte Cost ($/ton) | N/A | 1000 | 1000 | 750 |
| System lifetime (year) | 30 | 30 | 30 | 30 |
| Catalyst/membrane lifetime | 5 | 5 | 5 | 5 |
| Electrolyte lifetime (year) | N/A | 1 | 1 | 1 |
| Discount Rate (%) | 5 | 5 | 5 | 5 |
| Operation Temperature (° C.) | 800 | 25 | 25 | 25 |
| Electrolyzer specific cost distribution ($ (ton ethylene)- | | | | |
| Electrolyzer capital | 4.53 | 687.28 | 386.54 | 1238.76 |
| Electrolyzer operating | 129.27 | 1878.50 | 1426.21 | 2453.16 |
| Electrolyzer installation | 3.02 | 458.19 | 257.69 | 825.84 |
| Cathode Separation | 200.28 | 674.84 | 720.57 | 394.01 |
| Anode Separation | 0.00 | 0.00 | 0.00 | 509.79 |
| Carbonate Regeneration | 0.00 | 0 | 0 | 0.00 |
| Heating (SOEC) | 67.66 | 0 | 0 | 0.00 |
| Overall cost | 404.77 | 3698.81 | 2791.01 | 5421.55 |
| Electrolyzer specific energy distribution (GJ (ton ethylene)$^{-1}$) | | | | |
| Electrolyzer electricity | 8.96 | 113.18 | 63.66 | 255.00 |
| Cathode separation | 1.97 | 10.35 | 11.32 | 4.98 |
| Anode separation | 0.00 | 0.00 | 0.00 | 7.08 |
| Carbonate regeneration | 0.00 | 0.00 | 0.00 | 0.00 |
| Heating (SOEC) | 2.57 | 0.00 | 0.00 | 0.00 |
| Overall energy | 13.49 | 123.53 | 74.97 | 267.05 |

Figure 49:
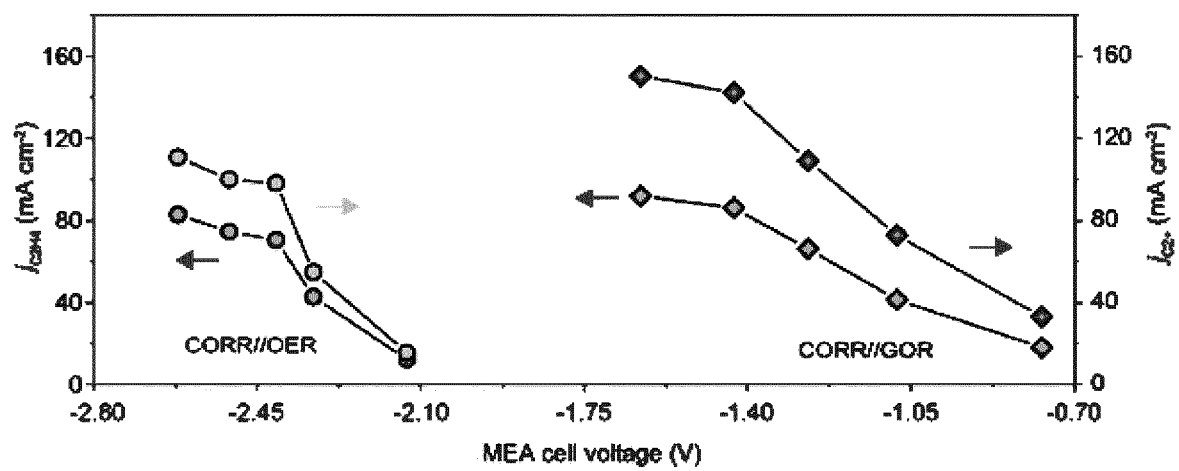
FIG. 49 represents the effect of anodic reaction on the CORR performance metrics of the MEA in the cascade $CO_2RR$.
Figure 50:
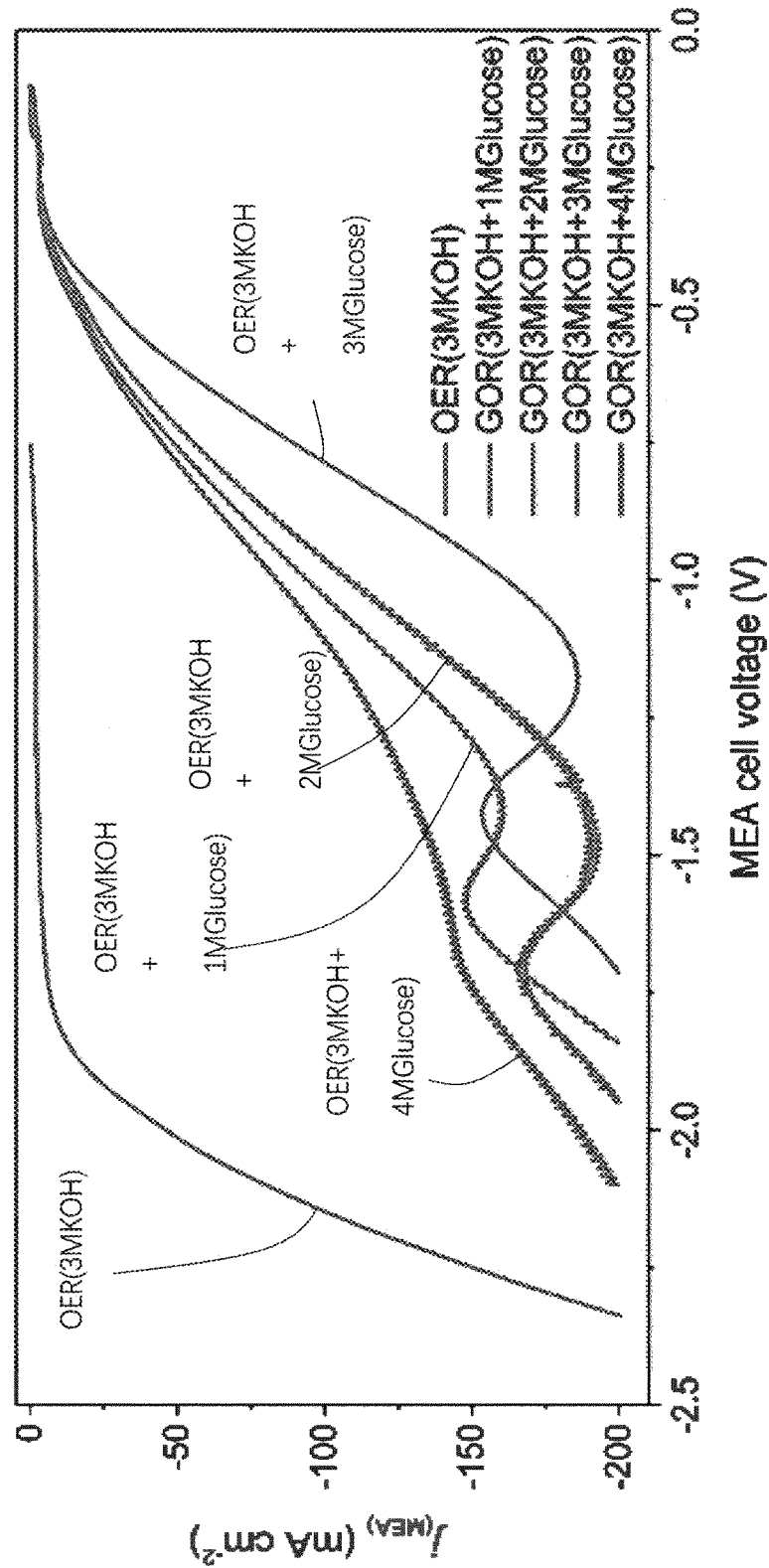
FIG. 50 is a graph of the linear sweep voltammetry curves of the MEAs using either oxygen evolution reaction (OER) or glucose electrooxidation reaction (GOR) as the coupling reaction to CORR in the MEA of the cascade SOEC-MEA system. MEA operating conditions: anolyte flow rate: 20 mL/min; flow rate of CO (SOEC downstream): ~6 sccm; and cell temperature: 25° C.

Having established the cascade system performance in side-by-side comparison with previous on-step CO$_2$R processes, it should be noted that the MEA used in the cascade system can be further adjusted. For example, the MEA can include an Oxygen Evolution Reaction (OER) anode or a Glucose Electrooxidation Reaction (GOR) anode. Both OER anode and GOR anode were tested, and the GOR anode showed athermodynamic potential that is ~1 V less than that of the OER anode.[40] Gluconate, glucuronate, glucarate, and formate, having values higher than that of glucose, were detected as the major GOR products in the current density range of 40 to 200 mA cm$^{-2}$ (table 13 and FIGS. 44-48). Coupling the CORR and GOR in an alkaline media can reduce the potential requirement approximately 1 V at industrially relevant current densities (FIGS. 49 and 50, tables 14-17). Indeed, at a current density of 120 mA cm$^{-2}$, a C$_2$H$_4$ FE of ~55% and a C$_{2+}$FE of ~90% were obtained for a MEA full-cell potential of 1.27 V (tables 16 and 18). This voltage reduction can allow a total energy requirement of ~89 GJ (ton C$_2$H$_4$)$^{-1}$, which represents a 35% reduction in the energy consumption compared to the MEA cell using OER anode at the same current density (~138 GJ (ton C$_2$H$_4$)$^{-1}$), or a ~66% reduction in the energy intensity compared to the direct route (~267 GJ (ton C$_2$H$_4$)$^{-1}$) (table 12).

TABLE 13

The glucose oxidation reaction (GOR) product distribution of the Pt-C catalyst in the MEA of the cascade SOEC-MEA system using glucose oxidation as the anodic reaction.

| Full cell potential (V) | j (mA cm$^{-2}$) | Faradaic efficiency (%) | | | | | $j^{gluconate}$ (mA cm$^{-2}$) |
|---|---|---|---|---|---|---|---|
| | | Gluconate | Formate | Glucarate | Glucuronate | Total | |
| -0.77 | 40 | 36.4 | 7.4 | 27.6 | 30.2 | 101.6 | 14.6 |
| -1.08 | 80 | 53.6 | 5.6 | 22.1 | 21.1 | 102.4 | 42.9 |
| -1.27 | 120 | 59.1 | 6.2 | 17.3 | 16.8 | 99.4 | 70.9 |
| -1.43 | 160 | 66.5 | 6.1 | 15.4 | 13.1 | 101.1 | 106.4 |
| -1.63 | 200 | 61.8 | 5.1 | 10.7 | 8.7 | 86.3 | 123.6 |

MEA operating conditions:
anolyte: 3M KOH + 3M Glucose;
anolyte flow rate: 20 mL/min;
flow rate of CO (SOEC downstream): ~6 sccm; and
cell temperature: 25° C.

TABLE 14

The CORR-to-C$_2$H$_4$ performance of the Cu:Py:SSC catalyst in the MEA of the cascade SOEC-MEA system using glucose oxidation as the anodic reaction. Error bars correspond to the standard deviation of 3 independent measurements.

| Full cell potential (V) | j (mA cm$^{-2}$) | Faradaic efficiency (%) | | | $j_{C2H4}$ (mA cm$^{-2}$) |
|---|---|---|---|---|---|
| | | H$_2$ | CH$_4$ | C$_2$H$_4$ | |
| -0.97 | 20 | 16 ± 2 | 0.1 | 35 ± 2 | 7 ± 1 |
| -1.18 | 40 | 14 ± 2 | 0.1 | 43 ± 2 | 17 ± 1 |
| -1.32 | 60 | 13 ± 2 | 0.1 | 47 ± 2 | 28 ± 1 |
| -2.28 | 80 | 12 ± 2 | 0.1 | 50 ± 2 | 40 ± 2 |
| -2.56 | 100 | 11 ± 1 | 0.1 | 54 ± 2 | 54 ± 1 |
| -2.71 | 120 | 10 ± 1 | 0.1 | 56 ± 2 | 67 ± 3 |
| -2.83 | 140 | 9 ± 1 | 0.1 | 58 ± 1 | 82 ± 2 |
| -3.03 | 160 | 11 ± 2 | 0.1 | 53 ± 2 | 85 ± 3 |
| -3.11 | 180 | 13 ± 3 | 0.1 | 47 ± 3 | 85 ± 5 |
| -3.22 | 200 | 15 ± 3 | 0.1 | 43 ± 3 | 86 ± 6 |

MEA operating conditions:
anolyte: 3M KOH + 1M Glucose;
anolyte flow rate: 20 mL/min;
flow rate of CO (SOEC downstream): ~6 sccm; and
cell temperature: 25° C.

TABLE 15

The CORR-to-C$_2$H$_4$ performance of the Cu:Py:SSC catalyst in the MEA of the cascade SOEC-MEA system using glucose oxidation as the anodic reaction. Error bars correspond to the standard deviation of 3 independent measurements.

| Full cell potential (V) | j (mA cm$^{-2}$) | Faradaic efficiency (%) | | | $j_{C2H4}$ (mA cm$^{-2}$) |
|---|---|---|---|---|---|
| | | H$_2$ | CH$_4$ | C$_2$H$_4$ | |
| -0.68 | 20 | 15 ± 2 | 0.1 | 39 ± 2 | 7 ± 1 |
| -0.96 | 40 | 14 ± 2 | 0.1 | 17 ± 1 | 17 ± 1 |
| -1.15 | 60 | 13 ± 2 | 0.1 | 47 ± 2 | 28 ± 1 |
| -1.29 | 80 | 12 ± 2 | 0.1 | 50 ± 2 | 40 ± 2 |
| -1.38 | 100 | 11 ± 1 | 0.1 | 54 ± 1 | 54 ± 1 |
| -1.49 | 120 | 11 ± 1 | 0.1 | 55 ± 2 | 66 ± 2 |
| -1.61 | 140 | 11 ± 1 | 0.1 | 57 ± 1 | 80 ± 2 |
| -2.56 | 160 | 12 ± 1 | 0.1 | 53 ± 2 | 85 ± 3 |
| -2.62 | 180 | 14 ± 2 | 0.1 | 49 ± 2 | 88 ± 4 |
| -2.71 | 200 | 16 ± 2 | 0.1 | 45 ± 2 | 90 ± 4 |

MEA operating conditions:
anolyte: 3M KOH + 2M Glucose;
anolyte flow rate: 20 mL/min;
flow rate of CO (SOEC downstream): ~6 sccm; and
cell temperature: 25° C.

TABLE 16

The CORR-to-C$_2$H$_4$ performance of the Cu:Py:SSC catalyst in the MEA of the cascade SOEC-MEA system using glucose oxidation as the anodic reaction. Error bars correspond to the standard deviation of 3 independent measurements.

| Full cell potential (V) | j (mA cm$^{-2}$) | Faradaic efficiency (%) | | | $j_{C2H4}$ (mA cm$^{-2}$) |
|---|---|---|---|---|---|
| | | H$_2$ | CH$_4$ | C$_2$H$_4$ | |
| -0.54 | 20 | 13 ± 2 | 0.1 | 36 ± 2 | 7 ± 1 |
| -0.77 | 40 | 12 ± 2 | 0.1 | 41 ± 2 | 17 ± 1 |
| -0.96 | 60 | 12 ± 2 | 0.1 | 46 ± 2 | 28 ± 1 |
| -1.08 | 80 | 11 ± 2 | 0.1 | 49 ± 2 | 40 ± 2 |
| -1.19 | 100 | 10 ± 1 | 0.1 | 52 ± 2 | 52 ± 2 |
| -1.27 | 120 | 10 ± 1 | 0.1 | 55 ± 2 | 66 ± 2 |
| -1.35 | 140 | 10 ± 1 | 0.1 | 57 ± 1 | 80 ± 2 |
| -1.43 | 160 | 12 ± 1 | 0.1 | 54 ± 2 | 87 ± 3 |
| -1.52 | 180 | 13 ± 2 | 0.1 | 52 ± 2 | 94 ± 4 |
| -1.63 | 200 | 16 ± 2 | 0.1 | 44 ± 2 | 88 ± 4 |

MEA operating conditions:
anolyte: 3M KOH + 3M Glucose;
anolyte flow rate: 20 mL/min;
flow rate of CO (SOEC downstream): ~6 sccm; and
cell temperature: 25° C.

TABLE 17

The CORR-to-$C_2H_4$ performance of the Cu:Py:SSC catalyst in the MEA of the cascade SOEC-MEA system using glucose oxidation as the anodic reaction. Error bars correspond to the standard deviation of 3 independent measurements.

| Full cell potential (V) | j (mA cm$^{-2}$) | Faradaic efficiency (%) | | | $J_{C2H4}$ (mA cm$^{-2}$) |
|---|---|---|---|---|---|
| | | H$_2$ | CH$_4$ | C$_2$H$_4$ | |
| −0.59 | 20  | 11 ± 1 | 0.1 | 34 ± 2 | 6 ± 1 |
| −0.77 | 40  | 10 ± 1 | 0.1 | 39 ± 2 | 16 ± 1 |
| −1.09 | 60  | 10 ± 1 | 0.1 | 43 ± 2 | 26 ± 1 |
| −1.35 | 80  | 9 ± 1  | 0.1 | 44 ± 2 | 35 ± 2 |
| −1.46 | 100 | 9 ± 1  | 0.1 | 47 ± 2 | 47 ± 2 |
| −1.59 | 120 | 10 ± 1 | 0.1 | 50 ± 2 | 60 ± 2 |
| −1.68 | 140 | 12 ± 2 | 0.1 | 52 ± 1 | 73 ± 2 |
| −1.79 | 160 | 15 ± 2 | 0.1 | 48 ± 2 | 77 ± 3 |
| −1.87 | 180 | 18 ± 2 | 0.1 | 44 ± 2 | 79 ± 3 |
| −1.94 | 200 | 20 ± 3 | 0.1 | 40 ± 3 | 80 ± 6 |

MEA operating conditions:
anolyte: 3M KOH + 4M Glucose;
anolyte flow rate: 20 mL/min;
flow rate of CO (SOEC downstream): ~ 6 sccm; and
cell temperature: 25° C.

TABLE 18

The CORR product distribution of the Cu:Py:SSC catalyst in the MEA of the cascade SOEC-MEA system using glucose oxidation as the anodic reaction.

| Full cell potential (V) | j (mA cm$^{-2}$) | Faradaic efficiency (%) | | | | | | |
|---|---|---|---|---|---|---|---|---|
| | | H$_2$ | CH$_4$ | C$_2$H$_4$ | EtOH | Acetate | Propanol | Total |
| −0.77 | 40  | 12.9 | 0.1 | 45.1 | 11.3 | 14.4 | 11.6 | 95.4 |
| −1.08 | 80  | 10.3 | 0.1 | 51.6 | 15.0 | 15.2 | 9.1  | 101.3 |
| −1.27 | 120 | 9.7  | 0.1 | 55.1 | 13.8 | 16.1 | 6.9  | 101.6 |
| −1.43 | 160 | 12.1 | 0.1 | 53.8 | 11.2 | 19.1 | 4.8  | 101.1 |
| −1.63 | 200 | 18.8 | 0.1 | 45.9 | 8.3  | 16.8 | 4.2  | 94.1 |

Operating conditions:
anolyte: 3M KOH + 3M Glucose;
anolyte flow rate: 20 mL/min;
flow rate of CO (SOEC downstream): ~6 sccm; and
cell temperature: 25° C.

Performance of the integrated cascade system can be characterized by a $CO_2$-to-$C_2H_4$ EE that is between 20% and 22% with a maximum single-pass $CO_2$-to-$C_2H_4$ conversion between 11% and 13% without $CO_2$ loss to carbonate formation. For example, the $CO_2$-to-$C_2H_4$ EE can be of about 20% with the maximum single-pass $CO_2$-to-$C_2H_4$ conversion of about 11%.

MEA and Integrated System Performances

The cascade approach to $CO_2$-to-$C_2H_4$ conversion that is proposed herein can avoid carbonate formation and associated energy penalties, by combining an SOEC with a high performance CORR MEA electrolyzer. The developed layered structure of the catalyst, e.g. composed of a metallic Cu, N-tolyl-tetrahydro-bipyridine, and a SSC ionomer, can achieve high-rate and efficient CO-to-$C_2H_4$ conversion when implemented in a MEA electrolyzer. The combined functions of each layer raised the device $C_2H_4$ FE to 65%, at a full-cell $C_2H_4$ EE of 28% across a broad range of industrially relevant current densities, versus the <50% FEs of the bare and single-layer catalyst structures. To drive an end-to-end $CO_2$ conversion process without the loss of $CO_2$ to carbonate, the MEA electrolyzer is paired with the SOEC for $CO_2$-to-CO conversion. With the CO stream produced from the SOEC, the MEA electrolyzer can generate $C_2H_4$ at a peak rate of 1.3 mmol h$^{-1}$ and maintain continuous operation for 40 hours. It was shown that the full cascade system required ~138 GJ (ton $C_2H_4$)$^{-1}$, achieving significant savings over the directly-comparable one-step $CO_2$-to-$C_2H_4$ route (~267 GJ (ton $C_2H_4$)$^{-1}$). Having established the direct comparison, an approach to reduce the energy consumption of the MEA ~35% was further developed, switching the OER anode to GOR. With this adjustment, the cascade SOEC-MEA system can require a total energy requirement of ~89 GJ (ton $C_2H_4$)$^{-1}$. These results demonstrate the potential to electrochemically convert $CO_2$ to $C_2H_4$ without carbonate production and associated energy penalties. The result is a record-low energy requirement for the production of the world's most-produced organic compound.

Figure 51:
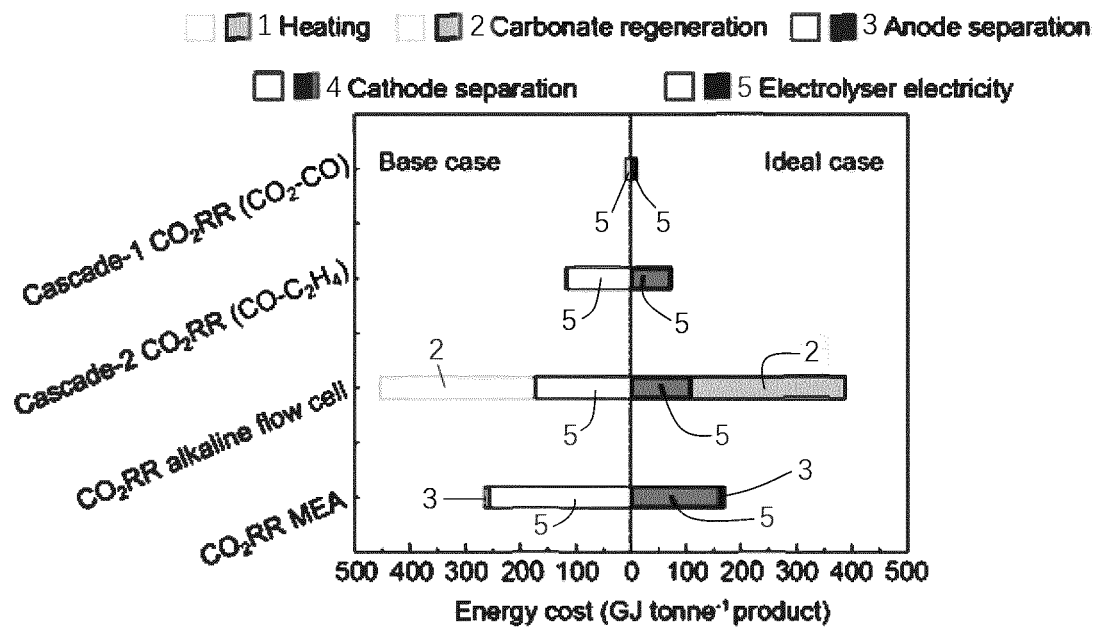
FIG. 51 shows Carbonate-formation-free $CO_2$-to-$C_2H_4$ production through cascade $CO_2RR$ with a comparison of energy consumption for $C_2H_4$ production in various systems.
Figure 52:
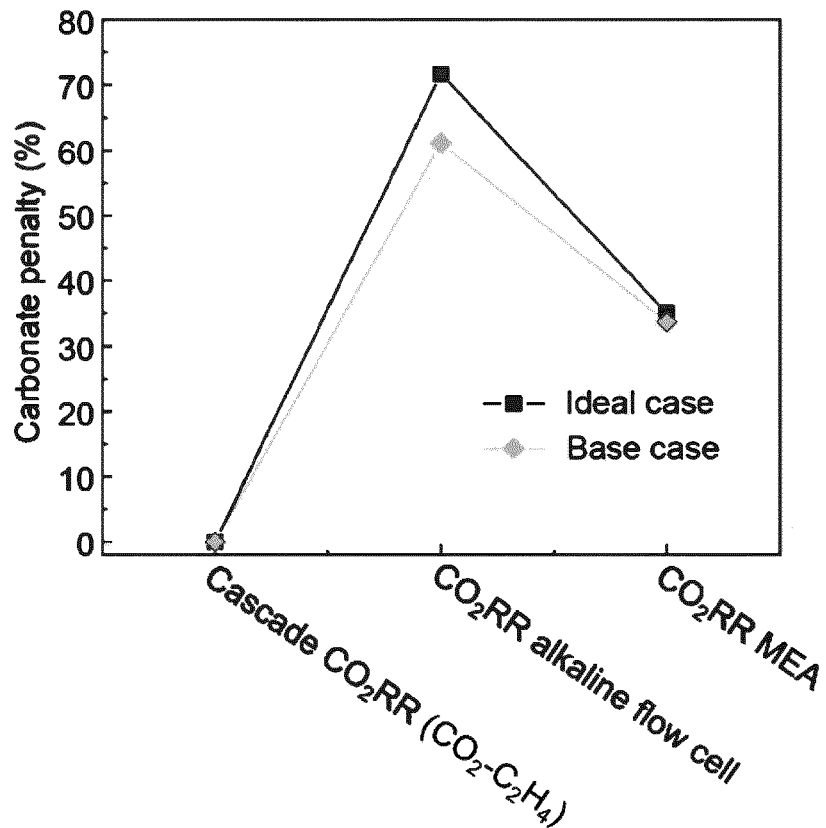
FIG. 52 shows Carbonate-formation-free $CO_2$-to-$C_2H_4$ production through cascade $CO_2RR$ with carbonate penalty (i.e., the faction of energy consumption due to carbonate formation) in the various systems.

To assess the energy and cost associated with $CO_2$ reactant loss to carbonate formation, an energy and techno-economic assessments (TEA) for $CO_2RR$ systems was performed for ideal and base case scenarios. See section entitled "Techno-economic assessment" below, and figures 3, 7 and 8, as well as tables 19 and 20. Electrolyte regeneration, system operation, and anodic product separation associated with carbonate formation significantly increases energy consumption and cost. The regeneration of alkaline electrolyte induces a penalty of ~278 GJ per ton $C_2H_4$ produced, accounting for 60-70% of the total energy requirement (FIGS. 51 and 52). Membrane electrode assembly (MEA) electrolyzers result in less carbonateformation. However, six moles $CO_j$ for every mole of $C_2H_4$ is produced, leading to 4 times increase in membrane resistance, pH-gradient induced high voltages, and 60-90 GJ of additional energy consumption per ton $C_2H_4$—a process energy penalty of ~35% (see FIGS. 51 and 52 as well as tables 19 and 20).

TABLE 19

Techno-economic assessment. Cost of $C_2H_4$ produced from $CO_2$ in different systems in base cases.

| Parameters | $CO_2RR$ MEA base case | $CO_2RR$ flow cell base case | SOEC base case | CORR MEA base case |
|---|---|---|---|---|
| Cathode input cost ($/ton) | 30 | 30 | 30 | 404.77 |
| Anode input cost ($/ton) | 5 | 5 | 5 | 5 |
| Electricity cost (c kWh$^{-1}$) | 3 | 3 | 3 | 3 |
| Electrolyzer cost ($ kW$^{-1}$) | 300 | 300 | 250 | 300 |
| Balance of plant (%) | 50 | 50 | 50 | 50 |
| Lang factor | 1 | 1 | 1 | 1 |
| Capacity factor | 0.9 | 0.9 | 0.9 | 0.9 |
| Cell voltage (V) | 3.7 | 2.5 | 1.3 | 2.5 |
| Faradaic efficiency (%) | 60 | 60 | 100 | 60 |
| Current density (mA cm$^{-2}$) | 150 | 150 | 800 | 150 |
| Single pass conversion (%) | 15 | 2.86 | 40 | 18 |
| CO2 crossover factor | 3 | 20 | 0 | 0 |
| Electrolyte Molarity (mol/L) | 0.1 | 3 | N/A | 3 |
| Electrolyte Cost ($/ton) | 750 | 1000 | N/A | 1000 |
| System lifetime (year) | 30 | 30 | 30 | 30 |
| Catalyst/membrane lifetime | 5 | 5 | 5 | 5 |
| Electrolyte lifetime (year) | 1 | 1 | N/A | 1 |
| Discount Rate (%) | 5 | 5 | 5 | 5 |
| Operation Temperature (° C.) | 25 | 25 | 800 | 25 |
| Electrolyzer specific cost distribution ($ (ton ethylene)$^{-1}$) | | | | |
| Electrolyzer capital | 1238.76 | 837.00 | 4.53 | 558.00 |
| Electrolyzer operating | 2453.16 | 1722.34 | 129.27 | 1888.48 |
| Electrolyzer installation | 825.84 | 558.00 | 3.02 | 372.00 |
| Cathode Separation | 394.01 | 394.01 | 200.28 | 659.89 |
| Anode Separation (Carbonate) | 509.79 | 0.00 | 0.00 | 0.00 |
| Carbonate Regeneration | 0.00 | 2317.54 | 0.00 | 0 |
| Heating (SOEC) | 0.00 | 0.00 | 67.66 | 0 |
| Overall cost | 5421.55 | 5828.89 | 404.77 | 3478.37 |

TABLE 19-continued

Techno-economic assessment. Cost of $C_2H_4$ produced from $CO_2$ in different systems in base cases.

| Parameters | $CO_2RR$ MEA base case | $CO_2RR$ flow cell base case | SOEC base case | CORR MEA base case |
|---|---|---|---|---|
| Electrolyzer specific energy distribution (GJ (ton ethylene)$^{-1}$) | | | | |
| Electrolyzer electricity | 255.00 | 172.29 | 8.96 | 114.86 |
| Cathode separation | 4.98 | 4.98 | 1.97 | 10.05 |
| Anode separation (Carbonate) | 7.08 | 0.00 | 0.00 | 0.00 |
| Carbonate regeneration | 0.00 | 278.11 | 0.00 | 0.00 |
| Heating (SOEC) | 0.00 | 0.00 | 2.57 | 0.00 |
| Overall energy | 267.05 | 455.38 | 13.49 | 124.91 |

TABLE 20

Techno-economic assessment. Cost of $C_2H_4$ produced from $CO_2$ in different systems in ideal cases.

| Parameters | $CO_2RR$ MEA ideal case | $CO_2RR$ flow cell ideal case | SOEC ideal case | CORR MEA ideal case |
|---|---|---|---|---|
| Cathode input cost ($/ton) | 30 | 30 | 30 | 292.25 |
| Anode input cost ($/ton) | 5 | 5 | 5 | 5 |
| Electricity cost (c kWh$^{-1}$) | 3 | 3 | 3 | 3 |
| Electrolyzer cost ($ kW$^{-1}$) | 300 | 300 | 250 | 300 |
| Balance of plant (%) | 50 | 50 | 50 | 50 |
| Lang factor | 1 | 1 | 1 | 1 |
| Capacity factor | 0.9 | 0.9 | 0.9 | 0.9 |
| Cell voltage (V) | 3.7 | 2.5 | 1.3 | 2.5 |
| Faradaic efficiency (%) | 95 | 95 | 100 | 95 |
| Current density (mA cm$^{-2}$) | 200 | 200 | 800 | 200 |
| Single pass conversion (%) | 23.75 | 4.52 | 90 | 28.5 |
| CO2 crossover factor | 3 | 20 | 0 | 0 |
| Electrolyte Molarity (mol/L) | 0.1 | 3 | N/A | 3 |
| Electrolyte Cost ($/ton) | 750 | 1000 | N/A | 1000 |
| System lifetime (year) | 30 | 30 | 30 | 30 |
| Catalyst/membrane lifetime | 5 | 5 | 5 | 5 |
| Electrolyte lifetime (year) | 1 | 1 | N/A | 1 |
| Discount Rate (%) | 5 | 5 | 5 | 5 |
| Operation Temperature (° C.) | 25 | 25 | 800 | 25 |
| Electrolyzer specific cost distribution ($ (ton ethylene)$^{-1}$) | | | | |
| Electrolyzer capital | 586.78 | 396.47 | 4.53 | 264.32 |
| Electrolyzer operating | 1590.87 | 1125.00 | 129.27 | 1265.21 |
| Electrolyzer installation | 391.19 | 264.32 | 3.02 | 176.21 |
| Cathode Separation | 133.15 | 133.15 | 111.53 | 389.21 |
| Anode Separation (Carbonate) | 509.79 | 0.00 | 0.00 | 0.00 |
| Carbonate Regeneration | 0.00 | 2317.54 | 0.00 | 0.00 |
| Heating (SOEC) | 0.00 | 0.00 | 43.89 | 0.00 |
| Overall cost | 3211.78 | 4236.48 | 292.25 | 2094.95 |
| Electrolyzer specific energy distribution (GJ (ton ethylene)$^{-1}$) | | | | |
| Electrolyzer electricity | 161.05 | 108.82 | 8.96 | 72.55 |
| Cathode separation | 1.12 | 1.12 | 0.87 | 4.90 |
| Anode separation (Carbonate) | 7.08 | 0.00 | 0.00 | 0.00 |
| Carbonate regeneration | 0.00 | 278.11 | 0.00 | 0.00 |
| Heating (SOEC) | 0.00 | 0.00 | 1.14 | 0.00 |
| Overall energy | 169.24 | 388.04 | 10.97 | 77.44 |

Experimental

Chemicals

All solvents and reagents, unless otherwise stated, were obtained from commercial sources (Sigma Aldrich@ and Merck & Co.) and used without further purification. $D_2O$ (D 99.5%), d-chloroform (D 99.8%) and d6-DMSO (D 99.8%) were purchased from Cambridge Isotope Laboratories.

Materials Preparation

Molecule Synthesis

The tolylpyridinium triflate additive was synthesized according to previous report (Ge et al.). Before usage, the additive was recrystallized twice from a mixture of MeOH:ether (1:5) and metal traces impurities were removed using activated Chelex resin.

Electrode Preparation

The gas diffusion electrode (GDE) developed was composed of two catalyst layers: sputtered Cu layer and electrodeposited Cu layer. A 150-nm Cu seed was magnetically sputtered onto the polytetrafluoroethylene (PTFE) substrate with the mean pore size of 450 μm with the sputtering rate of 0.50 A sec$^{-1}$ under 10$^{-6}$ Torr. A Cu catalyst was then electrodeposited onto the 150 nm-Cu sputtered PTFE substrate. The solution prepared for the electrodeposition was comprised of 0.1 M copper bromide (98%, Sigma-Aldrich®), 0.2 M sodium tartrate dibasic dehydrate (purum p.a., ≥98.0% (NT)), and 1.0 M potassium hydroxide (KOH, Sigma-Aldrich®). Electrodeposition was performed at ~400 mA cm$^{-2}$ for 90 seconds under the continuous flow of $CO_2$. Electrodeposition was performed in a flow electrolyzer composed of anode and cathode flow compartments, separated by an anion exchange membrane (AEM, Sustainion® X37-50 grade 60, Dioxide Materials™). During the electrodeposition, pure $CO_2$ with the constant flow rate of 80 standard cubic centimetres per minute (sccm) was supplied to the cathode compartment while 1 M KOH was being circulated through the anode compartment. A nickel foam with the geometric area of 9 cm$^{-2}$ and an Ag/AgCl (3 M KCl) were used as the counter electrode and reference electrode, respectively.

N-Arylpyridinium-Derived Film Deposition

The surface of the Cu catalyst was modified by electrodepositing a 10-20 nm-thick N-tolyl-tetradihydro-bipyridine (Py) film from a solution containing 0.1 M $KHCO_3$ and 10 mM N-tolyl-pyridinium triflate precursor. The electrodeposition was performed in a three-electrode configuration, in which Ag/AgCl (3 M KCl) was the reference electrode, the electrodeposited Cu was the working electrode, and platinum (Pt) foil was the counter electrode. The electrodeposition was performed via a cyclic voltammetry method in a potential range of −0.6 V and −2.0 V, with the scanning rate of 50 mV s$^{-1}$.

SSC Ionomer Deposition

The Py molecule coated Cu catalysts were then modified by spray deposition of 10-15 nm thick ionomer layer from a solution containing 16.88 μl cation exchange perfluorosulfonic acid (PFSA) ionomer with short-side-chain (SSC) (Aquivion® D79-25BS) and 3 mL methanol (99.8%, anhydrous, Sigma Aldrich®). Prior to the spray deposition, SSC ionomer and methanol solution was sonicated for 1 h to ensure homogeneous dispersion of polymeric binder in the solvent. The resulting electrode was then dried overnight under room conditions prior to performance testing.

Materials Characterization

Scanning electron microscopy (SEM) imaging and energy dispersive X-ray (EDX) elemental mapping of the electrodes were carried out in a high-resolution scanning electron microscope (HR-SEM, Hitachi S-5200). X-ray photoelectron spectroscopy (XPS) measurements were performed in ECSA system (PHI 5700), equipped with Al Kα X-ray energy source (1486.6 eV). Transmission electron microscopy (TEM) images were collected by using a field emission transmission electrode microscope (Hitachi HF3300). Grazing incidence wide-angle X-ray scattering (GIWAXS) measurements were performed at beamline Spring-8 BL-12B2 of the National Synchrotron Radiation Center (NSRRC). Operando Raman measurements were carried out via inVia Raman Microscope equipped with a water immersion objective (63×, Leica Microsystems), a 785 nm laser, and a modified flow electrolyzer having a Ag/AgCl (3 M KCl) reference electrode and a platinum (Pt) counter electrode. The Raman spectra represent the average of 5 screens and were obtained via the commercial software (version 4.4, Renishaw WiRE).

Electrocatalytic Measurement of CO-to-$C_2H_4$ Conversion

The electrocatalytic measurements of CO—$C_2H_4$ conversion were performed in a membrane electrode assembly (MEA) electrolyzer (Dioxide Materials®, 5 cm$^{-2}$ geometric active surface area). Cu:Py:SSC electrodes were used as the cathodes.

To fabricate the Ti—$IrO_2$ anode electrodes for OER, commercially available titanium (Ti) meshes (Fuel Cell Store) were first etched in a boiling solution of 6 M HCl for 30 min. The etched Ti screens were then immersed into a solution comprised of iridium (IV) oxide dehydrate (Premion®, 99.99% metals basis, Ir 73 min, Alfa Easer®), isopropanol (Sigma-Aldrich®), and HCl (ACS reagent, 37%, Sigma-Aldrich®), and were sequentially dried and sintered. The last two steps of the procedure were repeated until the total Ir loading of 2 mg cm$^{-2}$ was achieved. AEM membranes (4×4 cm$^{-2}$, Sustainion® X37-50 grade 60, Dioxide Materials™) were activated in 1 M KOH solution for at least 24 h before testing.

To fabricate the Pt—C anode electrodes for GOR, commercially available platinum on graphitized carbon powder (Sigma Aldrich®, Pt—C, 40 wt. % Pt on Vulcan XC72) was first physically mixed with SSC ionomer (Aquivion® D79-25BS) in a glass beaker and then sonicated of the ink for 1 h. The resulting catalyst ink was then spray coated on both sides of the hydrophilic carbon cloth until the Pt loading of 0.5 mg cm$^{-2}$ achieved.

During the performance testing, KOH solutions (for OER) or KOH+glucose solutions (for GOR) were supplied to the anode flow field with a flow rate of 10 mL min$^{-1}$, and humidified CO was fed into the cathode flow field with the constant flow rate of 80 sccm. The reaction was initiated by applying a negative potential. The voltage increments were made with sufficiently small increments upon completion of at least 15 min stable operation. The gas products were analyzed by injecting the gas samples collected in 1 mL volumes via gas-tight syringes (Hamilton®) in a gas chromatography (GC, PerkinElmer Clarus 580) equipped with a flame ionization detector (FID) and a thermal conductivity detector (TCD).

For the extended CORR operations, the MEA electrolyzer was operated at constant current densities of 150 mA cm$^{-2}$ (for MEA only) and 120 mA cm$^{-2}$ (for cascade SOEC-MEA system). The gas products were collected at frequent time intervals, and for each data point, three continuous injections were made, and thus each selectivity point presented was calculated by averaging the FE values obtained from three consecutive injections.

$CO_2$-to-$C_2H_4$ Measurements in the Cascade SOEC-MEA System

An open flanges solid oxide electrolysis cell (SOEC) setup (Fiaxell SOFC Technologies, Switzerland), equipped a 25 mm electrode-supported cell (Fuel cell materials, USA), was used to convert $CO_2$ into CO. The cell possessed a geometric active area of 1.2 cm$^2$. The SOEC set-up was operated at 800° C. and 815 mA cm$^{-2}$ with a $CO_2$ inlet flow rate of 15 sccm. The outlet of the SOEC setup was connected to a $CO_2$ capture solution containing 30% wt aqueous ethanolamine solution. The purified CO was then supplied to the MEA electrolyzer for ethylene ($C_2H_4$) electrolysis from CO. In the MEA electrolyzer, 3 M KOH was used as the anolyte, and the CO-to-$C_2H_4$ conversion was performed at current densities in the range of 20 and 200 mA cm$^{-2}$ Faradaic Efficiency (FE) and Energy Efficiency (EE) Calculations Faradaic efficiency (FE) towards any gas product was calculated by using the following equation:

$$\text{Faradaic Efficiency} = \frac{F n_a V_{gas} c_a}{i_{overall} V_m} \quad (1)$$

where F stands for the Faraday constant, $n_a$ stands for the number of electron transfer needed for the production of 1 mol of product α, $V_{gas}$ stands for the flow rate of supplied gas, $c_a$ stands for the detected concentration of product α via gas chromatography (ppm), $i_{overall}$ stands for the overall current measured, and $V_m$ stands for the unit molar volume of supplied gas.

The full-cell energy efficiency (EE) of the MEA electrolyzer towards ethylene ($C_2H_4$)) production was calculated by using the expression given below:

$$\text{Energy Efficiency } (EE) = \frac{E_{C_2H_4-thermo} FE_{C_2H_4}}{E_{full-cell}} \quad (2)$$

where $E_{C_2H_4-thermo}$ represents the thermodynamic cell potential for $C_2H_4$ (−1.06 V for CO-to-$C_2H_4$), $FE_{C_2H_4}$ represents the FE towards $C_2H_4$, and $E_{full-cell}$ represents the full-cell voltage applied.

Liquid products of CORR and GOR were analyzed by nuclear magnetic resonance spectrometer Agilent DD2 600 MHz) by using dimethylsulfoxide as an internal standard.

CO Diffusion Modelling

The concentration of CO in the electrolyte and present at the catalyst's surface was determined using a one-dimensional (1D) reaction-diffusion model. Unlike the $CO_2$ model, CO diffusion into the electrolyte at 0 mA cm$^{-2}$ does not directly affect the local pH or change the concentration of CO or OH$^-$ as a function of distance into the electrolyte. The governing equations for the simulation are shown below and extend from the gas-liquid interface of the gas-diffusion layer at x=0 μm to an assumed diffusion layer boundary thickness of x=500 μm into the electrolyte.

$$\frac{\partial [CO]}{\partial t} = D_{CO} \frac{\partial^2 [CO]}{\partial x^2} - R_{CO} \quad (3)$$

$$\frac{\partial [OH^-]}{\partial t} = D_{OH^-} \frac{\partial^2 [OH^-]}{\partial x^2} + R_{OH} \quad (4)$$

where RCO and ROH account for the consumption of CO in the reduction reaction and the production of OH$^-$, respectively. These reactions are assumed to occur homogeneously throughout the catalyst layer such that the source and sink of CO and OH$^-$ are spatially dependent:

$$R_{CO} = \frac{j}{F} \left( \frac{FE_{ethylene+enthanol}}{n_{ethylene}} + \frac{FE_{acetate}}{n_{acetate}} + \frac{FE_{n-propanol}}{n_{n-propanol}} \right) \frac{1}{\varepsilon L_{catalyst}}, \quad (5)$$
$$0 \leq x \leq L_{catalyst}$$

$$R_{OH} = \frac{j}{F} \frac{1}{\varepsilon L_{catalyst}}, 0 \leq x \leq L_{catalyst} \quad (6)$$

where F is the Faraday's constant and taken as 96485 C mol$^{-1}$ and j is the geometric current density. As was done previously, a catalyst layer porosity, ε, of 60% was assumed. Based upon the experimental results, product selectivities of 15% hydrogen, 50% ethylene+ethanol, 10% acetate, and 25% n-propanol are assumed for all simulations to approximately account for the number of electrons transferred per CO molecule consumed. A reaction thickness of 100 nm was assumed for the catalyst layer ($L_{catalyst}$=100 nm). The maximum solubility of CO in the electrolyte was modelled using Henry's constant at 1 atm and 298 K as well as taking salting out effects into account via the Sechenov equation.

A no-flux boundary condition was imposed at the left-hand boundary for OH$^-$ while the concentration of CO was initially described by the solubility of CO in the imposed KOH concentration and partial pressure conditions. Both CO and KOH were fixed to their bulk electrolyte concentrations at the boundary layer thickness of 500 μm. The concentration profiles of CO and OH$^-$ were then found at steady state for a variety of KOH concentrations, partial pressures, and current densities.

Techno-Economic Assessment (TEA).

This section describes the TEA model used for all cost calculations. Details of calculating the cost of producing CO in a SOEC are further provided. All other electrolyzer systems use the same base model outlined here, but inputs vary between each setup and these differences will be highlighted.

The general model calculates the cost of producing 1 ton of product (CO for the case of SOEC) in a plant with a production rate of 1 ton per day, starting from $CO_2$. It is assumed that the only by-product produced on the cathode side is hydrogen and that the anode performs OER, producing only oxygen. Once the total amount of electrolyzer materials, input chemicals, and electricity are purchased, there are some external systems that are modelled. At the cathode output, a pressure swing adsorption (PSA) gas separation module is modelled to separate product from hydrogen and unreacted $CO_2$ so that the product can be sold, and the $CO_2$ can be recycled back into the electrolyzer input. Similarly, a PSA gas separation module is modelled at the anode output to separate $O_2$ from any $CO_2$ that crosses through the membrane and bubbles out of the electrolyte. Once again, the $CO_2$ recovered from this separation can be recycled back to the electrolyzer input. For alkaline systems, there will be a lot of $CO_2$ lost to carbonate in the KOH electrolyte. In order to recover this $CO_2$ and electrolyte, a regenerative calcium cycle is used. Finally, for the SOEC, which must be run at high temperature, the cost required to heat the electrolyzer materials and chemical inputs is calculated. All these aspects are combined into a final cost per ton of product.

SOEC Input Parameters

For costs of CO produced in SOEC for the base case, the following input parameters were used. These values will be used for the sample calculation and are shown in table 21.

TABLE 21

| SOEC input parameters | |
|---|---|
| Parameters | Value |
| $CO_2$ Cost ($ ton$^{-1}$) | 30 |
| Electricity cost ($ kWh$^{-1}$) | 0.03 |
| Electrolyzer cost ($/kW$^{-1}$) | 250 |
| Balance of plant (%) | 50 |
| Lang factor | 1 |
| Capacity factor | 0.9 |
| Cell voltage (V) | 1.3 |
| Faradaic efficiency (%) | 100 |
| Current density (mA cm$^{-2}$) | 800 |
| Single pass conversion (%) | 40 |
| $CO_2$ crossover factor | 0 |
| System lifetime (year) | 30 |
| Catalyst/membrane lifetime (year) | 5 |
| Operation Temperature (° C.) | 800 |
| Discount Rate (%) | 5 |

Input $CO_2$

First, the amount of $CO_2$ required to produce 1 ton of CO with 100% efficiency was determined. All losses of $CO_2$ will be accounted for in other calculations that recycle $CO_2$ so that no new $CO_2$ is needed to be purchased. Also, even though the FE towards ethylene ($C_2H_4$) is sometimes less than 100%, the only other product was assumed to be $H_2$. (Since $H_2$ is formed from $H_2O$, not $CO_2$, no more $CO_2$ needs to be bought to account for this.)

The calculation is given by:

$$CO_2 \text{ required} \left[\frac{\text{tonne } CO_2}{\text{tonne } CO}\right] = CO \text{ output} \left[\text{tonne } \frac{CO}{\text{day}}\right] \times \frac{\text{molecular weight}_{CO2}\left[\frac{g}{\text{mol}}\right]}{\text{molecular weight}_{CO}\left[\frac{g}{\text{mol}}\right]} \times \text{molar ratio}\left[\frac{CO_2}{CO}\right] \quad (1a)$$

Plugging in numbers gives μs:

$$CO_2 \text{ required}\left[\frac{\text{tonne } CO_2}{\text{tonne } CO}\right] = 1 \text{ tonne } \frac{CO}{\text{day}} \times \frac{44 \frac{g}{\text{mol}}}{28 \frac{g}{\text{mol}}} \times 1 = 1.5714 \frac{\text{tonne } CO_2}{\text{tonne } CO} \quad (1b)$$

This number is then multiplied by the market price of $CO_2$ to find the cost component for the TEA. A 2015 $CO_2$ price forecast used 25 $/short ton (1 short ton=907.18 kg) as their 'high case' cost. This gives a metric price of ~28 $/ton and after rounding, the price used in this work was found to be 30 $/ton. The final cost of $CO_2$ per ton of ethylene ($C_2H_4$) in the presented model is:

$$\text{Cost of imput } CO_2\left[\frac{\$}{\text{tonne } CO}\right] = 30 \frac{\$}{\text{tonne } CO_2} \times 1.5714 \frac{\text{tonne } CO_2}{\text{tonne } CO} = 47.14 \frac{\$}{\text{tonne } CO} \quad (2)$$

Electrolyzer Cost

The electrolyzer cost for a SOEC is based on a cost estimate of ~250 $ kW$^1$ for 25 kW solid oxide fuel cell water electrolyzers (SOFCs) when 50 000 units are purchased. These SOFCs had a performance objective of 400 mA cm$^{-2}$ which was used as a reference current density during cost calculations. To find the cost of the electrolyzer, the total power needed was first found and multiplied by the cost per kW provided above. Next, this cost was scaled by the input current density and reference current density (see below) in order to consider the area of electrolyzer required. (If the current density is halved, double the amount of electrolyzer material is needed.)

First, the moles of product formed per second in order to produce 1 ton CO per day are determined.

$$CO\ production\left[\frac{mol}{s}\right] = \frac{CO\ production\left[\frac{g}{day}\right]}{molecular\ weight_{CO}\left[\frac{g}{mol}\right] \times 86400\left[\frac{s}{day}\right]} \quad (3a)$$

$$CO\ production\left[\frac{mol}{s}\right] = \frac{1 \times \frac{10^6\ g}{day}}{\frac{28\ g}{mol} \times \frac{86400\ s}{day}} = 0.41336\frac{mol}{s} \quad (3b)$$

Next, the total current needed to produce this much CO is determined, taking into account the loss of electrons if the FE is below 100%. (In the case of the SOEC, FE was assumed to be 100%.)

$$Total\ current\ needed\ [A] = \frac{CO\ production\left[\frac{mol}{s}\right] \times electrons\ transferred \times Faraday's\ Constant}{FE[decimal]} \quad (4a)$$

Plugging in:

$$Total\ current\ needed\ [A] = \frac{0.41336\frac{mol}{s} \times 2 \times 96485\frac{sA}{mol}}{1} = 79766\ A \quad (4b)$$

Now, multiplying by cell voltage (1.3 V) to give the power consumed:

Power Consumed [W]=Total current needed [A]× Cell voltage [V]=79 766 A×1.3 V=103.70 kW   (5)

Multiplying by the price of electrolyzer and scaling by the current density gives:

Total Electrolyzer Cost ($) = Power Consumed [kW] ×

$$Electrolyzer\ Cost\left[\frac{\$}{kW}\right] \times \frac{base\ current\ density\left[\frac{mA}{cm^2}\right]}{input\ current\ density\left[\frac{mA}{cm^2}\right]} \quad (6a)$$

Plugging in the input current density of 800 mA/cm$^{-2}$ with the base current density of 400 mA cm$^{-2}$:

Total Electrolyzer Cost ($) =

$$103.70\ kW \times 250\frac{\$}{kW} \times \frac{400\frac{mA}{cm^2}}{800\frac{mA}{cm^2}} = \$12962.50 \quad (6b)$$

This is the total one-time cost for all the electrolyzer material, so to find the cost per ton of CO, a yearly cost was found assuming zero salvage value at the end of the plant's lifetime and dividing this by the number of operating days of the plant to find a daily cost. This process is used for all capital costs and starts by calculating a capital recovery factor (CRF) based on discount rate, i, and the lifetime of the materials.

$$CRF_{eletrolyzer} = \frac{i(1+i)^{lifetime}}{(1+i)^{lifetime} - 1} \quad (7a)$$

Plugging in a discount rate of 5% and an assumed lifetime of 30 years for the electrolyzer:

$$CRF_{electrolyzer} = \frac{0.05(1.05)^{30}}{(1.05)^{30} - 1} = 0.065051 \quad (7B)$$

The CRF was multiplied by the total cost of electrolyzer to find an annuity to pay off the plant. The latter is then divided by the total number of days the plant is operational in a year to find the cost per ton of CO. The plant was assumed to operate for 90% of the days in a year, thus giving a capacity factor of 0.9 (This is equivalent to operating 328.5 days a year). This gives the following:

$$Eletrolyser\ cost\left[\frac{\$}{tonne\ CO}\right] = \frac{CRF_{electrolyser} \times Total\ Electrolyster\ Cost\ [\$]}{Capacity\ factor \times 365\left[\frac{days}{year}\right] \times production\left[\frac{tonne\ CO}{day}\right]} \quad (8a)$$

Assuming a capacity factor of 0.9 gives:

$$Electrolysrer\ cost\left[\frac{\$}{tonne\ CO}\right] = \frac{0.065051 \times \$12962.50}{0.9 \times 365\frac{days}{year} \times 1\frac{tonne\ CO}{day}} = 2.57\frac{\$}{tonne\ CO} \quad (8b)$$

This is very small cost of electrolyzer because not many electrons need to be transferred and the current density is so high that not much electrolyzer material is needed to do so.

Catalyst and Membrane

The catalyst and membrane costs in the model are calculated by assuming their total cost is 5% of the total electrolyzer cost. A lifetime of 5 years is used for these components, instead of the 30 years for the electrolyzer. For these materials, the CRF is:

$$CRF_{C\&M} = \frac{i(1+i)^{lifetime}}{(1+i)^{lifetime} - 1} = \frac{0.05(1.05)^5}{(1.05)^5 - 1} = 0.23097 \quad (9)$$

Now a price for the catalyst and membrane per ton of CO can be found:

$$C \text{ and } M \text{ cost} \left[\frac{\$}{\text{tonne CO}}\right] = \tag{10a}$$

$$\frac{CRF_{C\&M} \times \text{Total } Electrolyser \text{ Cost}[\$] \times 0.05}{\text{Capacity factor} \times 365\left[\frac{\text{days}}{\text{year}}\right] \times \text{production}\left[\frac{\text{tonne CO}}{\text{day}}\right]}$$

Plugging in values:

$$C \text{ and } M \text{ cost} \left[\frac{\$}{\text{tonne CO}}\right] = \tag{10b}$$

$$\frac{0.23097 \times \$12962.50 \times 0.05}{0.9 \times 365 \frac{\text{days}}{\text{year}} \times 1 \frac{\text{tonne CO}}{\text{day}}} = 0.46 \frac{\$}{\text{tonne CO}}$$

Electricity Cost

To find the cost of electricity, the calculation of power consumed from Eq. (5) can be provided. The latter is multiplied by 24 hours to find the energy required to produce 1 ton of CO (as the production rate is 1 ton CO per day) and multiply by the electricity cost. Here, an electricity price of 3 ¢kWh$^{-1}$ was used, taken from recent onshore wind power auctions. The cost of electricity can be calculated as:

$$\text{Cost of electricity} \left[\frac{\$}{\text{tonne CO}}\right] = \tag{11a}$$

$$\frac{\text{Power } Cons[\text{kW}] \times 24 \, h \times \text{electricity price}\left[\frac{\$}{\text{kWh}}\right]}{\text{CO production}\left[\frac{\text{tonne CO}}{\text{day}}\right]}$$

Plugging in values gives:

$$\text{Cost of electricty} \left[\frac{\$}{\text{tonne CO}}\right] = \tag{11b}$$

$$\frac{103.70 \text{ kW} \times 24 \, h \times \frac{0.03\$}{\text{kWh}}}{1 \frac{\text{tonne CO}}{\text{day}}} = 74.66 \frac{\$}{\text{tonne CO}}$$

Other Operating Costs

This component adds an additional 10% of the electricity costs to account for maintenance and labour during plant operation.

$$\text{Other operating cost} \left[\frac{\$}{\text{tonne CO}}\right] = \tag{12a}$$

$$\text{Cost of electricity} \left[\frac{\$}{\text{tonne CO}}\right] \times 0.1$$

This gives:

$$\text{Other operating costs} \left[\frac{\$}{\text{tonne CO}}\right] = \tag{12b}$$

$$74.66 \frac{\$}{\text{tonne CO}} \times 0.1 = 7.47 \frac{\$}{\text{tonne CO}}$$

Cathode Separation

For separation on the anode and cathode outputs, a pressure swing adsorption (PSA) separation unit is used based on a model built for biogas upgrading. For the TEA, a reference cost of S1 989 043 per 1000 m3 hour$^1$ capacity with a scaling factor of 0.7 and electricity requirements given by 0.25 kWh m$^{-3}$ were used. The capital and operating costs for this system were modelled as:

$$PSA \text{ Capital Cost}[\$] = \$1989043 \times \left(\frac{\text{flow rate}\left[\frac{m^3}{\text{hour}}\right]}{1000 \frac{m^3}{\text{hour}}}\right)^{0.7} \tag{13}$$

$$PSA \text{ Operating Cost}\left[\frac{\$}{\text{tonne CO}}\right] = \tag{14}$$

$$0.25 \frac{\text{kWh}}{m^3} \times \text{flow rate}\left[\frac{m^3}{\text{hour}}\right] \times 24 \frac{\text{hour}}{\text{day}} \times \text{electricity price}\left[\frac{\$}{\text{kWh}}\right]$$

To calculate these costs, the flow rate at the cathode output is to be found. This is done by first finding the flow rate of produced CO per hour assuming an ideal gas, standard conditions, and a constant rate of production. Although the gases inside the electrolyzer are held at 800° C., sufficient time and tubing for the cathode output was assumed to return to room temperature before it enters the PSA unit:

$$\text{Output CO flow rate}\left[\frac{m^3}{\text{hour}}\right] = \tag{15}$$

$$\frac{10^6 g \times 8.314 \, J mol^{-1} K^{-1} \times 298 \, K}{28 \frac{g}{\text{mol}} \times 101300 \, Pa \times 24 \frac{\text{hour}}{\text{day}}} = 36.395 \frac{m^3}{\text{hour}}$$

Now, assuming constant pressure, the flow rate of $CO_2$ out of the cathode can be found using a given single-pass conversion. Note: this single-pass conversion must be updated if $CO_2$ is lost to carbonate formation and only represents the amount of $CO_2$ that is reduced to any product vs the $CO_2$ that passes through the cathode stream, unreacted. Since there is no carbonate formed in the SOEC, the overall single-pass conversion of 40% can be used for this conversion metric:

$$\text{Output } CO_2 \text{ flow rate}\left[\frac{m^3}{\text{hour}}\right] = \tag{16a}$$

$$\frac{\text{CO flowrate}\left[\frac{m^3}{\text{hour}}\right] \times \text{molar ratio}\left[\frac{CO_2}{CO}\right]}{\frac{singlepass \text{ conversion}[\%]}{100}} \times$$

$$\left(\frac{100 - singlepass \text{ conversion}[\%]}{100}\right)$$

Plugging in values gives:

$$\text{Output } CO_2 \text{ flowrate}\left[\frac{m^3}{hour}\right] = \quad (16b)$$

$$\frac{36.395\frac{m^3}{hour} \times 1}{\frac{40}{100}} \times \frac{100-40}{100} = 54.593\frac{m^3}{hour}$$

Next, the assumption that the only other product is $H_2$ is used. We can find the amount of current that goes towards $H_2$ as:

$$\text{Current towards } H_2[A] = \text{Total current needed}[A] \times \frac{100 - FE_{CO}[\%]}{100} \quad (17a)$$

However, since a FE of 100% is used for the SOEC, this means there will be no $H_2$ in the cathode output stream. The calculation is still provided here as it is required for all other systems in the TEA.

$$\text{Current towards } H_2[A] = 79766 \; A \times 0 = 0 \; A \quad (17b)$$

In other systems, the moles of $H_2$ produced per hour would be found:

$$H_2 \text{ production}\left[\frac{mol}{hour}\right] = \frac{\text{Current towards } H_2[A] \times 3600\frac{s}{hour}}{2\frac{electrons}{H_2 \, product} \times \text{Faraday's Constant}} \quad (18a)$$

$$H_2 \text{ production}\left[\frac{mol}{hour}\right] = \frac{0 \; A \times 3600\frac{s}{hour}}{2\frac{electrons}{H_2 \, product} \times 96485\frac{sA}{mol}} = 0\frac{mol}{hour} \quad (18b)$$

Assuming standard conditions and an ideal gas, the flow rate in $m^3 \, hour^{-1}$ is as follows:

$$flowrate_{H2}\left[\frac{m^3}{hour}\right] = \frac{H_2 \text{ production}\left[\frac{mol}{hour}\right] \times 8.314\frac{J}{mol \times K} \times 298K}{101.3 \times 10^3 Pa} \quad (19a)$$

$$\text{flow rate}_{H2}\left[\frac{m^3}{hour}\right] = \frac{0\frac{mol}{hour} \times 8.314\frac{J}{mol \times K} \times 298K}{101.3 \times 10^3 Pa} = 0\frac{m^3}{hour} \quad (19b)$$

Then, the final flow rate can be determined by adding Eqs. (15), (16b), and (19b):

$$\text{flow rate}\left[\frac{m^3}{hour}\right] = (36.395 + 54.592 + 0)\frac{m^3}{hour} = 90.988\frac{m^3}{hour} \quad (20)$$

Using this, the capital and operating costs are calculated using Eq. (13) and (14):

$$PSA \text{ Capital Cost}[\$] = \$1\,989\,043 \times \left(\frac{90.988\frac{m^3}{hour}}{1000\frac{m^3}{hour}}\right)^{0.7} = \$371\,477.96 \quad (13a)$$

$$PSA \text{ Operating Cost}\left[\frac{\$}{\text{tonne CO}}\right] = \quad (14a)$$

$$0.25\frac{kWh}{m^3} \times 90.988\frac{m^3}{hour} \times 24\frac{hour}{day} \times 0.03\frac{\$}{kWh} = 16.38\frac{\$}{\text{tonne CO}}$$

Finally, the capital cost per ton of CO can be calculated by adapting Eq. (8a) and assuming the same lifetime as the electrolyzer (30 years):

$$PSA \text{ Capital Cost}\left[\frac{\$}{\text{tonne CO}}\right] = \quad (21a)$$

$$\frac{CRF_{electrolyzer} \times PSA \text{ Capital Cost}[\$]}{\text{Capacity Factor} \times 365\left[\frac{days}{year}\right] \times \text{production}\left[\frac{\text{tonne CO}}{day}\right]}$$

$$PSA \text{ Capital Cost}\left[\frac{\$}{\text{tonne CO}}\right] = \quad (21b)$$

$$\frac{0.065051 \times \$371\,477.96}{0.9 \times 365\frac{days}{year} \times 1\frac{\text{tonne CO}}{day}} = 73.56\frac{\$}{\text{tonne CO}}$$

Heating

The SOEC in the proposed cascade system is modelled at high temperature. By running at high temperature, the costs associated with heating the system and bringing the inputs to temperature can be included. For this, heating input $CO_2$ and the electrolyzer cell (nichrome was assumed to be the material) to 800° C. from 25° C. is considered with a heating efficiency of 50%. Note: heating costs per ton of CO are reported which is easy to do for $CO_2$ as it is continuously flowing. However, for the electrolyzer, it is unclear how much heating is required to keep it at temperature as this depends on its insulation from the surrounding environment. Due to this uncertainty, the electrolyzer is assumed to be needing to be heated from 25° C. to 800° C. for every ton of CO produced. For $CO_2$ and the nichrome (which do not have a phase change in this temperature range), the energy required to heat can be calculated as:

$$\text{Energy to heat}[J] = \text{Heat Capacity}\left[\frac{J}{kg \times K}\right] \times \Delta T[K] \times \text{mass}[kg] \quad (22a)$$

For $CO_2$, with a heat capacity of 843 J/(kg K) in gas form, the mass of $CO_2$ required to heat for 1 ton of output CO can be calculated from Eq. (1b) and divided by the single-pass conversion to account for unreacted $CO_2$:

$$\text{Input Mass}_{CO2}\left[\frac{kg \, CO_2}{\text{tonne CO}}\right] = \quad (1c)$$

$$\frac{1000 \, kg \, CO \times 44\frac{g}{mol}}{28\frac{g}{mol}} \times \frac{1}{\text{singlepass conversion[decimal]}}$$

$$\text{Input Mass}_{CO2}\left[\frac{kg \, CO_2}{\text{tonne CO}}\right] = \quad (1d)$$

$$\frac{1000 \, kg \, CO \times 44\frac{g}{mol}}{28\frac{g}{mol}} \times \frac{1}{0.4} = 3928.58\frac{kg \, CO_2}{\text{tonne CO}}$$

For nichrome, the mass required to bring to temperature is found by assuming a constant electrolyzer thickness of 5 cm. Then, by multiplying by the total area required and the density of nichrome (8400 kg m$^{-3}$), the total mass is obtained. To do this, the total current needed for the SOEC cell to produce 1 ton of CO per day is determined using Eq. (4b). The latter is used to find the surface area as follows:

$$\text{Surface area of electrolyzer}[m^2] = \tag{23a}$$

$$\frac{\text{Total current needed[mA]}}{\text{Current density}\left[\frac{mA}{cm^2}\right] \times \left(\frac{100\,cm}{1\,m}\right)^2}$$

$$\text{Surface area of electrolyzer}[m^2] = \tag{23b}$$

$$\frac{79\,766\,000\,mA}{800\frac{mA}{cm^2} \times \left(\frac{100\,cm}{1\,m}\right)^2} = 9.9708\,m^2$$

Finally, the surface area can be used to find the total mass of nichrome:

$$\text{Mass}_{nichrome}[kg] = \tag{24a}$$

$$\text{Surface area of electrolyzer}[m^2] \times \text{thickness}[m] \times \text{density}\left[\frac{kg}{m^3}\right]$$

$$\text{Mass}_{nichrome}[kg] = 9.9708\,m^2 \times 0.05\,m \times 8400\frac{kg}{m^3} = 4187.7\,kg \tag{24b}$$

Now that the mass of $CO_2$ and nichrome required to heat per ton of CO is determined, the energy required can be calculated using Eq. (22a):

$$\text{Energy to heat}_{CO2}\left[\frac{J}{\text{tonne CO}}\right] = \tag{22a}$$

$$\text{Heat Capacity}_{CO2}\left[\frac{J}{kg \times K}\right] \times \Delta T[K] \times \text{Mass}_{CO2}\left[\frac{kg}{\text{tonne CO}}\right]$$

$$\text{Energy to heat}_{CO2}\left[\frac{GJ}{\text{tonne CO}}\right] = 843\frac{J}{kg \times K} \times (800-25)K \times 3928.58\frac{kg\,CO_2}{\text{tonne CO}} \tag{22b}$$

$$= 2.5666\frac{GJ}{\text{tonne CO}}$$

Now for nichrome:

$$\text{Energy to heat}_{nichrome}\left[\frac{GJ}{\text{tonne CO}}\right] = 460\frac{J}{kg \times K} \times (800-25)K \times 4187.7\,kg \tag{22c}$$

$$= 1.4929\frac{GJ}{\text{tonne CO}}$$

The cost of heating these materials can be determined by using the cost of electricity (0.03 $ kWh$^{-1}$) and a heating efficiency of 50%:

$$\text{Heating Cost}_{CO2}\left[\frac{\$}{\text{tonne CO}}\right] = \text{Energy to heat}_{CO2}\left[\frac{GJ}{\text{tonne CO}}\right] \times \tag{25a}$$

$$\frac{1\,kWh}{0.0036\,GJ} \times \text{Electricity Price}\left[\frac{\$}{kWh}\right] \times \frac{1}{\text{Heating efficiency}[\%]}$$

$$\text{Heating Cost}_{CO2}\left[\frac{\$}{\text{tonne CO}}\right] = 2.5666\frac{GJ}{\text{tonne CO}} \times \frac{1\,kWh}{0.0036\,GJ} \times 0.03\frac{\$}{kWh} \times \frac{1}{0.5} \tag{25b}$$

$$42.78\frac{\$}{\text{tonne CO}}$$

$$\text{Heating Cost}_{nichrome}\left[\frac{\$}{\text{tonne CO}}\right] = 1.4929\frac{GJ}{\text{tonne CO}} \times \frac{1\,kWh}{0.0036\,GJ} \times 0.03\frac{\$}{kWh} \times \frac{1}{0.5} \tag{25c}$$

$$= 24.88\frac{\$}{\text{tonne CO}}$$

Balance of Plant and Installation Costs

To account for peripheral equipment surrounding the electrolyzer, a Balance of Plant (BoP) cost can be estimated by adding 50% of all capital costs to the final cost of CO. Similarly, installation costs can be estimated by using a Lang factor of 1. As a result, 1.5 times the current capital costs are added to estimate these additional costs. Note: to find the total capital costs, the cost of electrolyzer, catalyst and membrane, anode separation capital, and cathode separation capital are added:

$$\text{Total Capital Costs}\left[\frac{\$}{\text{tonne CO}}\right] = \quad (26)$$

$$(2.57 + 0.46 + 73.56 + 0)\frac{\$}{\text{tonne CO}} = 76.59\frac{\$}{\text{tonne CO}}$$

$$BoP\left[\frac{\$}{\text{tonne CO}}\right] = BoP\ \text{Factor} \times \text{Total Capital Costs}\left[\frac{\$}{\text{tonne CO}}\right] \quad (27a)$$

$$BoP\left[\frac{\$}{\text{tonne CO}}\right] = 0.5 \times 76.59\frac{\$}{\text{tonne CO}} = 38.30\frac{\$}{\text{tonne CO}} \quad (27b)$$

Now, installation costs:

$$\text{Installation Cost}\left[\frac{\$}{\text{tonne CO}}\right] = \quad (28a)$$

$$\text{Lang Factor} \times \text{Total Capital Costs}\left[\frac{\$}{\text{tonne CO}}\right]$$

$$\text{Installation Cost}\left[\frac{\$}{\text{tonne CO}}\right] = \quad (28b)$$

$$1 \times 76.59\frac{\$}{\text{tonne CO}} = 76.59\frac{\$}{\text{tonne CO}}$$

Final Summation

Now, all the bolded costs above are summed to find the total cost of producing 1 ton of CO:

$$\text{Cost of CO}\left[\frac{\$}{\text{tonne CO}}\right] = 404.77\frac{\$}{\text{tonne CO}} \quad (29)$$

The next sections will outline cost calculations that are not relevant to the SOEC system. These include the cost of electrolyte, anode separation of crossover $CO_2$ from OER $O_2$, and regeneration of $CO_2$ and electrolyte that was lost to KOH. Note that all costs from now on will be reported per ton of $C_2H_4$ as they are used in $CO_2RR$ to $C_2H_4$ or CORR to $C_2H_4$ systems.

Anode Separation (MEA Cell Only)

The anode separation uses the same model for a PSA separation module as the cathode separation, but this time separates $CO_2$ from $O_2$ depending on the input $CO_2$ crossover ratio for an MEA cell. For an alkaline flow cell and SOEC, zero cost associated with anode separation is assumed as only $O_2$ will exit the anode output stream. First, the flow rate of $O_2$ out of the anode is found while assuming standard conditions, ideal gases, and constant pressure:

$$\text{Output } C_2H_4\ \text{flowrate}\left[\frac{m^3}{\text{hour}}\right] = \quad (30)$$

$$\frac{10^6 g \times 8.314\ J\,mol^{-1}K^{-1} \times 298\,K}{28\frac{g}{mol} \times 101\,300\,Pa \times 24\frac{\text{hour}}{\text{day}}} = 36.395\frac{m^3}{\text{hour}}$$

$$\text{flow rate}_{O2}\left[\frac{m^3}{\text{hour}}\right] = \text{flowrate}_{C2H4}\left[\frac{m^3}{\text{hour}}\right] \times \text{mole ratio}\left[\frac{O_2}{C_2H_4}\right] = \quad (31)$$

$$36.395\frac{m^3}{\text{hour}} \times 3 = 109.185\frac{m^3}{\text{hour}}$$

Now, the flow rate of $CO_2$ on the anode side can be further found due to crossover. For MEA, approximately 3 molecules of $CO_2$ crossover for every molecule of $CO_2$ that is reduced to any product was determined. Therefore, the flow rate of $CO_2$ can read as follows:

$$\text{flowrate}_{CO2}\left[\frac{m^3}{\text{hour}}\right] = \quad (32a)$$

$$\text{flowrate}_{C2H4}\left[\frac{m^3}{\text{hour}}\right] \times \text{mole ratio}\left[\frac{CO_2}{C_2H_4}\right] \times \text{crossover}\left[\frac{\text{crossover } CO_2}{\text{reduced } CO_2}\right]$$

Plugging in the crossover ratio:

$$\text{flowrate}_{CO2}\left[\frac{m^3}{\text{hour}}\right] = 36.395\frac{m^3}{\text{hour}} \times 2 \times 3 = 218.37\frac{m^3}{\text{hour}} \quad (32b)$$

Summing these flow rates gives the total flow rate out of the anode:

$$\text{Total anode flowrate}\left[\frac{m^3}{\text{hour}}\right] = \text{flowrate}_{CO2}\left[\frac{m^3}{\text{hour}}\right] + \text{flowrate}_{O2}\left[\frac{m^3}{\text{hour}}\right] \quad (33a)$$

$$\text{Total anode flowrate}\left[\frac{m^3}{\text{hour}}\right] = \quad (33b)$$

$$(218.37 + 109.185)\frac{m^3}{\text{hour}} = 327.555\frac{m^3}{\text{hour}}$$

Now that the total flow rate is determined, the operating and capital costs can be calculated using Eq. (13) and (14):

$$PSA\ \text{Capital Cost}[\$] = \$1\,989\,043 \times \left(\frac{327.555\frac{m^3}{\text{hour}}}{1000\frac{m^3}{\text{hour}}}\right)^{0.7} = \$910\,632.48 \quad (34)$$

$$PSA\ \text{Operating Cost}\left[\frac{\$}{\text{tonne } C_2H_4}\right] = 0.25\frac{kWh}{m^3} \times 327.555\frac{m^3}{\text{hour}} \times 24\frac{\text{hour}}{\text{day}} \times 0.03\frac{\$}{kWh} \quad (35)$$

$$= 58.96\frac{\$}{\text{tonne } C_2H_4}$$

Finally, the capital costs per ton of $C_2H_4$ can be determined using Eq. (8a) and assuming a lifetime of 30 years again (the same as the electrolyzer):

$$PSA \text{ Capital Cost}\left[\frac{\$}{\text{tonne } C_2H_4}\right] = \tag{36a}$$

$$\frac{CRF_{electrolyser} \times PSA \text{ Capital Cost}[\$]}{\text{Capacity Factor} \times 365\left[\frac{\text{days}}{\text{year}}\right] \times \text{production}\left[\frac{\text{tonne } C_2H_4}{\text{day}}\right]}$$

$$PSA \text{ Capital Cost}\left[\frac{\$}{\text{tonne } C_2H_4}\right] = \tag{36b}$$

$$\frac{0.065051 \times \$910\,632.48}{0.9 \times 365\frac{\text{days}}{\text{year}} \times 1\frac{\text{tonne } C_2H_4}{\text{day}}} = 180.33\frac{\$}{\text{tonne } C_2H_4}$$

Carbonate Regeneration (Alkaline Flow Cell Only)

Although it is not required in neutral systems, the regeneration of $CO_2$ and electrolyte for alkaline flow cell electrolyzers (which commonly use high concentration KOH) contributes a lot to the final cost of $C_2H_4$. For the alkaline flow cell with 3 M KOH, it was estimated that 20 $CO_2$ molecules reacted with KOH to form carbonate for every $CO_2$ molecule that was reduced to any product. In order to calculate the cost required to regenerate this much $CO_2$ and KOH, a model obtained from Aspen Plus by Keith et al. reported energy requirements to regenerate $CO_2$ from a calcium caustic loop. This loop has three steps: a pellet reactor which uses 27 kWh ton$^{-1}$ $CO_2$, a calciner which uses 4.05 GJ ton$^{-1}$ of $CO_2$, and a slaker which uses 77 kWh ton$^{-1}$ $CO_2$. Adding all these components together gives us 1229 kWh ton$^{-1}$ $CO_2$. Using this model, the cost of running this system can be calculated by:

$$\text{Reduced } CO_2[\text{tonne}] = \tag{37a}$$

$$\frac{\text{Production of } C_2H_4\left[\frac{\text{tonne}}{\text{day}}\right] \times \text{mole ratio}\left[\frac{CO_2}{C_2H_4}\right] \times \text{molecular weight}_{CO2}}{\text{molecular weight}_{C2H4}\left[\frac{g}{\text{mol}}\right]}$$

$$\text{Reduced } CO_2[\text{tonne}] = \frac{1\frac{\text{tonne}}{\text{day}} \times 2 \times \frac{44\,g}{\text{mol}}}{\frac{28\,g}{\text{mol}}} = 3.1429 \text{ tonne} \tag{37b}$$

$$CO_2 \text{ lost to } KOH[\text{tonne}] = \tag{38a}$$

$$\text{Reduced } CO_2[\text{tonne}] \times \text{carbonate formation}\left[\frac{CO_2 \text{ reacting with } KOH}{CO_2 \text{ reduced}}\right]$$

$CO_2$ lost to KOH [tonne]=3.1429 tonne×20=62.858 tonne (38b)

Now the energy required to regenerate this much $CO_2$ can be determined:

$$\text{Energy required[kWh]} = CO_2 \text{ lost to } KOH[\text{tonne}] \times 1229\frac{\text{kWh}}{\text{tonne } CO_2} \tag{39a}$$

Energy required [kWh]=62.858×1229=77 252 kWh (39b)

The operating cost of the system can be calculated by multiplying by the electricity price:

$$\text{Operating Cost}\left[\frac{\$}{\text{tonne } C_2H_4}\right] = \tag{40a}$$

$$\text{Energy required[kWh]} \times \text{Electricity price}\left[\frac{\$}{\text{kWh}}\right]$$

$$\text{Operating Cost}\left[\frac{\$}{\text{tonne } C_2H_4}\right] = \tag{40b}$$

$$77\,252 \text{ kWh} \times 0.03\frac{\$}{\text{kWh}} = 2317.56\frac{\$}{\text{tonne } C_2H_4}$$

Input $H_2O$ (MEA and Flow Cell)

The cost of input water can be calculated assuming no water can be recovered from the anode output or that recovering it would be more expensive than buying new water. Therefore, for $CO_2RR$, buying 6 moles of water for every mole of $C_2H_4$ produced is determined.

The calculation for the neutral MEA is:

$$H_2O \text{ required}\left[\frac{\text{tonne } H_2O}{\text{tonne } C_2H_4}\right] = C_2H_4 \text{ output}\left[\text{tonne } \frac{C_2H_4}{\text{day}}\right] \times \tag{41a}$$

$$\frac{\text{molecular weight}_{H2O}\left[\frac{g}{\text{mol}}\right]}{\text{molecular weight}_{C2H4}\left[\frac{g}{\text{mol}}\right]} \times \text{molar ratio}\left[\frac{H_2O}{C_2H_4}\right]$$

Plugging in gives:

$$H_2O \text{ required}\left[\frac{\text{tonne } H_2O}{\text{tonne } C_2H_4}\right] = \tag{41b}$$

$$1 \text{ tonne } \frac{C_2H_4}{\text{day}} \times \frac{18\frac{g}{\text{mol}}}{28\frac{g}{\text{mol}}} \times 6 = 3.8571\frac{\text{tonne } H_2O}{\text{tonne } C_2H_4}$$

Finally, multiplying by the cost of water gives the cost per ton of $C_2H_4$. The cost of water was estimated based on 2019 water rates for the city of Toronto, Canada that listed 3.9549 $CAD m$^{-3}$. Based on this, a value of 5 $ ton$^{-1}$ was used as a more conservative estimate for different regions. The final cost of water per ton of $C_2H_4$ in the model is:

$$\text{Cost of input} H_2O \left[\frac{\$}{\text{tonne } C_2H_4}\right] = \quad (42)$$

$$5\frac{\$}{\text{tonne } H_2O} \times 3.8571 \frac{\text{tonne } H_2O}{\text{tonne } C_2H_4} = 19.29 \frac{\$}{\text{tonne } CO}$$

Electrolyte Costs

For the SOEC cell, no electrolyte was considered to be used. However, the calculation for a MEA cell using 0.1 M $KHCO_3$ at a cost of 750 $ ton$^{-1}$ and by using a fixed volume factor of 100 L electrolyte m$^{-2}$ of electrolyzer is shown, approximated from common lab-scale experiments. The cost is calculated by:

$$\text{Surface area of electrolyser}[m^2] = \quad (43a)$$

$$\frac{\text{Total current needed [mA]}}{\text{Current density}\left[\frac{mA}{cm^2}\right] \times \left(\frac{100 \text{ cm}}{1 \text{ m}}\right)^2}$$

Plugging in the base case values gives (note the required current is different from the SOEC case above):

$$\text{Surface area of electrolyser}[m^2] = \quad (43b)$$

$$\frac{797\,660\,000 \text{ mA}}{150\frac{mA}{cm^2} \times \left(\frac{100 \text{ cm}}{1 \text{ m}}\right)^2} = 531.77 \, m^2$$

The volume of electrolyte required can then be determined:

$$\text{Volume of electrolyte}[L] = \text{Surface area}[m^2] \times 100\frac{L}{m^2} = 53\,177 \, L \quad (44)$$

With this volume, the molecular weight of potassium bicarbonate (100 g mol$^{-1}$), and the molarity of the anolyte, the mass of potassium bicarbonate required can be determined:

$$\text{Mass of anolyte salt}[g] = \text{Anolye molarity}\left[\frac{mol}{L}\right] \times \quad (45a)$$

$$\text{Anolyte volume}[L] \times \text{molecular weight}\left[\frac{g}{mol}\right]$$

This gives:

$$\text{Mass of anolyte salt}[g] = 0.1 \, M \times 53\,177 \, L \times 100\frac{g}{mol} = 531.770 \, g \quad (45b)$$

The total cost of anolyte is found by multiplying by the price of potassium bicarbonate and the price of water (5 $ ton$^{-1}$):

$$\text{Cost of anolyte}[\$] = \text{mass of salt}[\text{tonne}] \times \text{price of salt}\left[\frac{\$}{\text{tonne}}\right] + \quad (46a)$$

$$\text{water volume}[L] \times \text{water price}\left[\frac{\$}{kg}\right]$$

This gives:

$$\text{Cost of anolyte}[\$] = \quad (46b)$$

$$0.531770 \text{ tonne} \times 750\frac{\$}{\text{tonne}} + 53\,177 \, L \times 0.005\frac{\$}{kg} = \$664.71$$

Now, to find the cost of anolyte per ton of $C_2H_4$, a new capital recovery factor can be found assuming the electrolyte has a lifetime of 1 year:

$$CRF_{anolyte} = \frac{0.05(1.05)^1}{1.05^1 - 1} = 1.05 \quad (47)$$

Finally, the cost per ton of $C_2H_4$ can be calculated using the same method as in Eq. (8):

$$\text{Cost of anolyte}\left[\frac{\$}{\text{tonne } C_2H_4}\right] = \quad (48a)$$

$$\frac{CRF_{anolyte} \times \text{Cost of anolyte}[\$]}{\text{Capacity factor} \times 365\left[\frac{\text{days}}{\text{year}}\right] \times \text{production}\left[\frac{\text{tonne } C_2H_4}{\text{day}}\right]}$$

Plugging in values gives the final cost per ton of $C_2H_4$:

$$\text{Cost of anolyte}\left[\frac{\$}{\text{tonne } C_2H_4}\right] = \quad (48b)$$

$$\frac{1.05 \times \$664.71}{0.9 \times 365\left[\frac{\text{days}}{\text{year}}\right] \times 1\frac{\text{tonne } C_2H_4}{\text{day}}} = 2.12\frac{\$}{\text{tonne } C_2H_4}$$

Note that for alkaline flow cells, a 3 M KOH anolyte was used with a cost of 1000 $ ton$^{-1}$.

Summary of Inputs for all Systems:

| Parameters | $CO_2$RR MEA | $CO_2$RR flow cell | $CO_2$RR SOEC | CORR MEA |
|---|---|---|---|---|
| Base Case: | | | | |
| Output Product | $C_2H_4$ | $C_2H_4$ | CO | $C_2H_4$ |
| $CO_2$ Cost ($/ton) | 30 | 30 | 30 | N/A |
| CO Cost ($/ton) | N/A | N/A | N/A | 404.77 |
| $H_2O$ Cost ($/ton) | 5 | 5 | N/A | 5 |
| Electricity cost ($/kWh) | 0.03 | 0.03 | 0.03 | 0.03 |
| Electrolyzer cost ($/kW) | 300 | 300 | 250 | 300 |
| Balance of plant (%) | 50 | 50 | 50 | 50 |
| Lang factor | 1 | 1 | 1 | 1 |
| Capacity factor | 0.9 | 0.9 | 0.9 | 0.9 |
| Cell voltage (V) | 3.7 | 2.5 | 1.3 | 2.5 |
| Faradaic efficiency (%) | 60 | 60 | 100 | 60 |
| Current density (mA/cm$^2$) | 150 | 150 | 800 | 150 |
| Single pass conversion (%) | 15 | 2.86 | 40 | 18 |
| $CO_2$ crossover factor | 3 | 20 | 0 | 0 |
| System lifetime (year) | 30 | 30 | 30 | 30 |
| Catalyst/membrane lifetime (year) | 5 | 5 | 5 | 5 |
| Electrolyte lifetime (year) | 1 | 1 | N/A | 1 |
| Electrolyte | $KHCO_3$ | KOH | N/A | $KHCO_3$ |
| Electrolyte Molarity (mol/L) | 0.1 | 3 | N/A | 0.1 |
| Electrolyte salt cost ($/ton) | 750 | 1000 | N/A | 750 |
| Operation Temperature (° C.) | 25 | 25 | 800 | 25 |
| Discount Rate (%) | 5 | 5 | 5 | 5 |

N/A. indicates that the item is not applicable.

| | Ideal Case | | | |
|---|---|---|---|---|
| Parameters | $CO_2RR$ MEA | $CO_2RR$ flow cell | $CO_2RR$ SOEC | CORR MEA |
| Output Product | $C_2H_4$ | $C_2H_4$ | CO | $C_2H_4$ |
| $CO_2$ Cost ($/ton) | 30 | 30 | 30 | N/A |
| CO Cost ($/ton) | N/A | N/A | N/A | 292.25 |
| $H_2O$ Cost ($/ton) | 5 | 5 | N/A | 5 |
| Electricity cost ($/kWh) | 0.03 | 0.03 | 0.03 | 0.03 |
| Electrolyzer cost ($/kW) | 300 | 300 | 250 | 300 |
| Balance of plant (%) | 50 | 50 | 50 | 50 |
| Lang factor | 1 | 1 | 1 | 1 |
| Capacity factor | 0.9 | 0.9 | 0.9 | 0.9 |
| Cell voltage (V) | 3.7 | 2.5 | 1.3 | 2.5 |
| Faradaic efficiency (%) | 95 | 95 | 100 | 95 |
| Current density (mA/cm$^2$) | 200 | 200 | 800 | 200 |
| Single pass conversion (%) | 23.75 | 4.52 | 90 | 28.5 |
| $CO_2$ crossover factor | 3 | 20 | 0 | 0 |
| System lifetime (year) | 30 | 30 | 30 | 30 |
| Catalyst/membrane lifetime (year) | 5 | 5 | 5 | 5 |
| Electrolyte lifetime (year) | 1 | 1 | N/A | 1 |
| Electrolyte | $KHCO_3$ | KOH | N/A | $KHCO_3$ |
| Electrolyte Molarity (mol/L) | 0.1 | 3 | N/A | 0.1 |
| Electrolyte salt cost ($/ton) | 750 | 1000 | N/A | 750 |
| Operation Temperature (°C) | 25 | 25 | 800 | 25 |
| Discount Rate (%) | 5 | 5 | 5 | 5 |

N/A. indicates that the item is not applicable.

It is important to note that MEA and flow cell electrolyzers use a different electrolyzer cost from SOEC. The 300 $ kW$^{-1}$ is based on a 2020 DOE target for water electrolysis hydrogen production and was provided for a 600 mA cm$^{-2}$ cell. Therefore, when using Eq. (6a), the electrolyzer cost is changed to 300 $ kW$^{-1}$ and the base current density is now 600 mA cm$^{-2}$.

Additionally, when calculating the cathode separation costs for the $CO_2RR$ MEA and alkaline flow cells, one must revise the single-pass conversion in Eq. (16a) to account for $CO_2$ that was lost to carbonate. Since the conversion in Eq. (16a) expresses the amount of $CO_2$ that is reduced to the amount of $CO_2$ that passes through the cathode stream unreacted, Eq. (16a) can be rewritten as:

$$\text{Output } CO_2 \text{ flow rate}\left[\frac{m^3}{hour}\right] = \frac{C_2H_4 \text{ flow rate}\left[\frac{m^3}{hour}\right] \times \text{molar ratio}\left[\frac{CO_2}{C_2H_4}\right]}{\left(\frac{singlepass \text{ conversion[decimal]}}{\frac{1}{crossover \text{ factor}+1}}\right)} \times \left(1 - \frac{singlepass \text{ conversion[decimal]}}{\frac{1}{crossover \text{ factor}+1}}\right) \tag{16c}$$

Note that it is now written with $C_2H_4$ as the output as there is assumed to be no around equations, these crossover when producing CO. For the ideal MEA case with a crossover ratio of 3 and a single-pass conversion of 23.75%, this gives:

$$\text{Output } CO_2 \text{ flow rate}\left[\frac{m^3}{hour}\right] = \frac{36.3955 \frac{m^3}{hour} \times 2 \frac{CO_2}{C_2H_4}}{\left(\frac{0.2375}{\frac{1}{3+1}}\right)} \times \left(1 - \frac{0.2375}{\frac{1}{3+1}}\right) = 3.8311 \frac{m^3}{hour} \tag{16d}$$

Energy Calculations

All energy calculations provided use the same models outlined above, but simply stop before multiplying by the electricity price. For example, for the energy cost of carbonate regeneration, Eq. (39) is used to obtain the energy required to run the calcium cycle. Similarly, for electrolyzer energy requirements, Eq. (6a) divided by the electricity price gives the energy needed to run the system. For separation and SOEC heating, the same approach is used.

REFERENCES

The following references are incorporated herein by reference:

Ge, Q., Hu, Y., Li, B., Wang, B. Synthesis of conjugated polycyclic quinoliniums by rhodium(III)-catalyzed multiple C—H activation and annulation of arylpyridiniums with alkynes. Org. Lett. 18, 2483-2486 (2016).

Wuttig, A., Yaguchi, M., Motobayashi, K., Osawa, M., Surendranath, Y. Inhibited proton transfer enhances Au-catalyzed CO2-to-fuels selectivity. Proc. Natl. Acad. Sci. 113, 32, E4585-E4593 (2016).

Bard, A. J., Faulkner, L. R. Electrochemical methods: Fundamentals and Applications, 2nd Edition. J. Wiley and Sons, New York (2000).

Durst, J., Siebel, A., Simon, C., Hasche, F., Herranz, J., Gasteiger, H. A. New insights into the electrochemical hydrogen oxidation and evolution reaction mechanism. Energy Environ. Sci. 7, 2255-2260 (2014).

Luckow, P., Stanton, E. A., Fields, S., Biewald, B., Jackson, S., Fisher, J., Wilson, R. 2015 Carbon dioxide price forecast. Synaps Energy Economics (2015).

Battelle Memorial Institute. Manufacturing cost analysis of 1, 5, 10 and 25 kW fuel cell systems for primary power and combined heat and power applications. DOE Contract No. DE-EE0005250 (2017).

International Renewable Energy Agency, Renewable Power: Climate-Safe Energy Competes on Cost Alone (2018).

Paturska, A., Repele, M., Bazbauers, G. Economic assessment of biomethane supply system based on natural gas infrastructure. Energy Proc. 72, 71-78 (2015).

Keith, D. W., Holmes, G., Angelo, D. St., Heidel, K. A process for capturing CO2 from the atmosphere. Joule 2, 1573-1594 (2018).

City of Toronto, 2019 Water Rates & Fees (2019). U. S. Department of Energy. DOE Technical Targets for Hydrogen Production from Electrolysis (2015).

Global Data. Global ethylene industry outlook to 2023— capacity and capital expenditure forecasts with details of all active and planned plants. (2019).

Ren, T., Patel, M. K., Blok, Kornelis. Steam cracking and methane to olefins: Energy use, CO2 emissions, and production costs. Energy 33, 817-833 (2008).

Hepburn, C. et al. The technological and economic prospects for $CO_2$ utilization and removal. Nature 575, 87-97 (2019).

Luna, P. D. et al. What would it take for renewably powered electrosynthesis to displace petrochemical process? *Science* 364, eaav3506 (2019).

Dinh C. T. et al. CO$_2$ electroreduction to ethylene via hydroxide-mediated copper catalysis at an abrupt interface. *Science* 360, 783-787 (2018).

Li, F. et al. Molecular tuning of CO$_2$-to-ethylene conversion. *Nature* 577, 509-513 (2020).

Wang, Y. et al. Copper nanocubes for CO$_2$ reduction in gas diffusion electrodes. *Nano Lett.* 19, 8461-8468 (2019).

Ripatti, D. S., Veltman, T. R., Kanan M. W. Carbon monoxide gas diffusion electrolysis that produces concentrated C$_2$ products with high single-pass conversion. *Joule* 3, 240-256 (2019).

Jouny, M., Hutchings, G. S., Jiao, F. Carbon monoxide electroreduction as an emerging platform for carbon utilization. *Nat. Catal.* 2, 1062-1070 (2019).

Liu, Z., Yang, H., Kutz, R., Masel, R. I. CO2 electrolysis to CO and O$_2$ at high selectivity, stability and efficiency using sustainion membranes. *Electrochem. Soc.* 165, J3371-J3377 (2018).

Gabardo C. M. et al. Continuous carbon dioxide electroreduction to concentrated multi-carbon products using a membrane electrode assembly. *Joule* 3, 2777-2791 (2019).

Wang, L. et al. Selective reduction of CO to acetaldehyde with CuAg electrocatalysts. *Chem. Eng. World* 52, 44-46 (2017).

Skafte, T. L., Blennow, P., Hjelm, J., Graves, C. Carbon deposition and sulfur poisoning during CO$_2$ electrolysis in nickel-based solid oxide cell electrodes. *J. Power. Sources* 373, 54-60 (2018).

Navasa, M., Frandsen, H. L., Skafte, T. L., Sunden, B., Graves, C. Localized carbon deposition in solid oxide electrolysis cells studied by multiphysics modeling. *J. Power. Sources* 394, 102-113 (2018).

Wang, Y. et al. Catalyst synthesis under CO$_2$ electroreduction favours faceting and promotes renewable fuels electrosynthesis. *Nat. Catal.* 3, 98-106 (2020).

Wakerley, D. et. al. Bio-inspired hydrophobicity promotes CO2 reduction on a Cu surface. *Nat. Mater.* 18, 1222-1227 (2019).

Schalenbach, M. et. al. *Gas permeation through Nafion. Part 1: Measurements. J. Phys. Chem.* C 119, 25145-25155 (2015).

Subbaraman, R., Strmcnik, D., Stamenkovic, V., Markovic, N. M. Three Phase Interfaces at Electrified Metal-Solid Electrolyte Systems 1. Study of the Pt(hkl)-Nafion Interface. *J. Phys. Chem. C* 114, 8414-8422 (2010).

Arquer, F. P. G.d., et. al. CO2 electrolysis to multicarbon products at activities greater than 1 A cm$^{-2}$. *Science* 367, 661-666 (2020).

Jones, D. Perfluorosulfonic acid membranes for fuel cell and electrolyser applications. Mater. Matters 10, 42 (2015).

Han, Z., Kortlever, R., Chen, H-Y., Peters, J. C., Agapie, T. CO2 Reduction Selective for C$_{\geq 2}$ Products on Polycrystalline Copper with N-Substituted Pyridinium Additives. *ACS Cent. Sci.* 3, 853-859 (2017).

Gunathunge, C. M. et. al. Spectroscopic observation of reversible surface reconstruction of copper electrodes under CO$_2$ reduction. *J. Phys. Chem. C* 121, 12337-12344 (2017).

Heyes, J., Dunwell, M., Xu, B. CO2 reduction on Cu at low overpotentials with surface-enhanced in situ spectroscopy. *J. Phys. Chem. C* 120, 17334-17341 (2016).

Akemann, W., Otto, A. Vibrational modes of CO adsorbed on disordered copper films. *J. Raman Spectrosc.* 22, 797-803 (1991).

Pérez-Gallent, E., Marcandalli, G., Figueiredo, M. C., Calle-Vallejo, F., Koper, M. T. M. *J. Am. Chem. Soc.* 139, 16412-16419 (2017).

Pérez-Gallent, E., Figueiredo, M. C., Calle-Vallejo, F., Koper, M. T. M. Spectoscopic observation of a hydrogenated CO dimer intermediate during CO reduction on Cu(100) electrodes. *Angew. Chem. Int. Ed.* 129, 3675-3678 (2017).

Cheng, T., Xiao, H., Goddard III, W. A. Full atomistic reaction mechanism with kinetics for CO reduction on Cu(100) from ab initio molecular dynamics free-energy calculations at 298 K. *Proc. Natl. Acad. Sci.* 114, 1795-1800 (2017).

Gunathunge, C. M., Ovalle, V. J., Li, Y., Janik, M. J., Waegele, M. M. Existence of an electrochemically inert CO population on Cu electrodes in alkaline pH. *ACS Catal.* 8, 7507-7516 (2018).

Oda, I., Ogasawara, H., Ito, M. Carbon monoxide adsorption on copper and silver electrodes during carbon dioxide electroreduction studied by infrared reflection absorption spectroscopy and surface-enhanced raman spectroscopy. *Langmuir* 12, 1094-1097 (1996).

Wutting, A. et. al. Tracking a common surface-bound intermediate during CO2-to-fuels catalysis. *ACS Cent. Sci.* 2, 522-528 (2016).

Vidakovic, T., Christov, M., Sundmacher, K. The use of CO stripping for in situ fuel cell catalyst characterization. *Electrochimi. Acta* 52, 5606-5613 (2007).

López-Cuero, A., Cuesta, A., Gutierrez, C. Potential dependence of the saturation CO coverage of Pt electrodes: The origin of the pre-peak in CO-stripping voltammograms. Part 1: Pt(111). *J. Electroanal. Chem.* 579, 1-12 (2005).

López-Cuero, A., Cuesta, A., Gutierrez, C. Potential dependence of the saturation CO coverage of Pt electrodes: The origin of the pre-peak in CO-stripping voltammograms. Part 2: Pt(100). *J. Electroanal. Chem.* 586, 204-216 (2006).

Liu, X. et. al. pH effects on the electrochemical reduction of CO$_{(2)}$ towards C$_2$ products on stepped copper. *Nat. Commun.* 10, 32 (2019).

Jouny, M., Luc, W., Jiao, F. High-rate electroreduction of carbon monoxide to multi-carbon products. *Nat. Catal.* 1, 748-755 (2018).

Aeshala, L. M., Uppaluri, R. G., Verma, A. Effect of cationic and anionic solid polymer electrolyte on direct electrochemical reduction of gaseous CO$_2$ to fuel. *J. CO$_2$ Util.* 3, 49-55 (2013).

Merino-Garcia, I., Albo, J., Solla-Gullon, J., Montiel, V., Irabien, A. Cu oxide/ZnO-based surfaces for a selective ethylene production from gas-phase CO$_2$ electroconversion. *J. CO$_2$ Utili.* 31, 135-142 (2019).

Merino-Garcia, I., Albo, J. Irabien, A. Productivity and selectivity of gas-phase CO2 electroreduction to methane at copper nanoparticle-based electrodes. *Energy Technol.* 5, 922-9238 (2017).

Verma, S., Lu, S., Kenis, P. J. A. Co-electrolysis of CO2 and glycerol as a pathway to carbon chemicals with improved technoeconomics due to low electricity consumption. *Nat. Energy* 4, 466-474 (2019).

The invention claimed is:

1. A membrane electrode assembly (MEA) for electrochemically converting carbon monoxide (CO) into ethylene ($C_2H_4$) under applied current density, the MEA comprising:
   a cathode;
   an anode;
   an anion-exchange membrane (AEM) to separate the cathode from the anode;
   an anolyte;
   a reactant inlet in fluid communication with the cathode to provide a CO-enriched gas component; and
   a product outlet in fluid communication with the cathode to release a product mixture comprising $C_2H_4$;
   wherein the cathode comprises a layered structured catalyst for conversion of carbon monoxide (CO) into ethylene ($C_2H_4$), said catalyst comprising
   a substrate;
   an inner transition metal layer deposited onto the substrate;
   an intermediate organic layer deposited onto the inner transition metal layer; and
   an outer ionomer layer deposited onto the intermediate organic layer:
   and wherein the transition metal is copper or a copper alloy and the outer ionomer layer comprises an ionomer having a hydrophobic backbone and a hydrophilic side chain wherein the ionomer is a short-side-chain (SSC) ionomer.

2. The MEA according to claim 1, characterized in that the substrate comprises polytetrafluoroethylene (PTFE) or PTFE-modified hydrophobic carbon paper.

3. The MEA according to claim 1, characterized in that the copper alloy is selected from copper-silica alloy, copper-aluminium alloy, copper-silver alloy.

4. The MEA according to claim 1, characterized in that the inner transition metal layer has a porosity between 60% and 70% and/or in that the inner transition metal layer, the intermediate organic layer and the outer ionomer layer define a multiple-layer structure having a porosity ranging between 60% and 70%.

5. The MEA according to claim 1, characterized in that the intermediate organic layer is a N-arylpyridinium-derived layer.

6. The MEA according to claim 1, characterized in that the outer ionomer layer comprises a perfluorosulfonic acid ionomer.

7. The MEA according to claim 1, characterized in that the cathode catalyst is in contact with the anion-exchange membrane; and/or in that the MEA is a zero-gap electrolyser wherein the cathode catalyst and the anode catalysts are both in contact with the anion-exchange membrane.

8. An integrated cascade system for conversion of carbon dioxide ($CO_2$) into ethylene ($C_2H_4$), the integrated cascade system comprising a Solid Oxide Electrolysis cell (SOEC) for converting $CO_2$ into carbon monoxide (CO); and the membrane electrode assembly (MEA) as defined in claim 1, the MEA receiving the CO produced via the SOEC as at least part of the CO-enriched gas component.

9. The integrated cascade system according to claim 8, characterized in that the SOEC comprises:
   a fuel cathode being a metal-based catalyst;
   an oxygen-producing anode;
   a solid oxide electrolyte positioned between the cathode and anode;
   a gas inlet in fluid communication with the fuel cathode to receive a gaseous $CO_2$ stream;
   a cathodic gas outlet in fluid communication with the fuel cathode to release a gaseous product component comprising CO; and
   an anodic gas outlet in fluid communication with the oxygen-producing anode to release produced $O_2$.

10. The integrated cascade system according to claim 8, characterized in that the gaseous product component further comprises $CO_2$, and in that the system further comprises a $CO_2$ removal unit operatively connected to the first gas outlet of the SOEC to remove substantially all $CO_2$ from the gaseous product component before being fed as the at least part of the CO-enriched gas component to the MEA.

11. The integrated cascade system according to claim 10, characterized in that the $CO_2$ removal unit is a $CO_2$-stripping unit, wherein the $CO_2$-stripping unit comprises a gas inlet for receiving the gaseous product component, a liquid inlet for receiving a $CO_2$-absorption solution, a gas outlet to release a $CO_2$-depleted product and a liquid outlet to release a $CO_2$-enriched absorption solution, and $CO_2$-depleted product being fed to the MEA as the at least part of the humidified CO-enriched gas component.

12. A method to produce a layered structured catalyst, for use as a gas diffusion electrode (GDE) in a membrane electrode assembly (MEA) for electrochemical conversion of carbon monoxide (CO) into ethylene ($C_2H_4$), the method is characterized in that it comprises:
   depositing an inner transition metal layer onto a substrate, wherein the transition metal is copper or a copper alloy;
   depositing an intermediate organic layer onto the inner transition metal layer; and
   depositing an outer ionomer layer onto the intermediate organic layer, the outer ionomer layer comprising an ionomer having a hydrophobic backbone and a hydrophilic side chain wherein the ionomer is a short-side-chain (SSC) ionomer
   thereby producing the layered structured catalyst, said catalyst comprising
   a substrate;
   an inner transition metal layer deposited onto the substrate;
   an intermediate organic layer deposited onto the inner transition metal layer; and
   an outer ionomer layer deposited onto the intermediate organic layer;
   wherein the transition metal is copper or a copper alloy and the outer ionomer layer comprises an ionomer having a hydrophobic backbone and a hydrophilic side chain wherein the ionomer is a short-side-chain (SSC) ionomer.

13. The method according to claim 12, characterized in that depositing the inner transition metal layer onto the substrate comprises:
   magnetically sputtering a transition metal onto the substrate to produce a sputtered metal coating; and
   electrodepositing the transition metal onto the sputtered metal coating to form the inner transition metal layer comprising the sputtered metal coating.

14. The method according to claim 13, characterized in that electrodepositing the transition metal is performed in a flow electrolyzer comprising:
   an anode flow compartment;
   a cathode flow compartment;
   an anion exchange membrane (AEM) separating the anode flow compartment and the cathode flow compartment;
   a gas inlet in fluid communication with the cathode flow compartment for providing $CO_2$ at a constant flow rate;

a first liquid inlet in fluid communication with the cathode flow compartment for providing a catholyte solution comprising the transition metal; and a second liquid inlet in fluid communication with the anode flow compartment for providing an anolyte; and a counter electrode.

15. The method according to claim 13, characterized in that electrodepositing the transition metal comprises preparing a cathode through electroreduction of copper bromide in presence of potassium hydroxide and $CO_2$: with preference, the catholyte solution comprises 0.1 to 0.5 M of copper bromide, 0.2 to 1.0 M sodium tartrate dibasic dehydrate and 1.0 to 3.0 M of potassium hydroxide.

16. The method according to claim 12, characterized in that depositing the intermediate organic layer onto the inner transition metal layer comprises electrodepositing the intermediate organic layer being an N-arylpyridinium-derived film.

17. The method according to claim 16, characterized in that it further comprises preparing another electrolyte solution comprising potassium carbonate and a N-tolyl-pyridinium triflate precursor for electrodeposition of the intermediate organic layer; with preference, the electrolyte solution comprises 0.1 to 1 M of $KHCO_3$ and 10 to 50 mM of the N-tolyl-pyridinium triflate precursor.

18. The method according to claim 12, characterized in that depositing an outer ionomer layer onto the intermediate organic layer comprises spraying an ionomer-containing solution to form the outer ionomer layer.

19. The method according to claim 18, characterized in that it further comprises preparing the ionomer-containing solution comprising a cation exchange perfluorosulfonic acid (PFSA) ionomer with short-side-chain (SSC) and methanol: with preference, for 1 to 800 cm$^2$ geometric area of electrode, the ionomer-containing solution comprises 10 to 20,000 µL of the cation exchange perfluorosulfonic acid (PFSA) ionomer with short-side-chain (SSC) and 3 to 3000 mL of methanol.

20. A process for electrochemically converting carbon dioxide ($CO_2$) into ethylene ($C_2H_4$), the process is characterized in that it comprises:

converting $CO_2$ into carbon monoxide (CO) in a Solid Oxide Electrolysis cell (SOEC) to produce a gaseous product component comprising CO;

removing $CO_2$ from the gaseous product component to produce a CO-enriched gas component; and converting CO from the CO-enriched gas component into $C_2H_4$ in the MEA according to claim 1, the MEA being supplied with the CO-enriched gas component to produce the product mixture comprising $C_2H_4$.

* * * * *